US009606275B2

United States Patent
Nagaya et al.

(10) Patent No.: US 9,606,275 B2
(45) Date of Patent: Mar. 28, 2017

(54) OPTICAL FILTER, SOLID-STATE IMAGE PICKUP DEVICE AND CAMERA MODULE

(71) Applicant: JSR CORPORATION, Tokyo (JP)

(72) Inventors: Katsuya Nagaya, Tokyo (JP); Yukie Tanaka, Tokyo (JP); Toshihiro Otsuki, Tokyo (JP); Takashi Tsubouchi, Tokyo (JP); Daisuke Shigeoka, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/050,093

(22) Filed: Feb. 22, 2016

(65) Prior Publication Data

US 2016/0170105 A1 Jun. 16, 2016

Related U.S. Application Data

(63) Continuation of application No. PCT/JP2014/077523, filed on Oct. 16, 2014.

(30) Foreign Application Priority Data

Oct. 17, 2013 (JP) ................................ 2013-216164

(51) Int. Cl.
G02B 5/28 (2006.01)
G02B 5/22 (2006.01)
(Continued)

(52) U.S. Cl.
CPC ............... *G02B 5/22* (2013.01); *G02B 5/208* (2013.01); *G02B 5/26* (2013.01); *G02B 5/28* (2013.01);
(Continued)

(58) Field of Classification Search
CPC ......... G02B 5/22–5/289; G02B 13/008; G02B 13/14–13/146
See application file for complete search history.

(56) References Cited

U.S. PATENT DOCUMENTS 4,857,431 A 8/1989 Kato et al.
5,296,519 A 3/1994 Otsuka
(Continued)

FOREIGN PATENT DOCUMENTS

JP S60-228448 A 11/1985
JP S63-124054 A 5/1988
(Continued)

OTHER PUBLICATIONS

Office Action issued May 9, 2016, in Taiwan Patent Application No. 103135912 (w/ English translation).
(Continued)

*Primary Examiner* — Bumsuk Won
*Assistant Examiner* — Jeffrey Madonna
(74) *Attorney, Agent, or Firm* — Oblon, McClelland, Maier & Neustadt, L.L.P.

(57) ABSTRACT

An optical filter comprises a base material (i) which comprises a transparent resin layer comprising a compound (Z) having an absorption maximum in the wavelength region of from 600 to 850 nm; and a dielectric multilayer film provided on at least one surface of the base material (i). The optical filter selectively transmits visible rays and a part of near-infrared rays, and the optical filter satisfies specific requirements.

16 Claims, 8 Drawing Sheets

(51) Int. Cl.
*G02B 5/26* (2006.01)
*H01L 27/146* (2006.01)
*G02B 5/20* (2006.01)
*H04N 5/225* (2006.01)

(52) U.S. Cl.
CPC ..... *H01L 27/14625* (2013.01); *H04N 5/2254* (2013.01)

(56) References Cited

U.S. PATENT DOCUMENTS

| | | | |
|---|---|---|---|
| 5,360,659 A * | 11/1994 | Arends | B32B 17/10018 359/359 |
| 5,398,133 A * | 3/1995 | Tsai | G02B 5/281 359/359 |
| 5,401,438 A | 3/1995 | Otsuka | |
| 5,405,976 A | 4/1995 | Telfer et al. | |
| 5,493,442 A * | 2/1996 | Buchholz | G02B 5/208 359/359 |
| 5,523,027 A | 6/1996 | Otsuka | |
| 5,627,014 A | 5/1997 | Chu et al. | |
| 5,977,351 A | 11/1999 | Chu et al. | |
| 6,020,490 A | 2/2000 | Reinehr et al. | |
| 6,207,260 B1 * | 3/2001 | Wheatley | G02B 5/282 428/212 |
| 2003/0035972 A1 * | 2/2003 | Hanson | B32B 7/02 428/480 |
| 2004/0137367 A1 | 7/2004 | Kitayama et al. | |
| 2004/0179283 A1 * | 9/2004 | Jones | G02B 5/208 359/885 |
| 2005/0041292 A1 * | 2/2005 | Wheatley | G01J 1/42 359/584 |
| 2005/0180010 A1 | 8/2005 | Mukaiyama et al. | |
| 2008/0132667 A1 | 6/2008 | Makinoshima et al. | |
| 2008/0165421 A1 | 7/2008 | Matsumoto et al. | |
| 2008/0186565 A1 * | 8/2008 | Krieg-Kowald | A61F 9/022 359/356 |
| 2009/0323180 A1 * | 12/2009 | Weber | B32B 7/02 359/359 |
| 2014/0091419 A1 | 4/2014 | Hasegawa et al. | |
| 2014/0350146 A1 | 11/2014 | Tsubouchi | |
| 2015/0085354 A1 * | 3/2015 | Tatemura | G02B 5/208 359/359 |

FOREIGN PATENT DOCUMENTS

| | | |
|---|---|---|
| JP | H01-146846 A | 6/1989 |
| JP | H01-228960 A | 9/1989 |
| JP | H06-200113 A | 7/1994 |
| JP | 2846091 B2 | 10/1998 |
| JP | 2864475 B2 | 12/1998 |
| JP | 3094037 B2 | 7/2000 |
| JP | 2001-040234 A | 2/2001 |
| JP | 3196383 B2 | 6/2001 |
| JP | 3366697 B2 | 11/2002 |
| JP | 3699464 B2 | 7/2005 |
| JP | 3703869 B2 | 7/2005 |
| JP | 2006-199945 A | 8/2006 |
| JP | 2007-169315 A | 7/2007 |
| JP | 4081149 B2 | 2/2008 |
| JP | 2008-163107 A | 7/2008 |
| JP | 2008-163194 A | 7/2008 |
| JP | 2008-181121 A | 8/2008 |
| JP | 2009-108267 A | 5/2009 |
| JP | 2010-241873 A | 10/2010 |
| JP | 2010-285505 A | 12/2010 |
| JP | 4740631 B2 | 5/2011 |
| JP | 2011-197450 A | 10/2011 |
| JP | 2012-019113 A | 1/2012 |
| JP | 5036229 B2 | 7/2012 |
| JP | 2012-185468 A | 9/2012 |
| TW | 200602692 A | 1/2006 |
| TW | 201211125 A | 3/2012 |
| TW | 201319632 A | 5/2013 |
| TW | 201329530 A | 7/2013 |
| TW | 201339659 A | 10/2013 |
| WO | WO 2012/169447 A1 | 12/2012 |

OTHER PUBLICATIONS

Office Action issued Mar. 22, 2016, in Korean Patent Application No. 10-2016-7003593 filed Feb. 12, 2016 (w/ English translation).
Office Action issued Jul. 28, 2016, in Chinese Patent Application No. 201480043450.7 filed Oct. 16, 2014 (w/ English translation).
H. Shirai, et al., "Phthalocyanine: Its Chemistry and Functions", Industrial Publishing & Consulting, Inc., 1997, (w/ English translation of related portion).
International Search Report issued Jan. 6, 2015, in PCT/JP2014/077523 filed Oct. 16, 2014.

* cited by examiner

OPTICAL FILTER, SOLID-STATE IMAGE PICKUP DEVICE AND CAMERA MODULE

CROSS-REFERENCE TO RELATED APPLICATIONS

The present application is a continuation application of International Application No. PCT/JP2014/077523, filed Oct. 16, 2014, which claims priority to Japanese Patent Application No. 2013-216164, filed Oct. 17, 2013. The contents of these applications are incorporated herein by reference in their entirety.

BACKGROUND OF THE INVENTION

Field of the Invention

The present invention relates to an optical filter and a device using an optical filter.

Discussion of the Background

In solid-state image pickup devices, such as video cameras, digital still cameras, cellular phones having camera function and smart phones, a CCD or CMOS image sensor that is a solid-state image sensor of color image is used. In such a solid-state image sensor, silicon photo diode having sensitivity to near-infrared rays that cannot be perceived by human eye is used in its light-receiving section. For such a solid-state image sensor, it is necessary to make correction of visibility so that a natural color might be obtained when an image is seen with human eye, and an optical filter (e.g., near-infrared cut filter) to selectively transmit or cut rays of specific wavelength region is frequently used.

As such near-infrared cut filters, those produced by various processes have been used in the past. For example, in JP-A-H6-200113, a near-infrared cut filter using a substrate formed of a transparent resin and containing a near-infrared absorbing agent in the transparent resin is described, and in Japanese Patent No. 5036229, a near-infrared cut filter using a glass substrate containing a copper ion is described.

On the other hand, an attempt to impart a sensing function utilizing near-infrared rays, such as motion capture or distance recognition (space recognition), to a camera module has been made in recent years. In such a use, it becomes necessary to selectively transmit visible rays and a part of near-infrared rays, and therefore, near-infrared cut filters that indiscriminately shield near-infrared rays, such as conventional ones, cannot be used.

As optical filters that selectively transmit visible rays and a part of near-infrared rays, filters having a dielectric multilayer film formed on a glass substrate have been sold by Toa Optical Technologies, Ltd., Ceratec Japan Co., Ltd., etc.

With regard to optical filters that are on the market as the aforesaid optical filters selectively transmitting visible rays and a part of near-infrared rays, their spectral properties greatly vary when rays are obliquely incident on the filters. Especially in the case where the dependence of an optical filter on the incident angle is large on the long wavelength side of a visible light passband and on the short wavelength side of a near-infrared ray selective passband, a signal noise ratio (S/N ratio) of near-infrared rays used for the sensing function is deteriorated when the rays are obliquely incident on the filter, and besides, there is a problem that evil influence is exerted on camera image quality or color reproducibility at the image end part.

SUMMARY OF THE INVENTION

According to one aspect of the present invention, an optical filter comprises a base material (i) which comprises a transparent resin layer comprising a compound (Z) having an absorption maximum in the wavelength region of from 600 to 850 nm; and a dielectric multilayer film provided on at least one surface of the base material (i). The optical filter selectively transmits visible rays and a part of near-infrared rays, and the optical filter satisfies the requirements (a) and (b).

(a) In the wavelength region of from 430 to 580 nm, a mean value of transmittances measured in the perpendicular direction to the optical filter is not less than 75%.

(b) The optical filter has a light stopband Za, a light passband Zb and a light stopband Zc in the wavelength region of not less than 650 nm, the center wavelength of the light stopband Za is shorter the center wavelength of the light passband Zb, the center wavelength of the light passband Zb is shorter the center wavelength of the light stopband Zc, the minimum transmittance measured in the perpendicular direction to the optical filter in each of the light stopband Za and the light stopband Zc is not more than 15%, and the maximum transmittance measured in the perpendicular direction to the optical filter in the light passband Zb is not less than 55%.

According to another aspect of the present invention, a solid-state image pickup device comprises the optical filter.

According to further aspect of the present invention, a camera module comprises the optical filter.

DESCRIPTION OF THE EMBODIMENTS

Figure 1B:
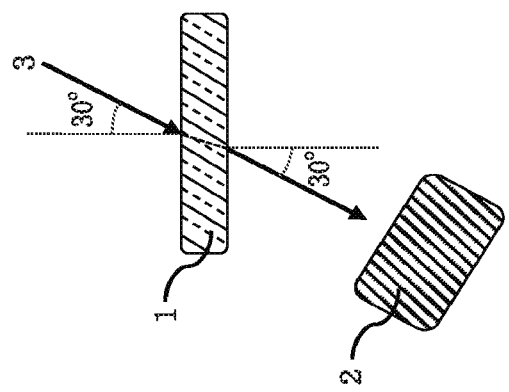
FIG. 1B is a schematic view showing a method for measuring a transmittance in the case where the transmittance is measured at an angle of 30° to the perpendicular direction to an optical filter.

The embodiments of the present invention relates to an optical filter (two-wavelength bandpass filter) which contains a compound having specific absorption and selectively transmits visible rays and a part of near-infrared rays, and a solid-state image pickup device and a camera module each of which uses the optical filter. Embodiments of the present invention are given below.

[1] An optical filter selectively transmitting visible rays and a part of near-infrared rays, said optical filter satisfying the following requirements (a) and (b) and having a base material (i) and a dielectric multilayer film on at least one surface of the base material (i), said base material (i) having a transparent resin layer containing a compound (Z) having an absorption maximum in the wavelength region of 600 to 850 nm, (a) in the wavelength region of 430 to 580 nm, a mean value of transmittances measured in the perpendicular direction to the optical filter is not less than 75%, (b) the optical filter has a light stopband Za, a light passband Zb and a light stopband Zc in the wavelength region of not less than 650 nm, the center wavelengths of these bands satisfy Za<Zb<Zc, the minimum transmittance measured in the perpendicular direction to the optical filter in each of the Za and the Zc is not more than 15%, and the maximum transmittance measured in the perpendicular direction to the optical filter in the Zb is not less than 55%.

[2] The optical filter as stated in [1], further satisfying the following requirement (c):

(c) a difference Xb−Xa between a value (Xa) of a wavelength on the shortest wavelength side and a value (Xb) of a wavelength on the longest wavelength side in the Zb, at each of which the transmittance measured in the perpendicular direction to the optical filter becomes 50%, is 5 to 150 nm, and a value of Y represented by Y=(Xa+Xb)/2 is 750 to 950 nm.

[3] The optical filter as stated in [2], wherein the mean transmittance measured in the perpendicular direction to the optical filter in the wavelength region of Y−10 nm to Y+10 nm is not less than 60%.

[4] The optical filter as stated in any one of [1] to [3], wherein a shortest wavelength (Xc) at which the transmittance measured in the perpendicular direction to the base material (i) becomes not more than 50% from more than 50% in the wavelength region of not less than 600 nm is 610 to 670 nm.

[5] The optical filter as stated in any one of [1] to [4], wherein a shortest wavelength (Xf) at which the transmittance measured in the perpendicular direction to the base material (i) becomes not less than 50% from less than 50% in the wavelength region of not less than 750 nm is 770 to 900 nm.

[6] The optical filter as stated in any one of [2] to [5], wherein dielectric multilayer films different in spectral properties are formed on both surfaces of the base material (i), and the mean reflectance measured from at least one surface of the optical filter in the wavelength region of Y−10 nm to Y+10 nm is not more than 20%.

[7] The optical filter as stated in any one of [1] to [6], wherein the compound (Z) is at least one compound selected from the group consisting of a squarylium compound, a phthalocyanine compound, a naphthalocyanine compound, a croconium compound, a hexaphyrin compound and a cyanine compound.

[8] The optical filter as stated in any one of [1] to [7], wherein the compound (Z) is at least one compound selected from the group consisting of a compound (A) having an absorption maximum in a wavelength region of 600 to 750 nm and a compound (S) having an absorption maximum in a wavelength region of 750 to 850 nm.

The optical filter as stated in [8], wherein the compound (A) is a compound represented by the following formula (I) or (II):

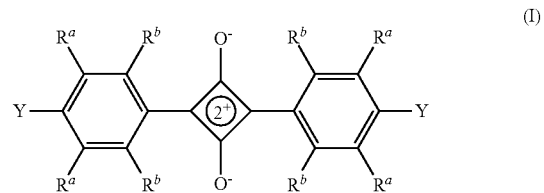

wherein $R^a$, $R^b$ and Y satisfy the following condition (i) or (ii):

condition (i):

plural $R^a$ are each independently a hydrogen atom, a halogen atom, a sulfo group, a hydroxyl group, a cyano group, a nitro group, a carboxyl group, a phosphoric acid group, $-L^1$ or a $-NR^eR^f$ group ($R^e$ and $R^f$ are each independently a hydrogen atom, $-L^a$, $-L^b$, $-L^c$, $-L^d$ or $-L^e$), plural $R^b$ are each independently a hydrogen atom, a halogen atom, a sulfo group, a hydroxyl group, a cyano group, a nitro group, a carboxyl group, a phosphoric acid group, $-L^1$ or a $-NR^gR^h$ group ($R^g$ and $R^h$ are each independently a hydrogen atom, $-L^a$, $-L^b$, $-L^c$, $-L^d$, $-L^e$ or a $-C(O)R^i$ group ($R^i$ represents $-L^a$, $-L^b$, $-L^c$, $-L^d$ or $-L^e$)), plural Y are each independently a $-NR^jR^k$ group ($R^j$ and $R^k$ are each independently a hydrogen atom, $-L^a$, $-L^b$, $-L^c$, $-L^d$ or $-L^e$), $L^1$ is $L^a$, $L^b$, $L^c$, $L^d$, $L^e$, $L^f$, $L^g$ or $L^h$, and the above $L^a$ to $L^h$ represent the following groups:

($L^a$) an aliphatic hydrocarbon group of 1 to 12 carbon atoms, which may have a substituent L, ($L^b$) a halogen-substituted alkyl group of 1 to 12 carbon atoms, which may have a substituent L, ($L^c$) an alicyclic hydrocarbon group of 3 to 14 carbon atoms, which may have a substituent L, ($L^d$) an aromatic hydrocarbon group of 6 to 14 carbon atoms, which may have a substituent L, ($L^e$) a heterocyclic group of 3 to 14 carbon atoms, which may have a substituent L, ($L^f$) an alkoxy group of 1 to 9 carbon atoms, which may have a substituent L, ($L^g$) an acyl group of 1 to 9 carbon atoms, which may have a substituent L, ($L^h$) an alkoxycarbonyl group of 1 to 9 carbon atoms, which may have a substituent L, with the proviso that the substituent L is at least one kind selected from the group consisting of an aliphatic hydrocarbon group of 1 to 12 carbon atoms, a halogen-substituted alkyl group of 1 to 12 carbon atoms, an alicyclic hydrocarbon group of 3 to 14 carbon atoms, an aromatic hydrocarbon group of 6 to 14 carbon atoms, a heterocyclic group of 3 to 14 carbon atoms, a halogen atom, a sulfo group, a hydroxyl group, a cyano group, a nitro group, a carboxyl group, a phosphoric acid group and an amino group;

condition (ii):

at least one of two $R^a$ on one benzene ring and Y on the same benzene ring are bonded to each other to form a heterocyclic ring of 5 or 6 constituent atoms containing at least one nitrogen atom, the heterocyclic ring may have a substituent, and $R^b$ and $R^a$ which does not take part in the formation of the heterocyclic ring have the same meanings as those of $R^b$ and $R^a$ in the condition (i), respectively;

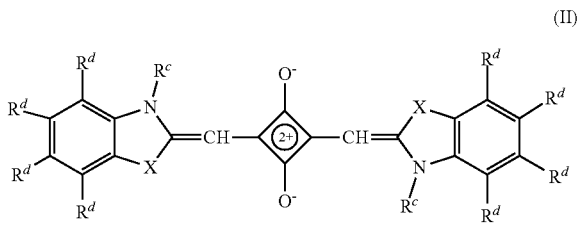

(II)

wherein each X is O, S, Se, N—$R^c$ or $C(R^dR^d)$, plural $R^c$ are each independently a hydrogen atom, $L^a$, $L^b$, $L^c$, $L^d$ or $L^e$, plural $R^d$ are each independently a hydrogen atom, a halogen atom, a sulfo group, a hydroxyl group, a cyano group, a nitro group, a carboxyl group, a phosphoric acid group, $-L^1$ or a —$NR^eR^f$ group, and neighboring $R^d$ and $R^d$ may be bonded to each other to form a ring which may have a substituent, and $L^a$ to $L^e$, $L^1$, $R^e$ and $R^f$ have the same meanings as those of $L^a$ to $L^e$, $L^1$, $R^e$ and $R^f$ defined in the formula (I).

[10] The optical filter as stated in [8], wherein the compound (S) is a compound represented by the following formula (S1):

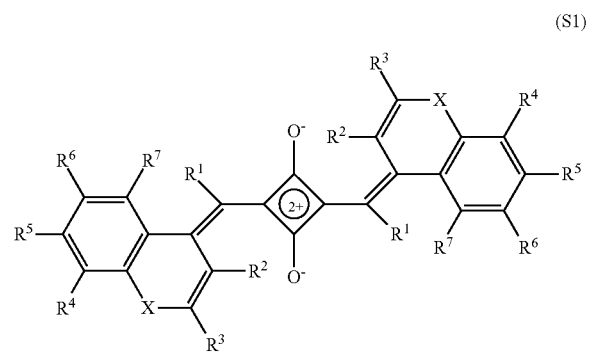

(S1)

wherein each X is an oxygen atom, a sulfur atom, a selenium atom or —NH—, $R^1$ to $R^7$ are each independently a hydrogen atom, a halogen atom, a sulfo group, a hydroxyl group, a cyano group, a nitro group, a carboxyl group, a phosphoric acid group, $-L^1$ or a —$NR^gR^h$ group ($R^g$ and $R^h$ are each independently a hydrogen atom, $-L^a$, $-L^b$, $-L^c$, $-L^d$, $-L^e$ or a —$C(O)R^i$ group ($R^i$ represents $-L^a$, $-L^b$, $-L^c$, $-L^d$ or $-L^e$)), $L^1$ is $L^a$, $L^b$, $L^c$, $L^d$, $L^e$, $L^f$, $L^g$ or $L^h$, and $L^a$ to $L^h$ have the same meanings as those of $L^a$ to $L^h$ defined in the formula (I).

[11] The optical filter as stated in any one of [1] to [10], wherein the transparent resin is at least one resin selected from the group consisting of a cyclic (poly)olefin resin, an aromatic polyether resin, a polyimide resin, a fluorene polycarbonate resin, a fluorene polyester resin, a polycarbonate resin, a polyamide resin, a polyarylate resin, a polysulfone resin, a polyether sulfone resin, a polyparaphenylene resin, a polyamideimide resin, a polyethylene naphthalate resin, a fluorinated aromatic polymer resin, a (modified) acrylic resin, an epoxy resin, an allyl ester curable resin, a silsesquioxane ultraviolet curable resin, an acrylic ultraviolet curable resin and a vinyl ultraviolet curable resin.

[12] The optical filter as stated in any one of [1] to [11], wherein the base material (i) includes a transparent resin substrate (ii) containing the compound (Z).

[13] The optical filter as stated in any one of [1] to [12], which is for a solid-state image pickup device.

[14] A solid-state image pickup device equipped with the optical filter as stated in any one of [1] to [12].

[15] A camera module equipped with the optical filter as stated in any one of [1] to [12].

According to the embodiments of the present invention, an optical filter having excellent properties of transmission of visible rays and a part of near-infrared rays and having small incident angle dependence, and a device using the optical filter can be provided.

The present invention is specifically described hereinafter.

[Optical Filter]

The optical filter of the embodiment of the present invention is a filter that has a base material (i) having a transparent resin layer containing a compound (Z) having an absorption maximum in the wavelength region of 600 to 850 nm and a dielectric multilayer film and selectively transmits visible rays and a part of infrared rays. Thus, the optical filter of the embodiment of the present invention uses a transparent resin layer containing a compound (Z) and a dielectric multilayer film in combination, and therefore, this filter is an optical filter having excellent transmittance properties and further having small incident angle dependence in the visible region and the near-infrared light passband.

When the optical filter of the embodiment of the present invention is used for a solid-state image sensor or the like, the visible light transmittance is preferably higher. Specifically, in the wavelength region of 430 to 580 nm, the mean transmittance measured in the perpendicular direction to the optical filter is not less than 75%, preferably not less than 80%, more preferably not less than 83%, particularly preferably not less than 85%. When the mean transmittance in this wavelength region is in the above range and when the optical filter of the embodiment of the present invention is used for a solid-state image sensor, excellent imaging sensitivity can be attained.

The optical filter of the embodiment of the present invention has a light stopband Za, a light passband Zb and a light stopband Zc in the wavelength region of not less than 650 nm. The relationship of the wavelengths of these bands is Za<Zb<Zc. That is to say, the center wavelengths of these bands satisfy the formula "Za<Zb<Zc".

Za indicates a wavelength band from the shortest wavelength Za1, at which the transmittance measured in the perpendicular direction to the optical filter becomes not more than 20% from more than 20%, to the longest wavelength Za2, at which the transmittance measured in the same direction as above becomes not less than 20% from less than 20%, in the wavelength region of not less than 650 nm but not more than 900 nm.

Zb indicates a wavelength band from the shortest wavelength Zb1, at which the transmittance measured in the perpendicular direction to the optical filter becomes more than 40% from not more than 40%, to the longest wavelength Zb2, at which the transmittance measured in the same direction as above becomes not more than 40% from more than 40%, in the wavelength region of not less than 750 nm but not more than 1050 nm.

Zc indicates a wavelength band from the shortest wavelength Zc1, at which the transmittance measured in the perpendicular direction to the optical filter becomes not more than 20% from more than 20%, to a wavelength Zc2 that is Zc1+200 nm, in the wavelength region of not less than 820 nm.

When the optical filter of the embodiment of the present invention is used for, for example, a solid-state image sensor also having a near-infrared sensing function, the maximum transmittance in the light (near-infrared ray) passband Zb is preferably higher, and the minimum transmittance in the light stopbands Za and Zc is preferably lower. In such a case, not only can excellent near-infrared sensing performance be attained but also rays of unnecessary wavelength can be effectively cut, and color reproducibility of a camera image can be enhanced.

In the light passband Zb, the maximum transmittance measured in the perpendicular direction to the optical filter is not less than 55%, preferably not less than 57%, more preferably not less than 60%, particularly preferably not less than 63%. In the light stopbands Za and Zc, the minimum transmittance measured in the perpendicular direction to the optical filter is not more than 15%, preferably not more than 10%, more preferably not more than 8%, still more preferably not more than 6%, particularly preferably not more than 5%. When the maximum transmittance in Zb and the minimum transmittance in Za and Zc are in the above ranges, a camera image having low noise and excellent color reproducibility can be obtained while attaining high near-infrared sensing performance.

A value of a difference Xb–Xa between a value (Xa) of a wavelength on the shortest wavelength side and a value (Xb) of a wavelength on the longest wavelength side in the Zb, at each of which the transmittance becomes 50%, is preferably 5 to 150 nm, more preferably 10 to 140 nm, particularly preferably 15 to 130 nm. A value of Y represented by Y=(Xa+Xb)/2 is preferably 750 to 950 nm, more preferably 760 to 940 nm, particularly preferably 770 to 930 nm. When the values of Xb–Xa and Y are in the above ranges, an optical filter providing more excellent near-infrared sensing sensitivity and color reproducibility of a camera image can be obtained.

In the optical filter of the embodiment of the present invention, the mean transmittance measured in the perpendicular direction to the optical filter in the wavelength region of Y−10 nm to Y+10 nm, Y being the aforesaid Y, is preferably not less than 60%, more preferably not less than 65%, particularly preferably not less than 70%.

A filter having such transmission properties can gain high light transmission properties in the visible region and the intended near-infrared region, and a camera function and a near-infrared sensing function are compatible with each other at a good level.

In the optical filter of the embodiment of the present invention, the absolute value of a difference between a shortest wavelength value (Xd) at which the transmittance measured in the perpendicular direction to the optical filter becomes 50% in the wavelength region of 560 to 800 nm and a shortest wavelength value (Xe) at which the transmittance measured at an angle of 30° to the perpendicular direction to the optical filter becomes 50% in the same wavelength region is decreased, and an optical filter having small incident angle dependence of spectral properties and having a wide viewing angle can be obtained. Especially when the optical filter is used for a camera module or the like, good camera image quality and color reproducibility at the image end part can be attained. The absolute value of a difference between (Xd) and (Xe) is preferably less than 25 nm, more preferably less than 15 nm, particularly preferably less than 10 nm. Such an optical filter can be obtained by using the compound (Z), particularly the following compound (A), and can be specifically obtained by forming a dielectric multilayer film on the base material (i) in such a manner that visible rays and a part of near-infrared rays are selectively transmitted.

In the optical filter of the embodiment of the present invention, an absolute value |Xa–Xa'| of a difference between a value (Xa') of a wavelength on the shortest wavelength side, at which the transmittance becomes 50%, in a band corresponding to the aforesaid Zb in a transmittance curve measured at an angle of 30° to the perpendicular direction to the optical filter, and the aforesaid Xa is preferably less than 25 nm, more preferably less than 23 nm, particularly preferably less than 20 nm. When the value of |Xa–Xa'| is in this range, an optical filter having small incident angle dependence of spectral properties can be obtained, and when the optical filter is used for a camera module particularly having a sensing function, a good near-infrared S/N ratio and good camera image quality can be attained at the same time even when a light is obliquely incident on the filter. Such an optical filter can be obtained by using the compound (Z), particularly the following compound (S), and can be specifically obtained by forming a dielectric multilayer film on the base material (i) in such a manner that visible rays and a part of near-infrared rays are selectively transmitted.

The thickness of the optical filter of the embodiment of the present invention has only to be properly selected according to the desired use, but according to the recent trend toward reduction in thickness and weight and so on of a solid-state image pickup device, also the thickness of the optical filter of the embodiment of the present invention is preferably small. Since the optical filter of the embodiment of the present invention includes the base material (i), reduction in thickness is feasible.

The thickness of the optical filter of the embodiment of the present invention is preferably, for example, not more than 200 μm, more preferably not more than 180 μm, still more preferably not more than 150 μm, particularly preferably not more than 120 μm, and the lower limit is desirably, for example, 20 μm though it is not specifically restricted.

[Base Material (i)]

The base material (i) may be a single-layer base material or a multilayer base material, and has only to have a transparent resin layer containing one or more compounds (Z) each having an absorption maximum in the wavelength region of 600 to 850 nm. When the base material (i) is a single-layer base material, there can be mentioned, for example, a base material formed of a transparent resin substrate (ii) containing the compound (Z), and this transparent resin substrate (ii) becomes the transparent resin layer. In the case of a multilayer base material, there can be mentioned, for example, a base material in which a transparent resin layer such as an overcoat layer containing the compound (Z) and a curable resin is laminated on a support such as a glass support or a resin support that becomes a base or on a transparent resin substrate (ii), or a base material in which a resin layer such as an overcoat layer containing a curable resin is laminated on a transparent resin substrate (ii) containing the compound (Z).

From the viewpoints of not only production cost and ease of optical property control but also attainment of flaw erasing effect for a resin support or a transparent resin substrate (ii) and enhancement in flaw resistance of the base material (i), a base material in which a resin layer such as an overcoat layer formed from a curable resin is laminated on a transparent resin substrate (ii) containing the compound (Z) is particularly preferable.

Hereinafter, a layer containing the compound (Z) and a transparent resin is also referred to as a "transparent resin layer", and a resin layer other than that is also referred to as a "resin layer" simply.

The base material (i) desirably satisfies at least one of the following condition (i-1) and the following condition (i-2).

(i-1) In the wavelength region of not less than 600 nm but less than 750 nm, the lowest transmittance (Ta) measured in the perpendicular direction to the base material (i) is preferably not more than 40%, more preferably not more than 25%, particularly preferably not more than 10%.

The shortest wavelength (Xc) at which the transmittance measured in the perpendicular direction to the base material (i) becomes not more than 50% from more than 50% in the wavelength region of not less than 600 nm is preferably 610 to 670 nm, more preferably 620 to 665 nm, particularly preferably 630 to 660 nm.

When the (Ta) and the (Xc) of the base material (i) is in such ranges, unnecessary near-infrared rays can be selectively and efficiently cut, and besides, when a dielectric multilayer film is formed on the base material (i), the dependence of the optical properties on the incident angle in the vicinity of the visible wavelength to near-infrared wavelength region can be reduced.

(i-2) In the wavelength region of not less than 750 nm, the lowest transmittance (Tb) measured in the perpendicular direction to the base material (i) is preferably not more than 40%, more preferably not more than 25%, particularly preferably not more than 10%.

The shortest wavelength (Xf) at which the transmittance measured in the perpendicular direction to the base material (i) becomes not less than 50% from less than 50% in the wavelength region of not less than 750 nm is preferably 770 to 900 nm, more preferably 775 to 890 nm, particularly preferably 780 to 880 nm.

If the (Tb) and the (Xf) of the base material (i) is in such ranges, unnecessary near-infrared rays in the vicinity of the near-infrared ray selective passband can be selectively and efficiently cut, and the near-infrared S/N ratio for sensing can be enhanced. Moreover, when a dielectric multilayer film is formed on the base material (i), the dependence of the optical properties on the incident angle on the short wavelength side of the near-infrared ray selective passband can be reduced.

The mean transmittance of the base material (i) in the wavelength region of 430 to 580 nm is preferably not less than 75%, more preferably not less than 78%, particularly preferably not less than 80%. When the base material having such transmission properties is used, high light transmission properties can be attained in the visible region and the intended near-infrared region, and a camera function and a near-infrared sensing function are compatible with each other at a good level.

The thickness of the base material (i) can be properly selected according to the desired use and is not specifically restricted. However, the thickness is preferably selected so that the incident angle dependence of the resulting optical filter can be reduced, and the thickness is preferably 10 to 200 μm, more preferably 20 to 180 nm, particularly preferably 30 to 150 μm.

When the thickness of the base material (i) is in the above range, the optical filter using the base material (i) can be reduced in thickness and weight, and can be preferably applied to various uses such as a solid-state image pickup device. Especially when the base material (i) formed of the transparent resin substrate (ii) is used for a lens unit of a camera module or the like, reduction in height and weight of the lens unit can be realized, so that such use is preferable.

<Compound (Z)>

The compound (Z) is not specifically restricted provided that it is a compound having an absorption maximum in the wavelength region of 600 to 850 nm, but this compound is preferably at least one compound selected from the group consisting of a compound (A) having an absorption maximum in the wavelength region of 600 to 750 nm and a compound (S) having an absorption maximum in the wavelength region of 750 to 850 nm. This compound is preferably a solvent-soluble coloring matter compound, and is more preferably at least one kind selected from the group consisting of a squarylium compound, a phthalocyanine compound, a naphthalocyanine compound, a croconium compound, a hexaphyrin compound and a cyanine compound. In the embodiment of the present invention, it is further preferable to use a squarylium compound among them because it has excellent visible light transmission properties, steep absorption properties and a high molar absorbance coefficient.

In the embodiment of the present invention, The absorption maximum wavelength of a compound may be determined by dissolving the compound in an appropriate solvent such as dichloromethane and then measuring the absorption maximum wavelength of the resulting solution by the use of a spectrophotometer.

When the compound (A) and the compound (S) are used in combination, these compounds may be contained in the same layer or may be contained in different layers. When they are contained in the same layer, there can be mentioned, for example, a base material in which the compound (A) and the compound (S) are both contained in a transparent resin substrate (ii), or a base material in which a transparent resin layer containing the compound (A) and the compound (S) is laminated on a support such as a glass support. When the above compounds are contained in different layers, there can be mentioned, for example, a base material in which a transparent resin layer containing the compound (S) is laminated on a transparent resin substrate (ii) containing the compound (A), or a base material in which a transparent resin layer containing the compound (A) is laminated on a transparent resin substrate (ii) containing the compound (S).

It is more preferable that the compound (A) and the compound (S) are contained in the same layer, and in such a case, control of the content ratio between the compound (A) and the compound (S) becomes easier than the case where they are contained in different layers.

For example, when a base material formed of the transparent resin substrate (ii) containing the compound (Z) or a base material in which a resin layer such as an overcoat layer formed from a curable resin, etc. is laminated on the transparent resin substrate (ii) containing the compound (Z) is used as the base material (i), the content of the compound (Z) is preferably 0.01 to 2.0 parts by weight, more preferably 0.02 to 1.5 parts by weight, particularly preferably 0.03 to 1.0 part by weight, based on 100 parts by weight of the transparent resin. When a base material in which a transparent resin layer such as an overcoat layer formed from a curable resin, etc. containing the compound (Z) is laminated on a glass support or a resin support that becomes a base is used as the base material (i), the content of the compound (Z) is preferably 0.1 to 5.0 parts by weight, more preferably 0.2 to 4.0 parts by weight, particularly preferably 0.3 to 3.0 parts by weight, based on 100 parts by weight of the resin that forms the transparent resin layer containing the compound (Z).

When the content of the compound (Z) is in the above range, an optical filter having good near-infrared absorption and transmission properties and a high visible light transmittance that are compatible with one another can be obtained.

<<Compound (A)>>

The absorption maximum wavelength of the compound (A) is preferably 620 to 750 nm, more preferably 650 to 745 nm, particularly preferably 660 to 740 nm. As the compounds (A), one or more squarylium compounds and one or more other compounds (A) are preferably contained, and when a squarylium compound and the other compound (A) are used, the squarylium compound particularly preferably has an absorption maximum on a shorter wavelength side than the other compound (A), and a difference in absorption maximum wavelength between the squarylium compound and at least one of the other compounds (A) is preferably 5 to 50 nm. When the squarylium compound and the other compound (A) are used as the compounds (A), the content of the squarylium compound is preferably 10 to 95% by weight, more preferably 15 to 85% by weight, particularly preferably 20 to 80% by weight, with the proviso that the total amount of the compounds (A) used is 100% by weight. Depending upon the structure, the squarylium compound sometimes emits fluorescence that causes scattered light during light absorption. However, in the case where the squarylium compound and the other compound (A) are used as the compounds (A), or in the case where the compounds (A) having a difference in absorption maximum wavelength being in the above range are used, or in the case where the squarylium compound is used in the above amount, preferably in the case where these are all satisfied, unnecessary rays including scattered light can be efficiently cut in the visible to near-infrared wavelength region, and excellent incident angle dependence improving performance and good camera image quality attributable to the scatted light reduction effect can be attained.

It is preferred that the compound (A) contains at least one selected from the group consisting of squarylium compounds represented by the following formula (I) and squarylium compounds represented by the following formula (II). These compounds are hereinafter also referred to as "compound (I)" and "compound (II)", respectively.

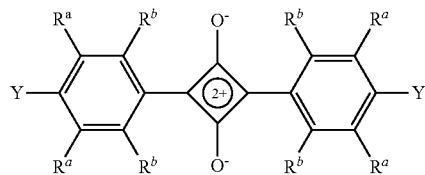
(I)

In the formula (I), $R^a$, $R^b$ and Y satisfy the following condition (i) or (ii).

Condition (i)

Plural $R^a$ are each independently a hydrogen atom, a halogen atom, a sulfo group, a hydroxyl group, a cyano group, a nitro group, a carboxyl group, a phosphoric acid group, -$L^1$ or a —$NR^e R^f$ group. $R^e$ and $R^f$ are each independently a hydrogen atom, -$L^a$, -$L^b$, -$L^c$, -$L^d$ or -$L^e$.

Plural $R^b$ are each independently a hydrogen atom, a halogen atom, a sulfo group, a hydroxyl group, a cyano group, a nitro group, a carboxyl group, a phosphoric acid group, -$L^1$ or a —$NR^g R^h$ group. $R^g$ and $R^h$ are each independently a hydrogen atom, -$L^a$, -$L^b$, -$L^c$, -$L^d$, -$L^e$ or a —$C(O)R^i$ group ($R^i$ represents -$L^a$, -$L^b$, -$L^c$, -$L^d$ or -$L^e$)

Plural Y are each independently a —$NR^j R^k$ group. $R^j$ and $R^k$ are each independently a hydrogen atom, -$L^a$, -$L^b$, -$L^c$, -$L^d$ or -$L^e$.

$L^1$ is $L^a$, $L^b$, $L^c$, $L^d$, $L^e$, $L^f$, $L^g$ or $L^h$.

The above $L^a$ to $L^h$ represent the following groups:

($L^a$) an aliphatic hydrocarbon group of 1 to 12 carbon atoms, which may have a substituent L, ($L^b$) a halogen-substituted alkyl group of 1 to 12 carbon atoms, which may have a substituent L, ($L^c$) an alicyclic hydrocarbon group of 3 to 14 carbon atoms, which may have a substituent L, ($L^d$) an aromatic hydrocarbon group of 6 to 14 carbon atoms, which may have a substituent L, ($L^e$) a heterocyclic group of 3 to 14 carbon atoms, which may have a substituent L, ($L^f$) an alkoxy group of 1 to 9 carbon atoms, which may have a substituent L, ($L^g$) an acyl group of 1 to 9 carbon atoms, which may have a substituent L, ($L^h$) an alkoxycarbonyl group of 1 to 9 carbon atoms, which may have a substituent L.

The substituent L is at least one kind selected from the group consisting of an aliphatic hydrocarbon group of 1 to 12 carbon atoms, a halogen-substituted alkyl group of 1 to 12 carbon atoms, an alicyclic hydrocarbon group of 3 to 14 carbon atoms, an aromatic hydrocarbon group of 6 to 14 carbon atoms, a heterocyclic group of 3 to 14 carbon atoms, a halogen atom, a sulfo group, a hydroxyl group, a cyano group, a nitro group, a carboxyl group, a phosphoric acid group and an amino group.

In each of the above $L^a$ to $L^h$, the total number of carbon atoms including those of substitutents is preferably 50 or less, more preferably 40 or less, particularly preferably 30 or less. If the total number of carbon atoms is larger than the upper limit of this range, synthesis of the compound sometimes becomes difficult, and light absorption intensity per unit weight tends to be lowered.

Condition (ii)

At least one of two $R^a$s on one benzene ring binds with Y on the same benzene ring to form a heterocycle constituted by 5 or 6 atoms including at least one nitrogen atom, which heterocycle is optionally substituted, and $R^b$s and $R^a$s that are not involved in the formation of the heterocycle each independently have the same meaning as the $R^b$s and $R^a$s in the condition (i).

Specific Examples of Groups

Examples of the aliphatic hydrocarbon groups of 1 to 12 carbon atoms in the above $L^a$ and L include alkyl groups, such as methyl group (Me), ethyl group (Et), n-propyl group (n-Pr), isopropyl group (i-Pr), n-butyl group (n-Bu), sec-butyl group (s-Bu), tert-butyl group (t-Bu), pentyl group, hexyl group, octyl group, nonyl group, decyl group and dodecyl group; alkenyl groups, such as vinyl group, 1-propenyl group, 2-propenyl group, butenyl group, 1,3-butadienyl group, 2-methyl-1-propenyl group, 2-pentenyl group, hexenyl group and octenyl group; and alkynyl groups, such as ethynyl group, propynyl group, butynyl group, 2-methyl-1-propynyl group, hexynyl group and octynyl group.

Examples of the halogen-substituted alkyl groups of 1 to 12 carbon atoms in the above $L^b$ and L include trichloromethyl group, trifluoromethyl group, 1,1-dichloroethyl group, pentachloroethyl group, pentafluoroethyl group, heptachloropropyl group and heptafluoropropyl group.

Examples of the alicyclic hydrocarbon groups of 3 to 14 carbon atoms in the above $L^c$ and L include cycloalkyl groups, such as cyclobutyl group, cyclopentyl group, cyclohexyl group, cycloheptyl group and cyclooctyl group; and polycyclic alicyclic groups, such as norbornane group and adamantane group.

Examples of the aromatic hydrocarbon groups of 6 to 14 carbon atoms in the above $L^d$ and L include phenyl group, tolyl group, xylyl group, mesityl group, cumenyl group, 1-naphthyl group, 2-naphthyl group, anthracenyl group, phenanthryl group, acenaphthyl group, phenalenyl group, tetrahydronaphthyl group, indanyl group and biphenylyl group.

Examples of the heterocyclic groups of 3 to 14 carbon atoms in the above $L^e$ and L include groups composed of heterocyclic rings such as furan, thiophene, pyrrole, pyrazole, imidazole, triazole, oxazole, oxadiazole, thiazole, thiadiazole, indole, indoline, indolenine, benzofuran, benzothiophene, carbazole, dibenzofuran, dibenzothiophene, pyridine, pyrimidine, pyrazine, pyridazine, quinoline, isoquinoline, acridine, morpholine and phenazine.

Examples of the alkoxy groups of 1 to 12 carbon atoms in the above $L^f$ include methoxy group, ethoxy group, n-propoxy group, isopropoxy group, butoxy group, pentyloxy group, hexyloxy group and octyloxy group.

Examples of the acyl groups of 1 to 9 carbon atoms in the above $L^g$ include acetyl group, propionyl group, butyryl group, isobutyryl group, valeryl group, isovaleryl group and benzoyl group.

Examples of the alkoxycarbonyl groups of 1 to 9 carbon atoms in the above $L^h$ include methoxycarbonyl group, ethoxycarbonyl group, propoxycarbonyl group, isopropoxycarbonyl group, butoxycarbonyl group, pentyloxycarbonyl group, hexyloxycarbonyl group and octyloxycarbonyl group.

The $L^a$ is preferably a methyl group, an ethyl group, a n-propyl group, an isopropyl group, a n-butyl group, a sec-butyl group, a tert-butyl group, a pentyl group, a hexyl group, an octyl group, a 4-phenylbutyl group or 2-cyclohexylethyl, and is more preferably a methyl group, an ethyl group, a n-propyl group, an isopropyl group, a n-butyl group, a sec-butyl group or a tert-butyl group.

As the $L^b$, preferred are trichloromethyl group, pentachloroethyl group, trifluoromethyl group, pentafluoroethyl group and 5-cyclohexyl-2,2,3,3-tetrafluoropentyl group, and more preferred are trichloromethyl group, pentachloroethyl group, trifluoromethyl group and pentafluoroethyl group.

As the $L^c$, preferred are cyclobutyl group, cyclopentyl group, cyclohexyl group, 4-ethylcyclohexyl group, cyclooctyl group and 4-phenylcycloheptyl group, and more preferred are cyclopentyl group, cyclohexyl group and 4-ethylcyclohexyl group.

As the $L^d$, preferred are phenyl group, 1-naphthyl group, 2-naphthyl group, tolyl group, xylyl group, mesityl group, cumenyl group, 3,5-di-tert-butylphenyl group, 4-cyclopentylphenyl group, 2,3,6-triphenylphenyl group and 2,3,4,5,6-pentaphenylphenyl group, and more preferred are phenyl group, tolyl group, xylyl group, mesityl group, cumenyl group and 2,3,4,5,6-pentaphenylphenyl group.

The $L^e$ is preferably a group formed of furan, thiophene, pyrrole, indole, indoline, indolenine, benzofurane, benzothiophene or morpholine, and is more preferably a group formed of furan, thiophene, pyrrole or morpholine.

As the $L^f$, preferred are methoxy group, ethoxy group, propoxy group, isopropoxy group, butoxy group, methoxymethyl group, methoxyethyl group, 2-phenylethoxy group, 3-cyclohexylpropoxy group, pentyloxy group, hexyloxy group and octyloxy group, and more preferred are methoxy group, ethoxy group, propoxy group, isopropoxy group and butoxy group.

The $L^g$ is preferably an acetyl group, a propionyl group, a butyryl group, an isobutyryl group, a benzoyl group, a 4-propylbenzoyl group or a trifluoromethylcarbonyl group, and is more preferably an acetyl group, a propionyl group or a benzoyl group.

As the $L^h$, preferred are methoxycarbonyl group, ethoxycarbonyl group, propoxycarbonyl group, isopropoxycarbonyl group, butoxycarbonyl group, 2-trifluoromethylethoxycarbonyl group and 2-phenylethoxycarbonyl group, and more preferred are methoxycarbonyl group and ethoxycarbonyl group.

The $L^a$ to $L^h$ may further have at least one atom or group selected from the group consisting of a halogen atom, a sulfo group, a hydroxyl group, a cyano group, a nitro group, a carboxyl group, a phosphoric acid group and an amino group. Examples thereof include 4-sulfobutyl group, 4-cyanobutyl group, 5-carboxypentyl group, 5-aminopentyl group, 3-hydroxypropyl group, 2-phosphorylethyl group, 6-amino-2,2-dichlorohexyl group, 2-chloro-4-hydroxybutyl group, 2-cyanocyclobutyl group, 3-hydroxycyclopentyl group, 3-carboxycyclopentyl group, 4-aminocyclohexyl group, 4-hydroxycyclohexyl group, 4-hydroxyphenyl group, pentafluorophenyl group, 2-hydroxynaphthyl group, 4-aminophenyl group, 4-nitrophenyl group, group composed of 3-methylpyrrole, 2-hydroxyethoxy group, 3-cyanopropoxy group, 4-fluorobenzoyl group, 2-hydroxyethoxycarbonyl group and 4-cyanobutoxycarbonyl group.

The $R^a$ in the above condition (i) is preferably a hydrogen atom, a chlorine atom, a fluorine atom, a methyl group, an ethyl group, a n-propyl group, an isopropyl group, a n-butyl group, a sec-butyl group, a tert-butyl group, a cyclohexyl group, a phenyl group, a hydroxyl group, an amino group, a dimethylamino group, or a nitro group; and is more preferably a hydrogen atom, a chlorine atom, a fluorine atom, a methyl group, an ethyl group, a n-propyl group, an isopropyl group, or a hydroxyl group.

The $R^b$ in the above condition (i) is preferably a hydrogen atom, a chlorine atom, a fluorine atom, a methyl group, an ethyl group, a n-propyl group, an isopropyl group, a n-butyl group, a sec-butyl group, a tert-butyl group, a cyclohexyl group, a phenyl group, a hydroxyl group, an amino group, a dimethylamino group, a cyano group, a nitro group, an acetylamino group, a propionylamino group, a N-methylacetylamino group, a trifluoromethanoylamino group, a pentafluoroethanoylamino group, a t-butanoylamino group, or a cyclohexynoylamino group, and is more preferably a hydrogen atom, a chlorine atom, a fluorine atom, a methyl group, an ethyl group, a n-propyl group, an isopropyl group, a hydroxyl group, a dimethylamino group, a nitro group, an acetylamino group, a propionylamino group, a trifluoromethanoylamino group, a pentafluoroethanoylamino group, a t-butanoylamino group, or a cyclohexynoylamino group.

The Y is preferably an amino group, a methylamino group, a dimethylamino group, a diethylamino group, a di-n-propylamino group, a diisopropylamino group, a di-n-butylamino group, a di-t-butylamino group, a N-ethyl-N-methylamino group, or a N-cyclohexyl-N-methylamino group, and is more preferably a dimethylamino group, a diethylamino group, a di-n-propylamino group, a diisopropylamino group, a di-n-butylamino group, or a di-t-butylamino group.

Examples of the heterocyclic rings of 5 or 6 constituent atoms containing at least one nitrogen atom, which are formed by bonding of at least one of two $R^a$ on one benzene ring and Y on the same benzene ring to each other, in the condition (ii) of the aforesaid formula (I), include pyrrolidine, pyrrole, imidazole, pyrazole, piperidine, pyridine, piperazine, pyridazine, pyrimidine and pyrazine. Of these heterocyclic rings, preferred are heterocyclic rings wherein one atom adjacent to a carbon atom that constitutes the heterocyclic ring and constitutes the benzene ring is a nitrogen atom, and more preferred is pyrrolidine.

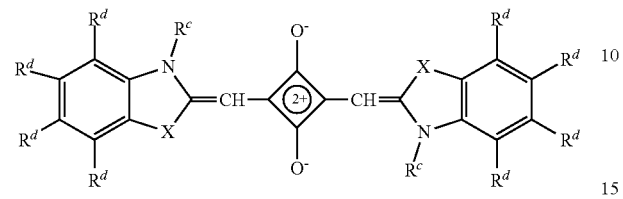

(II)

In the formula (II), each X is independently O, S, Se, N—$R^c$ or $C(R^dR^d)$; plural $R^c$ are each independently a hydrogen atom, $L^a$, $L^b$, $L^c$, $L^d$ or $L^e$; plural $R^d$ are each independently a hydrogen atom, a halogen atom, a sulfo group, a hydroxyl group, a cyano group, a nitro group, a carboxyl group, a phosphoric acid group, -$L^1$ or a —$NR^eR^f$ group, and neighboring $R^d$ and $R^d$ may be bonded to each other to form a ring which may have a substituent; and $L^a$ to $L^e$, $L^1$, $R^e$ and $R^f$ have the same meanings as those of $L^a$ to $L^e$, $L^1$, $R^e$ and $R^f$ defined in the formula (I).

$R^c$ in the formula (II) is preferably a hydrogen atom, a methyl group, an ethyl group, a n-propyl group, an isopropyl group, a n-butyl group, a sec-butyl group, a tert-butyl group, a n-pentyl group, a n-hexyl group, a cyclohexyl group, a phenyl group, a trifluoromethyl group, or a pentafluoroethyl group, and is more preferably a hydrogen atom, a methyl group, an ethyl group, a n-propyl group, or an isopropyl group.

$R^d$ in the formula (II) is preferably a hydrogen atom, a chlorine atom, a fluorine atom, a methyl group, an ethyl group, a n-propyl group, an isopropyl group, a n-butyl group, a sec-butyl group, a tert-butyl group, a n-pentyl group, a n-hexyl group, a cyclohexyl group, a phenyl group, a methoxy group, a trifluoromethyl group, a pentafluoroethyl group, or a 4-aminocyclohexyl group, and is more preferably a hydrogen atom, a chlorine atom, a fluorine atom, a methyl group, an ethyl group, a n-propyl group, an isopropyl group, a trifluoromethyl group, or a pentafluoroethyl group.

The above X is preferably O, S, Se, N-Me, N-Et, $CH_2$, C-$Me_2$, or C-$Et_2$, and is more preferably S, C-$Me_2$, or C-$Et_2$.

In the formula (II), neighboring $R^d$ and $R^d$ may be bonded to each other to form a ring. Examples of such rings include benzoindolenine ring, α-naphthoimidazole ring, β-naphthoimidazole ring, α-naphthooxazole ring, β-naphthooxazole ring, α-naphthothiazole ring, β-naphthothiazole ring, α-naphthoselenazole ring and β-naphthoselenazole ring.

Structures of the compound (I) and the compound (II) can be represented also by such descriptive means as have resonance structures, such as the following formula (I-2) and the following formula (II-2), in addition to the descriptive means such as the following formula (I-1) and the following formula (II-1). That is to say, a difference between the following formula (I-1) and the following formula (I-2) and a difference between the following formula (II-1) and the following formula (II-2) are only descriptive means for the structures, and both of them represent the same compound. In the embodiment of the present invention, the structures of the squarylium compounds are represented by descriptive means such as the following formula (I-1) and the following formula (II-1) unless otherwise noted.

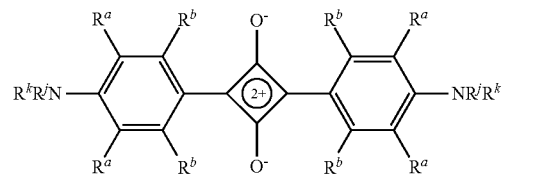

(I-1)

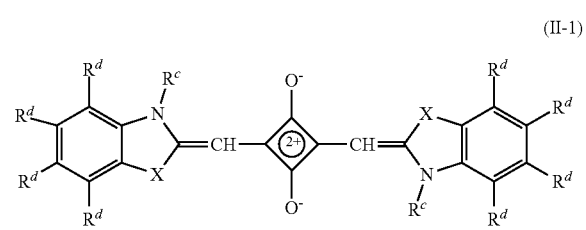

(II-1)

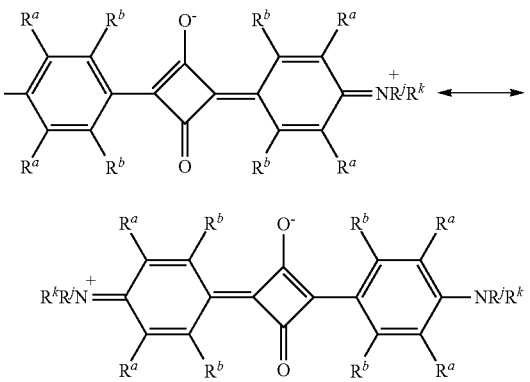

(I-2)

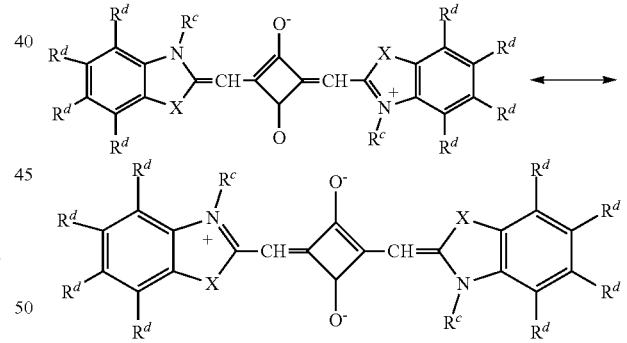

(II-2)

Further, for example, a compound represented by the following formula (I-3) and a compound represented by the following formula (I-4) can be regarded as identical with each other.

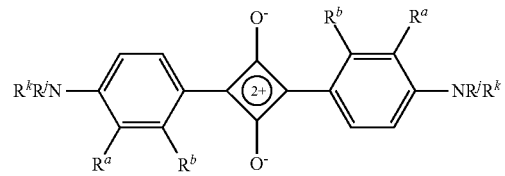

(I-3)

-continued (I-4)
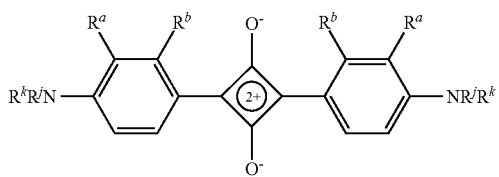

The structures of the compound (I) and the compound (II) are not specifically restricted provided that they satisfy the requirements of the aforesaid formula (I) and the aforesaid formula (II), respectively. For example, when the structures are represented by the aforesaid formula (I-1) and the aforesaid formula (II-1), the substituents which are bonded to the central 4-membered ring and are on the right-hand side and the left-hand side thereof may be the same or different, but they are preferably the same as each other because of ease of synthesis.

Specific examples of the compound (I) and the compound (II) include compounds (a-1) to (a-36) described in the following Tables 1 to 3, which have basic skeletons represented by the following (I-A) to (I-H).

(I-A)
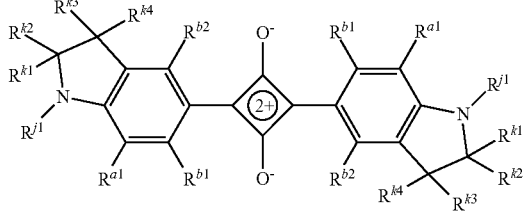

(I-B)

(I-C)

(I-D)
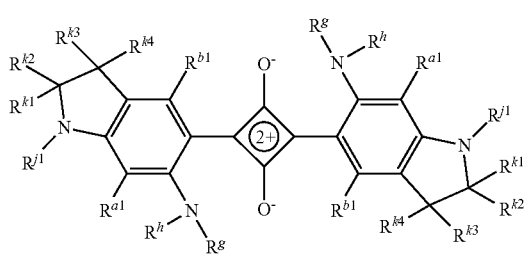

(I-E)
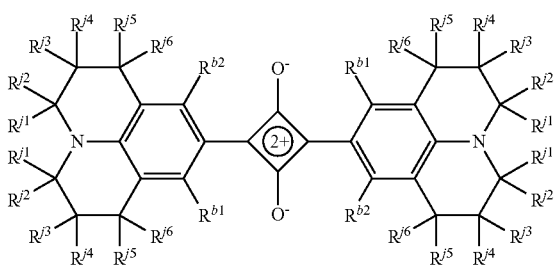

(I-F)
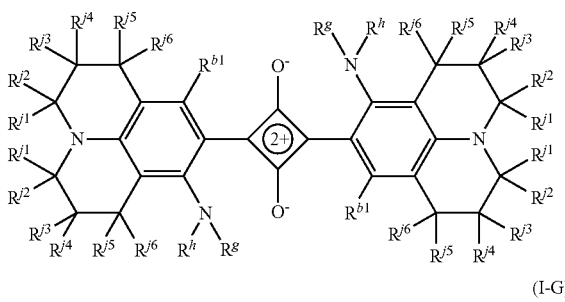

(I-G)
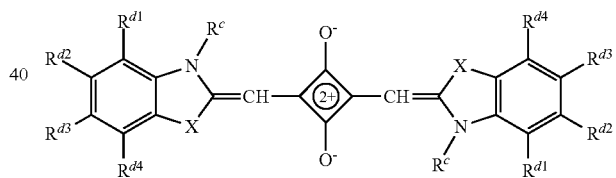

(I-H)
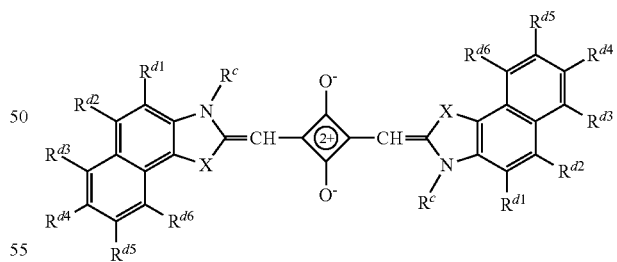

TABLE 1

| Compound | Basic Skeleton | $R^{a1}$ | $R^{a2}$ | $R^{b1}$ | $R^{b2}$ | $R^c$ | $R^h$ | $R^{j1}$ | $R^{k1}$ | $R^{k2}$ | $R^{k3}$ | $R^{k4}$ |
|---|---|---|---|---|---|---|---|---|---|---|---|---|
| (a-1) | (I-A) | H | H | Me | H | — | — | Et | n-Pr | — | — | — |
| (a-2) |  | H | H | OH | H | — | — | n-Bu | n-Bu | — | — | — |
| (a-3) |  | Me | H | OH | H | — | — | t-Bu | t-Bu | — | — | — |
| (a-4) | (I-B) | H | H | H | — | Me | Me | n-Pr | n-Pr | — | — | — |

TABLE 1-continued

| Compound | Basic Skeleton | $R^{a1}$ | $R^{a2}$ | $R^{b1}$ | $R^{b2}$ | $R^c$ | $R^h$ | $R^{j1}$ | $R^{k1}$ | $R^{k2}$ | $R^{k3}$ | $R^{k4}$ |
|---|---|---|---|---|---|---|---|---|---|---|---|---|
| (a-5) | | H | H | H | — | H |  | Et | Et | — | — | — |
| (a-6) | | H | H | H | — | Me |  | n-Bu | n-Bu | — | — | — |
| (a-7) | | H | H | H | — | H |  | Me | Et | — | — | — |
| (a-8) | | H | H | H | — | H |  | n-Bu | n-Bu | — | — | — |
| (a-9) | | Me | H | H | — | H |  | i-Pr | i-Pr | — | — | — |
| (a-10) | (I-C) | H | — | OH | H | — | — | Me | H | H | H | H |
| (a-11) | | Me | — | Me | H | — | — | Me | Me | H | Me | Me |
| (a-12) | | H | — | OH | H | — | — | Me | Me | H | Me | Me |
| (a-13) | | H | — | H | H | — | — | n-Bu | H | H | Et | H |
| (a-14) | | H | — | OH | H | — | — | 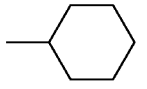 | Me | H | Me | Me |
| (a-15) | (I-D) | H | — | H | — | H | H | Me | H | H | Me | Me |
| (a-16) | | H | — | H | — | H |  | Me | Me | H | Me | Me |
| (a-17) | | H | — | H | — | H |  | Me | Me | H | Me | Me |
| (a-18) | | H | — | H | — | H | 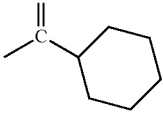 | Me | Me | H | Me | Me |
| (a-19) | | Me | — | H | — | H | 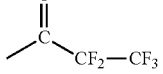 | Et | Me | H | Me | Me |
| (a-20) | | H | — | H | — | H |  | Me | Me | H | Me | Me |

TABLE 2

| Compound | Basic skeleton | $R^{b1}$ | $R^{b2}$ | $R^c$ | $R^h$ | $R^{j1}$ | $R^{j2}$ | $R^{j3}$ | $R^{j4}$ | $R^{j5}$ | $R^{j6}$ |
|---|---|---|---|---|---|---|---|---|---|---|---|
| (a-21) | (I-E) | OH | H | — | — | H | H | H | H | H | H |
| (a-22) | | OH | H | — | — | H | H | H | H | Me | Me |
| (a-23) | | OH | H | — | — | Me | H | Me | H | Me | Me |

TABLE 2-continued

| Compound | Basic skeleton | Substituent | | | | | | | | | |
|---|---|---|---|---|---|---|---|---|---|---|---|
| | | $R^{b1}$ | $R^{b2}$ | $R^c$ | $R^h$ | $R^{j1}$ | $R^{j2}$ | $R^{j3}$ | $R^{j4}$ | $R^{j5}$ | $R^{j6}$ |
| (a-24) | | OH | Me | — | — | H | H | H | H | n-Bu | n-Bu |
| (a-25) | (I-F) | H | — | H | —C(=O)—Me | H | H | H | H | Me | Me |
| (a-26) | | H | — | Me | —C(=O)—Me | Me | H | Me | H | Me | Me |
| (a-27) | | H | — | H | —C(=O)—CF$_3$ | H | H | Me | Me | Et | Et |
| (a-28) | | H | — | H | —C(=O)—t-Bu | H | H | H | H | Me | Me |

TABLE 3

| Compound | Basic skeleton | Substituent | | | | | | | |
|---|---|---|---|---|---|---|---|---|---|
| | | X | $R^d$ | $R^{d1}$ | $R^{d2}$ | $R^{d3}$ | $R^{d4}$ | $R^{d5}$ | $R^{d6}$ |
| (a-29) | (I-G) | C(CH$_3$)$_2$ | Et | H | H | H | H | — | — |
| (a-30) | | CH$_2$ | n-Bu | H | H | F | H | — | — |
| (a-31) | | S | Me | H | Me | Me | H | — | — |
| (a-32) | | O | Et | H | CF$_3$ | CF$_3$ | H | — | — |
| (a-33) | (I-H) | C(CH$_3$)$_2$ | i-Pr | H | H | H | H | H | H |
| (a-34) | | S | n-Bu | H | H | H | CF$_3$ | CF$_3$ | H |
| (a-35) | | C(CH$_3$)$_2$ | CF$_2$CF$_3$ | H | H | H | H | —OMe | H |
| (a-36) | | C(CH$_3$)$_2$ | Et | H | H | H | Me | Me | H |

It is enough to synthesize the compound (I) and the compound (II) by generally known processes, and for example, they can be synthesized referring to the processes described in JP-A-H1-228960, JP-A-2001-40234, Japanese Patent No. 3196383, etc.

<<Phthalocyanine Compound>>

The phthalocyanine compound is preferably a compound represented by the following formula (III) (also referred to as the "compound (III)" hereinafter).

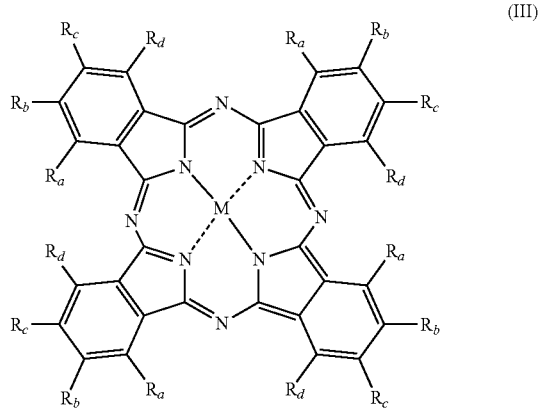

(III)

In the formula (III), M represents two hydrogen atoms, two monovalent metal atoms, a divalent metal atom, or substituted metal atoms containing a trivalent or tetravalent metal atom.

Plural $R_a$, $R_b$, $R_c$ and $R_d$ are each independently a hydrogen atom, a halogen atom, a hydroxyl group, a carboxyl group, a nitro group, an amino group, an amide group, an imide group, a cyano group, a silyl group, -L$^1$, —S-L$^2$, —SS-L$^2$, —SO$_2$-L$^3$ or —N=N-L$^4$, or at least one combination of $R_a$ and $R_b$, $R_b$ and $R_c$, and $R_c$ and $R_d$ is bonded to form at least one group selected from the group consisting of groups represented by the following formulas (A) to (H), and at least one of $R_a$, $R_b$, $R_c$ and $R_d$ bonded to the same aromatic ring is not a hydrogen atom.

The amino group, the amide group, the imide group and the silyl group may have a substituent L defined in the aforesaid formula (I), L$^1$ has the same meaning as that of L$^1$ defined in the formula (I), L$^2$ is a hydrogen atom or any one of L$^d$ to L$^e$ defined in the formula (I), L$^3$ is a hydroxyl group or any one of the above L$^d$ to L$^e$, and L$^4$ is any one of the above L$^a$ to L$^e$.

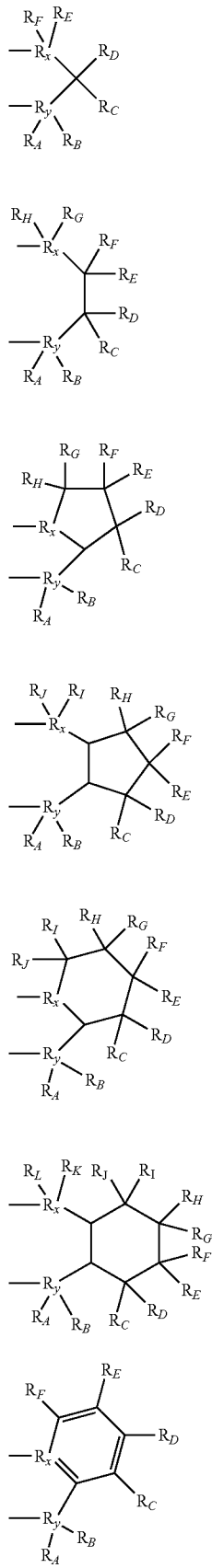

(A)

(B)

(C)

(D)

(E)

(F)

(G)

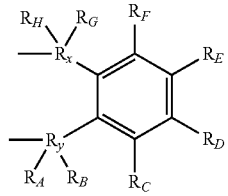

(H)

In the formulae (A) to (H), $R_x$ and $R_y$ are each a carbon atom; and plural $R_A$ to $R_L$ each independently represent a hydrogen atom, a halogen atom, a hydroxyl group, a nitro group, an amino group, an amide group, an imide group, a cyano group, a silyl group, $-L^1$, $-S-L^2$, $-SS-L^2$, $-SO_2-L^3$, or $-N=N-L^4$, wherein the amino group, amide group, imide group and silyl group optionally have the substituent L defined in the formula (I), and the $L^1$ to $L^4$ have the same meaning as the $L^1$ to $L^4$ defined in the formula (III), respectively.

Examples of the amino groups which may have a substituent L in the above $R_a$ to $R_d$ and $R_A$ to $R_L$ include amino group, ethylamino group, dimethylamino group, methylethylamino group, dibutylamino group and diisopropylamino group.

Examples of the amide groups which may have a substituent L in the above $R_a$ to $R_d$ and $R_A$ to $R_L$ include amide group, methylamide group, dimethylamide group, diethylamide group, dipropylamide group, diisopropylamide group, dibutylamide group, α-lactam group, β-lactam group, γ-lactam group and δ-lactam group.

Examples of the imide groups which may have a substituent L in the above $R_a$ to $R_d$ and $R_A$ to $R_L$ include imide group, methylimide group, ethylimide group, diethylimide group, dipropylimide group, diisopropylimide group and dibutylimide group.

Examples of the silyl groups which may have a substituent L in the above $R_a$ to $R_d$ and $R_A$ to $R_L$ include trimethylsilyl group, tert-butyldimethylsilyl group, triphenylsilyl group and triethylsilyl group.

Examples of $-S-L^2$ in the above $R_a$ to $R_d$ and $R_A$ to $R_L$ include thiol group, methyl sulfide group, ethyl sulfide group, propyl sulfide group, butyl sulfide group, isobutyl sulfide group, sec-butyl sulfide group, tert-butyl sulfide group, phenyl sulfide group, 2,6-di-tert-butylphenyl sulfide group, 2,6-diphenylphenyl sulfide group and 4-cumylphenyl sulfide group.

Examples of $-SS-L^2$ in the above $R_a$ to $R_d$ and $R_A$ to $R_L$ include disulfide group, methyl disulfide group, ethyl disulfide group, propyl disulfide group, butyl disulfide group, isobutyl disulfide group, sec-butyl disulfide group, tert-butyl disulfide group, phenyl disulfide group, 2,6-di-tert-butylphenyl disulfide group, 2,6-diphenylphenyl disulfide group and 4-cumylphenyl disulfide group.

Examples of $-SO_2-L^3$ in the above $R_a$ to $R_d$ and $R_A$ to $R_L$ include sulfo group, mesyl group, ethylsulfonyl group, n-butylsulfonyl group and p-toluenesulfonyl group.

Examples of $-N=N-L^4$ in the above $R_a$ to $R_d$ and $R_A$ to $R_L$ include methylazo group, phenylazo group, p-methylphenylazo group and p-dimethylaminophenylazo group.

Examples of the monovalent metal atoms in the above M include Li, Na, K, Rb and Cs.

Examples of the divalent metal atoms in the above M include Be, Mg, Ca, Ba, Ti, Cr, Mn, Fe, Ru, Co, Rh, Ni, Pd, Pt, Cu, Zn, Cd, Hg, Sn and Pb.

Examples of the substituted metal atoms containing a trivalent metal atom in the above M include Al—F, Al—Cl, Al—Br, Al—I, Ga—F, Ga—Cl, Ga—Br, Ga—I, In—F, In—Cl, In—Br, In—I, Tl—F, Tl—Cl, Tl—Br, Tl—I, Fe—Cl, Ru—Cl and Mn—OH.

Examples of the substituted metal atoms containing a tetravalent metal atom in the above M include $TiF_2$, $TiCl_2$, $TiBr_2$, $TiI_2$, $ZrCl_2$, $HfCl_2$, $CrCl_2$, $SiF_2$, $SiCl_2$, $SiBr_2$, $SiI_2$, $GeF_2$, $GeCl_2$, $GeBr_2$, $GeI_2$, $SnF_2$, $SnCl_2$, $SnBr_2$, $SnI_2$, $Zr(OH)_2$, $Hf(OH)_2$, $Mn(OH)_2$, $Si(OH)_2$, $Ge(OH)_2$, $Sn(OH)_2$, $TiR_2$, $CrR_2$, $SiR_2$, $GeR_2$, $SnR_2$, $Ti(OR)_2$, $Cr(OR)_2$, $Si(OR)_2$, $Ge(OR)_2$, $Sn(OR)_2$ (R is an aliphatic group or an aromatic group), TiO, VO and MnO.

As the M, a divalent transition metal belonging to the periodic table Group 5 to Group 11 and belonging to the periodic table Period 4 to Period 5, a halide of a trivalent or tetravalent metal or an oxide of a tetravalent metal is preferable, and of these, Cu, Ni, Co or Vo is particularly preferable because high visible light transmittance and stability can be attained.

For synthesizing the phthalocyanine compound, a synthesis process by cyclization reaction of such a phthalonitrile derivative as represented by the following formula (V) is generally known, but the resulting phthalocyanine compound is a mixture of four kinds of such isomers as represented by the following formulas (VI-1) to (VI-4). In the embodiment of the present invention, one kind of an isomer is given as an example for one kind of the phthalocyanine compound unless otherwise noted, but the other three kinds of isomers can be also used likewise. It is possible to use these isomers after they are isolated when needed, but in the embodiment of the present invention, they are treated all together as an isomer mixture.

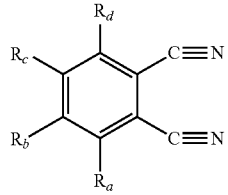

(V)

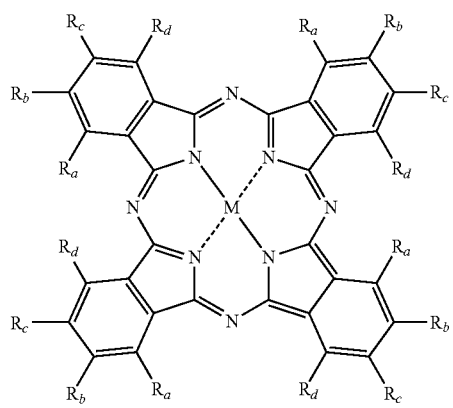

(VI-1)

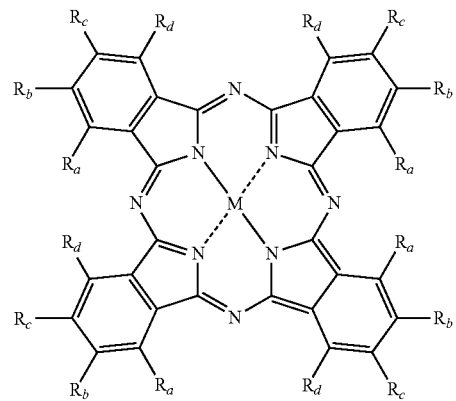

(VI-2)

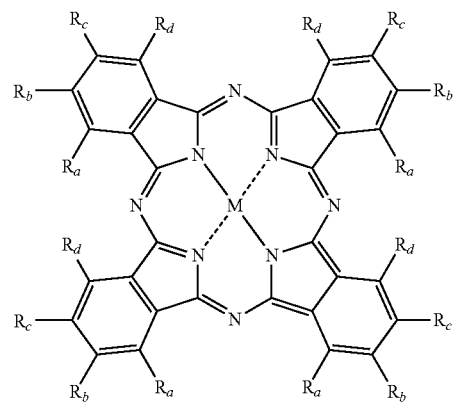

(VI-3)

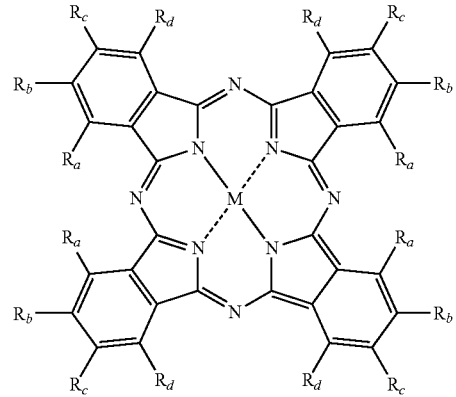

(VI-4)

Specific examples of the compounds (III) include (b-1) to (b-61) described in the following Tables 4 to 7, which have basic skeletons represented by the following formulas (III-A) to (III-J).

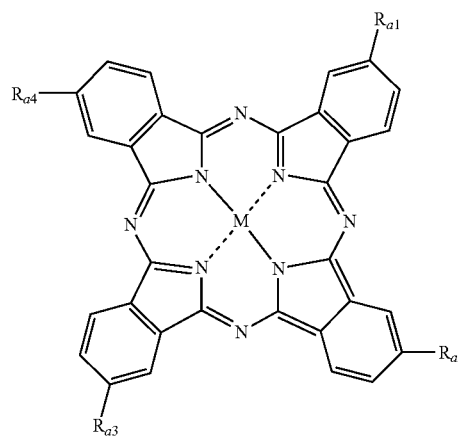
(III-A)
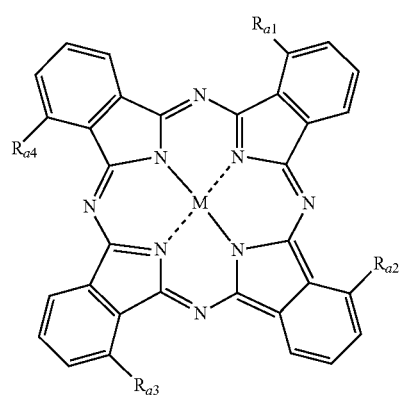
(III-B)
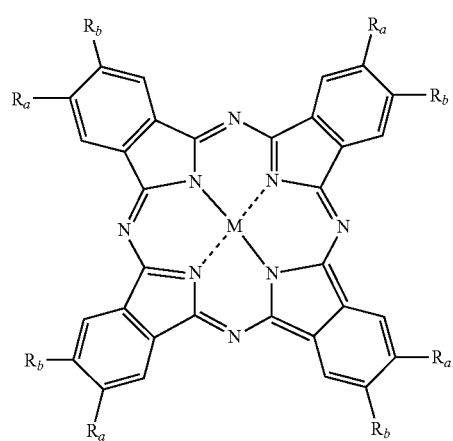
(III-C)
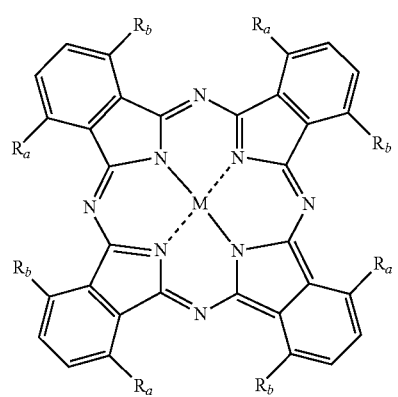
(III-D)
-continued
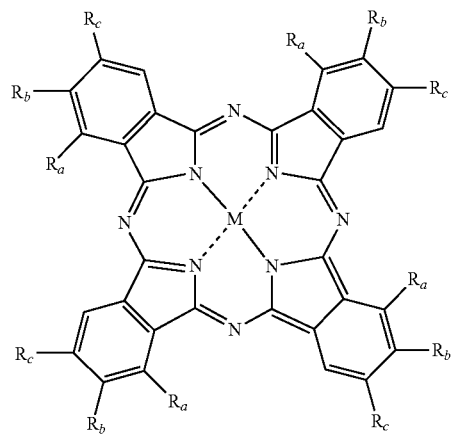
(III-E)
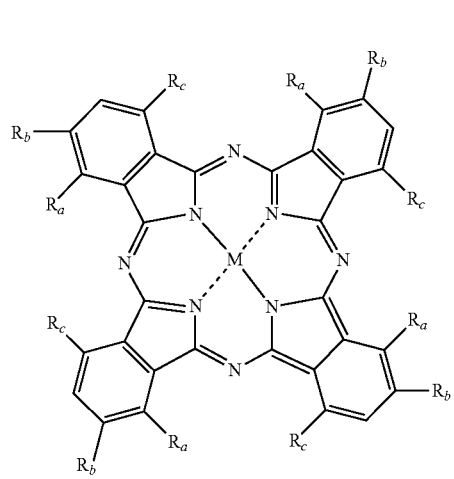
(III-F)
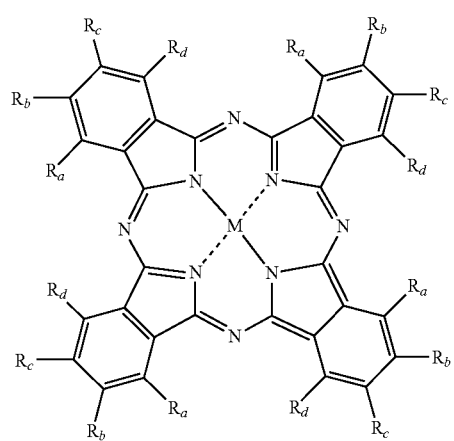
(III-G)

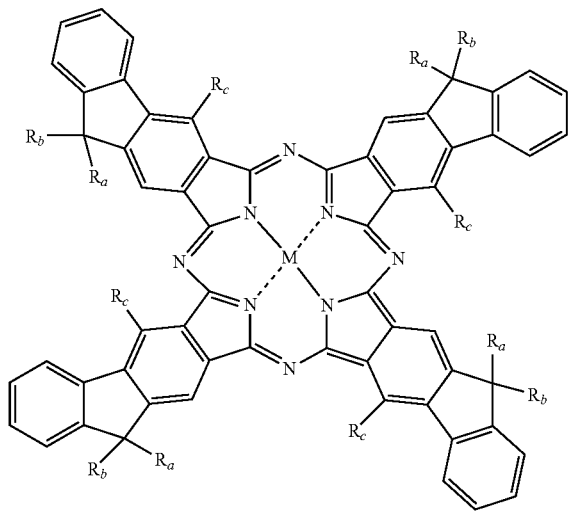

(III-H)

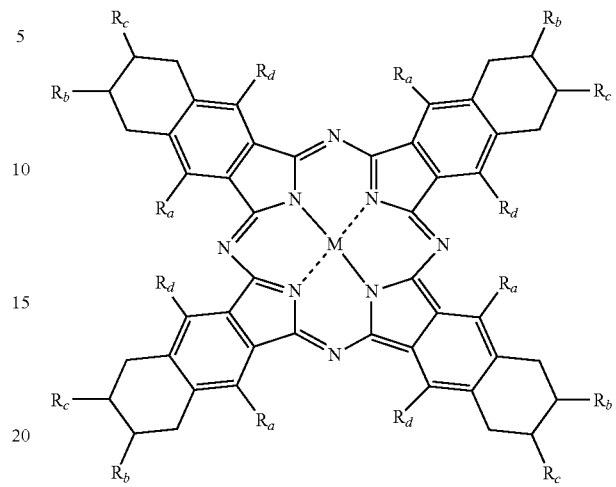

(III-J)

TABLE 4

| Compound | Basic skeleton | M | Substituent $R_{a1}$ | $R_{a2}$ |
|---|---|---|---|---|
| (b-1) | (III-A) | Ni | —O(CH$_2$)$_2$CH$_3$ | —O(CH$_2$)$_2$CH$_3$ |
| (b-2) | | Cu | —O(CH$_2$)$_2$CH$_3$ | —O(CH$_2$)$_2$CH$_3$ |
| (b-3) | | VO | —O(CH$_2$)$_2$CH$_3$ | —O(CH$_2$)$_2$CH$_3$ |
| (b-4) | | VO | —O—C$_6$H$_5$ | —O—C$_6$H$_5$ |
| (b-5) | | Cu | —O—C$_6$H$_5$ | —O—C$_6$H$_5$ |
| (b-5) | | Cu | —S—C$_6$H$_5$ | —S—C$_6$H$_5$ |
| (b-6) | | VO | —S(CH$_2$)$_3$CH$_3$ | —S(CH$_2$)$_3$CH$_3$ |
| (b-7) | | Ni | —NH$_2$ | —NH$_2$ |
| (b-8) | | Cu | —NH(CH$_2$)$_3$CH$_3$ | —NH(CH$_2$)$_3$CH$_3$ |
| (b-9) | | Co | —OH | —OH |
| (b-10) | | Cu | t-Bu | t-Bu |
| (b-11) | | VO | t-Bu | t-Bu |
| (b-12) | | VO | —C(CF$_3$)$_3$ | —C(CF$_3$)$_3$ |
| (b-13) | | Cu | —O(CF$_2$)$_4$CF$_3$ | —O(CF$_2$)$_4$CF$_3$ |
| (b-14) | | Ni | —O—C$_6$H$_4$—C(C$_6$H$_5$)$_2$— | —O—C$_6$H$_4$—C(C$_6$H$_5$)$_2$— |
| (b-15) | | Cu | —O—C$_6$H$_4$—C(C$_6$H$_5$)$_2$— | —O—C$_6$H$_4$—C(C$_6$H$_5$)$_2$— |

TABLE 4-continued
| | | | |
|---|---|---|---|
| (b-16) | Cu | 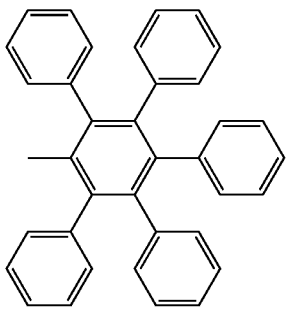 [SMILES: Cc1c(-c2ccccc2)c(-c2ccccc2)c(-c2ccccc2)c(-c2ccccc2)c1-c1ccccc1] | 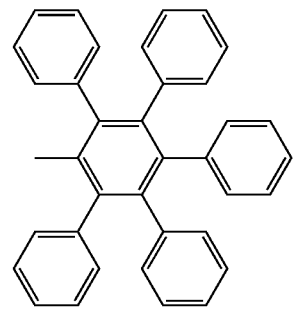 [SMILES: Cc1c(-c2ccccc2)c(-c2ccccc2)c(-c2ccccc2)c(-c2ccccc2)c1-c1ccccc1] |
| (b-17) | VO | 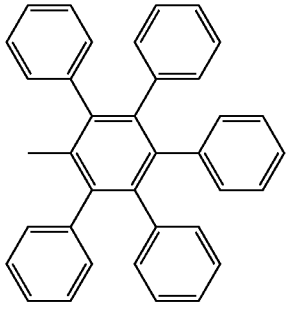 [SMILES: Cc1c(-c2ccccc2)c(-c2ccccc2)c(-c2ccccc2)c(-c2ccccc2)c1-c1ccccc1] | 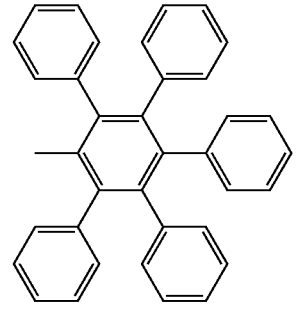 [SMILES: Cc1c(-c2ccccc2)c(-c2ccccc2)c(-c2ccccc2)c(-c2ccccc2)c1-c1ccccc1] |
| (b-18) | Ni | 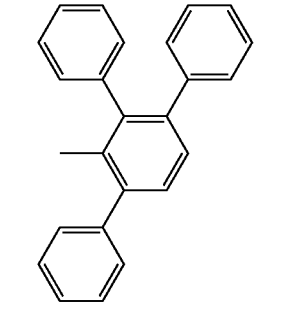 [SMILES: Cc1c(-c2ccccc2)ccc(-c2ccccc2)c1-c1ccccc1] | 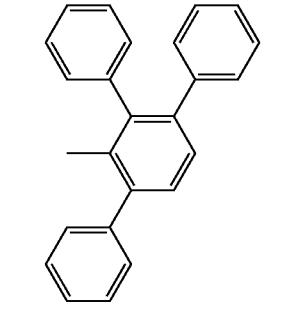 [SMILES: Cc1c(-c2ccccc2)ccc(-c2ccccc2)c1-c1ccccc1] |
| (b-19) | Cu | F | 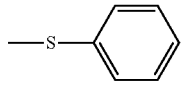 |
| (b-20) | VO | t-Bu | —O(CH$_2$)$_2$CH$_3$ |
| (b-21) | VO | t-Bu | —O(CH$_2$)$_2$CH$_3$ |
| (b-22) | Co | —C(CF$_3$)$_3$ | —S(CH$_2$)$_3$CH$_3$ |
| | Substituent | |
|---|---|---|
| Compound | R$_{a3}$ | R$_{a4}$ |
| (b-1) | —O(CH$_2$)$_2$CH$_3$ | —O(CH$_2$)$_2$CH$_3$ |
| (b-2) | —O(CH$_2$)$_2$CH$_3$ | —O(CH$_2$)$_2$CH$_3$ |
| (b-3) | —O(CH$_2$)$_2$CH$_3$ | —O(CH$_2$)$_2$CH$_3$ |
| (b-4) | 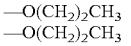 | 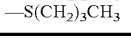 |
| (b-5) |  | 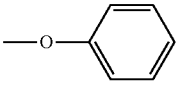 |
| (b-5) | 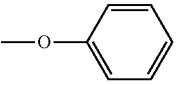 | 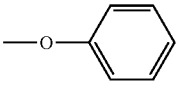 |
| (b-6) | —S(CH$_2$)$_3$CH$_3$ | —S(CH$_2$)$_3$CH$_3$ |
| (b-7) | —NH$_2$ | —NH$_2$ |

TABLE 4-continued

| | | |
|---|---|---|
| (b-8) | —NH(CH$_2$)$_3$CH$_3$ | —NH(CH$_2$)$_3$CH$_3$ |
| (b-9) | —OH | —OH |
| (b-10) | t-Bu | t-Bu |
| (b-11) | t-Bu | t-Bu |
| (b-12) | —C(CF$_3$)$_3$ | —C(CF$_3$)$_3$ |
| (b-13) | —O(CF$_2$)$_4$CF$_3$ | —O(CF$_2$)$_4$CF$_3$ |
| (b-14) | ![structure] | ![structure] |
| (b-15) | ![structure] | ![structure] |
| (b-16) | ![structure] | ![structure] |
| (b-17) | ![structure] | ![structure] |
| (b-18) | ![structure] | ![structure] |
| (b-19) | F | —S—C$_6$H$_5$ |
| (b-20) | —O(CH$_2$)$_2$CH$_3$ | —O(CH$_2$)$_2$CH$_3$ |
| (b-21) | t-Bu | —O(CH$_2$)$_2$CH$_3$ |
| (b-22) | —S(CH$_2$)$_3$CH$_3$ | —S(CH$_2$)$_3$CH$_3$ |

TABLE 5

| Compound | Basic skeleton | M | $R_{a1}$ | $R_{a2}$ | $R_{a3}$ | $R_{a4}$ |
| --- | --- | --- | --- | --- | --- | --- |
| (b-23) | (III-B) | Co | —NO$_2$ | —NO$_2$ | —NO$_2$ | —NO$_2$ |
| (b-24) | | Cu | —O(CH$_2$)$_3$CH$_3$ | —O(CH$_2$)$_3$CH$_3$ | —O(CH$_2$)$_3$CH$_3$ | —O(CH$_2$)$_3$CH$_3$ |
| (b-25) | | VO | Me | Me | Me | Me |
| (b-26) | | Cu | —O—Ph | —O—Ph | —O—Ph | —O—Ph |
| (b-27) | | VO | —OH | —OH | —OH | —OH |
| (b-28) | | Ni | F | F | F | F |
| (b-29) | | Cu | Cl | Cl | Cl | Cl |
| (b-30) | | VO | t-Bu | —OH | t-Bu | —OH |

TABLE 6

| Compound | Basic skeleton | M | $R_a$ | $R_b$ | $R_c$ |
| --- | --- | --- | --- | --- | --- |
| (b-31) | (III-C) | VO | Cl | Cl | — |
| (b-32) | | Cu | F | F | — |
| (b-33) | | Ni | —O(CH$_2$)$_3$CH$_3$ | —O(CH$_2$)$_3$CH$_3$ | — |
| (b-34) | | VO | —OH | t-Bu | — |
| (b-35) | (III-D) | Co | —OH | —OH | — |
| (b-36) | | Ni | Et | F | — |
| (b-37) | | Cu | —O(CH$_2$)$_2$CH$_3$ | —O(CH$_2$)$_2$CH$_3$ | — |
| (b-38) | | Cu | —(CH$_2$)$_5$CH$_3$ | —(CH$_2$)$_5$CH$_3$ | — |
| (b-39) | | VO | —(CH$_2$)$_5$CH$_3$ | —(CH$_2$)$_5$CH$_3$ | — |
| (b-40) | | VO | t-Bu | t-Bu | — |
| (b-41) | (III-E) | VO | Me | Me | t-Bu |
| (b-42) | | Cu | F | F | Et |
| (b-43) | | Co | —NO$_2$ | n-Pr | n-Pr |
| (b-44) | | Ni | —OH | F | —O(CH$_2$)$_4$CH$_3$ |
| (b-45) | (III-F) | VO | —O(CH$_2$)$_3$CH$_3$ | Me | —O(CH$_2$)$_3$CH$_3$ |
| (b-46) | | VO | F | t-Bu | F |
| (b-47) | | Cu | Et | —NH$_2$ | Et |
| (b-48) | | Cu | Me | t-Bu | Me |
| (b-49) | | VO | Me | t-Bu | Me |
| (b-50) | | VO | Et | t-Bu | Et |
| (b-51) | | Co | Cl | —O—Ph | Cl |

TABLE 7

| Compound | Basic skeleton | M | $R_a$ | $R_b$ | $R_c$ | $R_d$ |
| --- | --- | --- | --- | --- | --- | --- |
| (b-52) | (III-G) | VO | F | F | F | F |
| (b-53) | | Cu | Cl | —O(CH$_2$)$_3$CH$_3$ | —O(CH$_2$)$_3$CH$_3$ | Cl |
| (b-54) | | VO | F | t-Bu | F | F |
| (b-55) | | Ni | —OH | n-Pr | n-Pr | —OH |
| (b-56) | (III-H) | Cu | —Ph | —Ph | Me | — |
| (b-57) | | Cu | —C$_6$H$_4$—Me | —C$_6$H$_4$—Me | Me | — |
| (b-58) | | VO | —C$_6$H$_4$—n-Bu | —C$_6$H$_4$—Me | Me | — |

TABLE 7-continued

| Compound | Basic skeleton | M | Substituent | | | |
|---|---|---|---|---|---|---|
| | | | $R_a$ | $R_b$ | $R_c$ | $R_d$ |
| (b-59) | (III-J) | VO | F | t-Bu | t-Bu | F |
| (b-60) | | Cu | Me | Et | Et | Me |
| (b-61) | | Cu | —OH | F | —O(CH$_2$)$_3$CH$_3$ | —OH |

It is enough to synthesize the compound (III) by a process generally known, and for example, the compound can be synthesized referring to the processes described in Japanese Patent No. 4081149 and "Phthalocyanine—Chemistry and Functions—" (Industrial Publishing & Consulting, Inc., 1997).

<<Cyanine Compound>>

The cyanine compound is preferably any one of compounds represented by the following formulas (IV-1) to (IV-3) (also referred to as "compounds (IV-1) to (IV-3)" hereinafter).

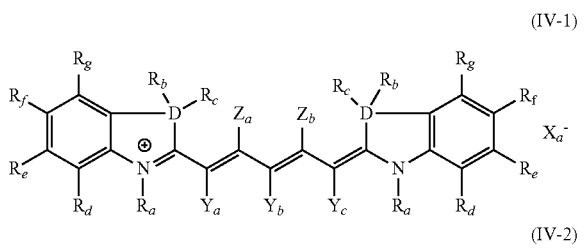
(IV-1)

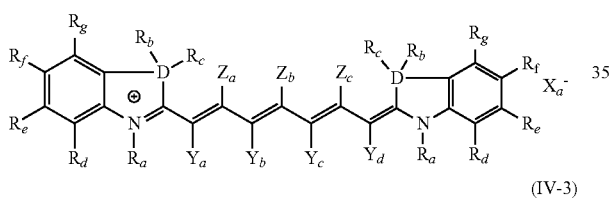
(IV-2)

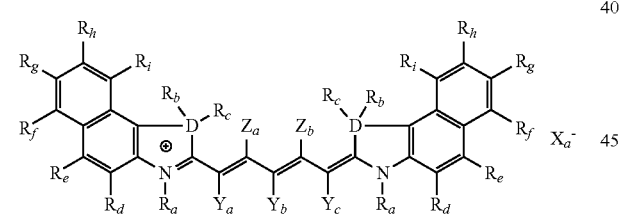
(IV-3)

In the formulas (IV-1) to (IV-3), $X_a^-$ is a monovalent anion, plural D are each independently a carbon atom, a nitrogen atom, an oxygen atom, or a sulfur atom, plural $R_a$, $R_b$, $R_c$, $R_d$, $R_e$, $R_f$, $R_g$, $R_h$ and $R_i$ are each independently a hydrogen atom, a halogen atom, a hydroxyl group, a carboxyl group, a nitro group, an amino group, an amide group, an imide group, a cyano group, a silyl group, -$L^1$, —S-$L^2$, —SS-$L^2$, —SO$_2$-$L^3$ or —N=N-$L^4$, or at least one combination of $R_b$ and $R_c$, $R_d$ and $R_e$, $R_e$ and $R_f$, $R_f$ the $R_g$, $R_g$ and $R_h$, and $R_h$ and $R_i$ is bonded to form at least one group selected from the group consisting of groups represented by the following formulas (A) to (H), the amino group, the amide group, the imide group and the silyl group may have a substituent L defined in the aforesaid formula (I), $L^1$ has the same meaning as that of $L^1$ defined in the formula (I), $L^2$ is a hydrogen atom or any one of $L^a$ to $L^e$ defined in the formula (I), $L^3$ is a hydrogen atom or any one of the above $L^a$ to $L^e$, $L^4$ is any one of the above $L^a$ to $L^e$, and $Z_a$ to $Z_c$ and $Y_a$ to $Y_d$ are each independently a hydrogen atom, a halogen atom, a hydroxyl group, a carboxyl group, a nitro group, an amino group, an amide group, an imide group, a cyano group, a silyl group, -$L^1$, —S-$L^2$, —SS-$L^2$, —SO$_2$-$L^3$ or —N=N-$L^4$ ($L^1$ to $L^4$ have the same meanings as those of $L^1$ to $L^4$ in the above $R_a$ to $R_i$), or neighboring two Z or neighboring two Y are bonded to each other to form an aromatic hydrocarbon group of 6 to 14 carbon atoms; or neighboring two Z or neighboring two Y are bonded to each other to form an alicyclic hydrocarbon group of 5- to 6-membered ring, which may contain at least one of a nitrogen atom, an oxygen atom and a sulfur atom; or neighboring two Z or neighboring two Y are bonded to each other to form a heteroaromatic hydrocarbon group of 3 to 14 carbon atoms, which contains at least one of a nitrogen atom, an oxygen atom and a sulfur atom, and these aromatic hydrocarbon group, alicyclic hydrocarbon group and heteroaromatic hydrocarbon group may have an aliphatic hydrocarbon group of 1 to 9 carbon atoms or a halogen atom.

(A)

(B)

(C)

(D)

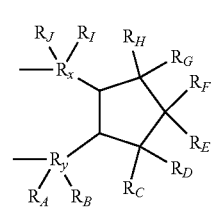

-continued (E)
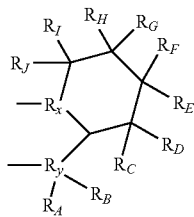

(F)
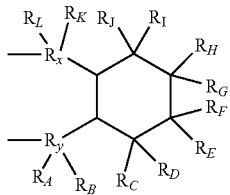

(G)
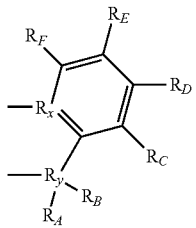

(H)
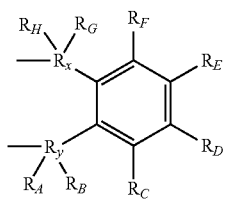

In the formulas (A) to (H), $R_x$ and $R_y$ are each a carbon atom, and plural $R_A$ to $R_L$ are each independently a hydrogen atom, a halogen atom, a hydroxyl group, a carboxyl group, a nitro group, an amino group, an amide group, an imide group, a cyano group, a silyl group, -$L^1$, —S-$L^2$, —SS-$L^2$, —$SO_2$-$L^3$ or —N=N-$L^4$ ($L^1$ to $L^4$ have the same meanings as those of $L^1$ to $L^4$ defined in the formulas (IV-1) to (IV-3)), and the amino group, the amide group, the imide group and the silyl group may have the substituent L.

Examples of the aromatic hydrocarbon groups of 6 to 14 carbon atoms, which are formed by bonding of Z and Z or Y and Y to each other, in the above $Z_a$ to $Z_c$ and $Y_a$ to $Y_d$, include the groups given as examples of the aromatic hydrocarbon groups in the aforesaid substituent L.

Examples of the alicyclic hydrocarbon group of 5- to 6-membered ring, which may contain at least one of a nitrogen atom, an oxygen atom and a sulfur atom and which are formed by bonding of Z and Z or Y and Y to each other, in the above $Z_a$ to $Z_c$ and $Y_a$ to $Y_d$, include the groups given as examples of the alicyclic hydrocarbon groups and heterocyclic groups in the aforesaid substituent L (except the heteroaromatic hydrocarbon groups).

Examples of the heteroaromatic hydrocarbon groups of 3 to 14 carbon atoms, which are formed by bonding of Z and Z or Y and Y to each other, in the above $Z_a$ to $Z_c$ and $Y_a$ to $Y_d$, include the groups given as examples of the heterocyclic groups in the aforesaid substituent L (except the alicyclic hydrocarbon groups containing at least one of a nitrogen atom, an oxygen atom and a sulfur atom).

Examples of —S-$L^2$, —SS-$L^2$, —$SO_2$-$L^3$, —N=N-$L^4$, and the amino group, the amide group, the imide group and the silyl group which may have the substituent L in the above (IV-1) to (IV-3) include the same groups as those given as examples in the aforesaid formula (III).

$X_a^-$ is not specifically restricted provided that it is a monovalent anion, and $I^-$, $Br^-$, $PF_6^-$, $N(SO_2CF_3)_2^-$, $B(C_6F_5)_4^-$, a nickel dithiolate complex, a copper dithiolate complex or the like can be mentioned.

Specific examples of the compounds (IV-1) to (IV-3) include (c-1) to (c-24) described in the following Table 8.

TABLE 8

| Compound | Basic skeleton | D | $R_a$ | $R_b$ | $R_c$ | $R_d$ | $R_e$ | $R_f$ | $R_g$ | $R_h$ | $R_i$ | $Y_a$ | $Y_b$ | $Y_c$ | $Y_d$ |
|---|---|---|---|---|---|---|---|---|---|---|---|---|---|---|---|
| (c-1) | (IV-1) | C | n-Bu | Me | Me | H | H | H | H | — | — | H | H | H | — |
| (c-2) | | C | n-Bu | Me | Me | H | H | H | H | — | — | H | Cl | H | — |
| (c-3) | | S | Et | — | — | H | H | H | H | — | — | H | H | H | — |
| (c-4) | | C | n-Bu | Me | Me | H | H | H | H | — | — | H | H | H | — |
| (c-5) | | C | —(CH$_2$)$_3$CH$_3$ | Me | Me | H | H | H | H | — | — | H | Cl | H | — |
| (c-6) | (IV-2) | C | n-Bu | Me | Me | H | H | H | H | — | — | H | H | H | H |
| (c-7) | | S | Et | — | — | H | H | H | H | — | — | H | H | H | H |
| (c-8) | | C | n-Bu | Me | Me | H | H | H | H | — | — | H | trimethylene | H |
| (c-9) | | S | Et | — | — | H | H | H | H | — | — | H | H | H | H |
| (c-10) | | C | n-Bu | Me | Me | H | H | H | H | — | — | H | ethylene | H |
| (c-11) | | C | n-Bu | Me | Me | H | H | H | H | — | — | H | ethylene | H |
| (c-12) | | C | MeOEt | Me | Me | H | H | Cl | H | — | — | H | trimethylene | H |
| (c-13) | | C | MeOEt | Me | Me | H | H | Cl | H | — | — | H | H | H | H |
| (c-14) | | C | MeOEt | Me | Me | H | H | H | H | — | — | H | trimethylene | H |
| (c-15) | | S | n-Bu | — | — | H | H | H | H | — | — | H | trimethylene | H |
| (c-16) | | C | Et | Me | Me | H | H | H | H | — | — | H | trimethylene | H |
| (c-17) | | C | n-Bu | Me | Me | H | H | H | H | — | — | H | ethylene | H |
| (c-18) | | C | n-Bu | Me | Me | H | H | H | H | — | — | H | ethylene | H |
| (c-19) | (IV-3) | C | 3-methyl-butyl | Me | Me | H | H | H | H | H | H | H | H | H | — |
| (c-20) | | C | 3-methyl-butyl | Me | Me | H | H | H | H | H | H | H | Cl | H | — |
| (c-21) | | C | MeOEt | Me | Me | H | H | H | H | H | H | H | H | H | — |
| (c-22) | | C | 3-methyl-butyl | Me | Me | H | H | H | H | H | H | H | H | H | — |
| (c-23) | | C | 3-methyl-butyl | Me | Me | H | H | H | H | H | H | H | Ph | H | — |
| (c-24) | | C | n-Bu | Me | Me | H | H | H | H | H | H | H | Ph | H | — |

TABLE 8-continued

| Compound | Substituent $Z_a$ | $Z_b$ | $Z_c$ | $X_a^-$ |
|---|---|---|---|---|
| (c-1) | H | H | — | $PF_6^-$ |
| (c-2) | H | H | — | $PF_6^-$ |
| (c-3) | H | H | — | $I^-$ |
| (c-4) | H | H | — | $B(C_6F_5)_4^-$ |
| (c-5) | H | H | — | (structure shown) |
| (c-6) | H | H | H | $PF_6^-$ |
| (c-7) | H | H | H | $I^-$ |
| (c-8) | H | H | H | $PF_6^-$ |
| (c-9) | trimethylene | | H | $I^-$ |
| (c-10) | H | Ph | H | $PF_6^-$ |
| (c-11) | H | diphenylamino | H | $PF_6^-$ |
| (c-12) | H | Cl | H | $N(SO_2CF_3)_2^-$ |
| (c-13) | H | H | H | $N(SO_2CF_3)_2^-$ |
| (c-14) | H | Cl | H | $N(SO_2CF_3)_2^-$ |
| (c-15) | H | Cl | H | $N(SO_2CF_3)_2^-$ |
| (c-16) | H | Cl | H | $I^-$ |
| (c-17) | H | diphenylamino | H | $B(C_6F_5)_4^-$ |
| (c-18) | H | diphenylamino | H | (structure shown) |
| (c-19) | H | H | — | $PF_6^-$ |
| (c-20) | H | H | — | $PF_6^-$ |
| (c-21) | H | H | — | $N(SO_2CF_3)_2^-$ |
| (c-22) | trimethylene | | — | $PF_6^-$ |
| (c-23) | ethylene | | — | $PF_6^-$ |
| (c-24) | ethylene | | — | (structure shown) |

It is enough to synthesize the compounds (IV-1) to (IV-3) by processes generally known, and for example, the compounds can be synthesized by the process described in JP-A-2009-108267.

<<Compound (S)>>

The absorption maximum wavelength of the compound (S) is preferably 755 to 845 nm, more preferably 760 to 840 nm, particularly preferably 765 to 835 nm. When the absorption maximum wavelength of the compound (S) is in such a range, unnecessary near-infrared rays in the vicinity of the near-infrared ray selective passband can be selectively and efficiently cut.

The compound (S) is preferably a squarylium compound represented by the following formula (S1) (also referred to as a "compound (S1)" hereinafter).

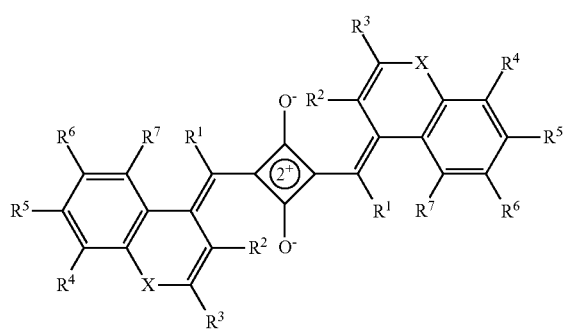

(S1)

In the formula (S1), each X is independently an oxygen atom, a sulfur atom, a selenium atom or —NH—, and $R^1$ to $R^7$ are each independently a hydrogen atom, a halogen atom, a sulfo group, a hydroxyl group, a cyano group, a nitro group, a carboxyl group, a phosphoric acid group, -$L^1$ or a —$NR^gR^h$ group. $R^g$ and $R^h$ are each independently a hydrogen atom, -$L^a$, -$L^b$, -$L^c$, -$L^d$, -$L^e$ or a —$C(O)R^i$ group ($R^i$ represents -$L^a$, -$L^b$, -$L^c$, -$L^d$ or -$L^e$).

$L^1$ is $L^a$, $L^b$, $L^c$, $L^d$, $L^e$, $L^f$, $L^g$ or $L^h$.

$L^a$ to $L^h$ have the same meanings as those of $L^a$ to $L^h$ defined in the aforesaid formula (I).

The $R^1$ is preferably a hydrogen atom, a chlorine atom, a fluorine atom, a methyl group, an ethyl group, a n-propyl group, an isopropyl group, a n-butyl group, a sec-butyl group, a tert-butyl group, a cyclohexyl group, a phenyl group, a hydroxyl group, an amino group, a dimethylamino group, or a nitro group, and is more preferably a hydrogen atom, a chlorine atom, a fluorine atom, a methyl group, an ethyl group, a n-propyl group, an isopropyl group, or a hydroxyl group.

The $R^2$ to $R^7$ are each independently preferably a hydrogen atom, a chlorine atom, a fluorine atom, a methyl group, an ethyl group, a n-propyl group, an isopropyl group, a n-butyl group, a sec-butyl group, a tert-butyl group, a cyclohexyl group, a phenyl group, a hydroxyl group, an amino group, a dimethylamino group, a cyano group, a nitro group, an acetylamino group, a propionylamino group, a N-methylacetylamino group, a trifluoromethanoylamino group, a pentafluoroethanoylamino group, a t-butanoylamino group, or a cyclohexynoylamino group, and are more preferably a hydrogen atom, a chlorine atom, a fluorine atom, a methyl group, an ethyl group, a n-propyl group, an isopropyl group, a tert-butyl group, a hydroxyl group, a dimethylamino group, a nitro group, an acetylamino group, a propionylamino group, a trifluoromethanoylamino group, a pentafluoroethanoylamino group, a t-butanoylamino group, or a cyclohexynoylamino group.

The above X is preferably an oxygen atom or a sulfur atom, and is particularly preferably an oxygen atom.

A structure of the compound (S1) can be represented also by such descriptive means as have resonance structures, such as the following formula (S1-2), in addition to the descriptive means such as the following formula (S1-1). That is to say, a difference between the following formula (S1-1) and the following formula (S1-2) is only descriptive means for the structures, and both of them represent the same compound. In the embodiment of the present invention, the structures of the squarylium compounds are represented by descriptive means such as the following formula (S1-1) unless otherwise noted.

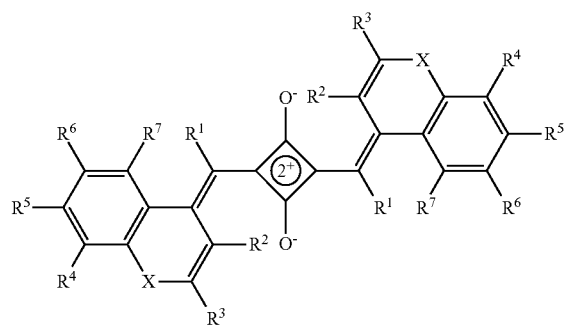

(S1-1)

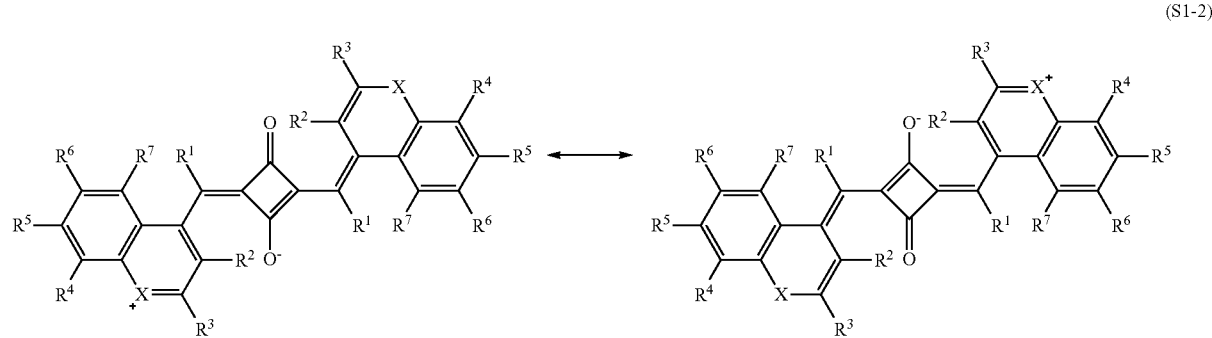

(S1-2)

Further, for example, a compound represented by the following formula (S1-3) and a compound represented by the following formula (S1-4) can be regarded as identical with each other.

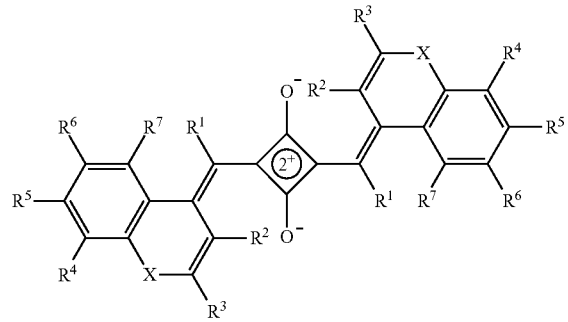
(S1-3)

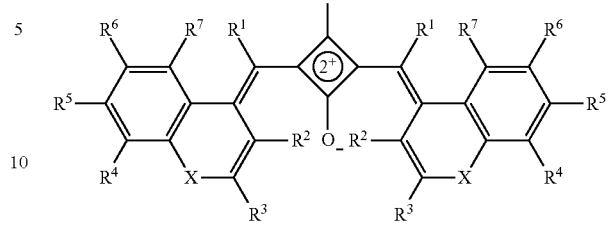
(S1-4)

The structure of the compound (S1) is not specifically restricted provided that it satisfies the requirements of the aforesaid formula (S1). For example, when the structure is represented by the aforesaid formula (S1-1), the substituents which are bonded to the central 4-membered ring and are on the right-hand side and the left-hand side thereof may be the same or different, but they are preferably the same as each other because of ease of synthesis.

Specific examples of the compounds (S1) include the compounds (s-1) to (s-20) described in the following Table 9.

TABLE 9

| Compound | X | $R^1$ | $R^2$ | $R^3$ | $R^4$ | $R^5$ | $R^6$ | $R^7$ |
|---|---|---|---|---|---|---|---|---|
| (s-1) | O | H | H | H | H | H | H | H |
| (s-2) | S | H | H | Me | H | H | H | H |
| (s-3) | Se | H | H | Me | H | H | H | H |
| (s-4) | —NH— | Me | H | H | H | H | H | H |
| (s-5) | O | H | H | t-Bu | H | H | H | H |
| (s-6) | O | Me | H | Me | H | H | H | H |
| (s-7) | S | H | H | t-Bu | H | Me | H | H |
| (s-8) | O | H | H | t-Bu | H | H | Me | H |
| (s-9) | Se | H | Me | i-Pr | H | H | cyclohexyl | H |
| (s-10) | S | Me | Me | Me | H | H | H | Me |
| (s-11) | O | H | H | t-Bu | H | H | i-Pr | H |
| (s-12) | O | H | H | cyclohexyl | H | Me | H | Me |
| (s-13) | —NH— | H | H | t-Bu | H | morpholino | H | H |
| (s-14) | O | H | H | t-Bu | H | morpholino | H | H |
| (s-15) | O | H | H | t-Bu | H | Me | Me | H |
| (s-16) | S | Et | H | Et | Me | —N(CH$_2$CH$_3$) | H | H |
| (s-17) | O | H | H | i-Pr | H | H | —C(O)CF$_3$ | H |
| (s-18) | O | H | H | t-Bu | Me | H | Me | H |
| (s-19) | O | Me | H | Me | H | —C(O)Me | H | H |

TABLE 9-continued

| Compound | X | R$^1$ | R$^2$ | R$^3$ | R$^4$ | R$^5$ | R$^6$ | R$^7$ |
|---|---|---|---|---|---|---|---|---|
| (s-20) | S | H | H | t-Bu | 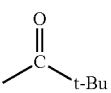 | H | H | H |

It is enough to synthesize the compound (S) by a process generally known, and for example, the compound (S) can be synthesized referring to the processes described in JP-A-H1-228960, JP-A-2001-40234, Japanese Patent No. 3094037, Japanese Patent No. 3196383, etc.

<Other Coloring Matter (X)>

In the base material (i), other coloring matter (X) that does not correspond to the compound (Z) may be further contained.

The other coloring matter (X) is not specifically restricted provided that it has an absorption maximum wavelength of less than 600 nm or more than 850 nm, and for example, at least one compound selected from the group consisting of a squarylium compound, a phthalocyanine compound, a cyanine compound, a naphthalocyanine compound, a croconium compound, a porphyrin compound and a metal dithiolate compound can be mentioned. By using the compound (Z) and other coloring matter (X) in combination, the incident angle dependence can be reduced in not only the visible wavelength region but also on the long wavelength side of the near-infrared passband, and good infrared sensing performance can be attained, depending upon the absorption properties of the compound (Z) and the intended near-infrared transmission wavelength.

In the case where, for example, a base material formed of a transparent resin substrate (ii) containing other coloring matter (X) or a base material in which a resin layer such as an overcoat layer formed from a curable resin, etc. is laminated on a transparent resin substrate (ii) containing other coloring matter (X) is used as the base material (i), the content of the other coloring matter (X) is preferably 0.01 to 1.5 parts by weight, more preferably 0.02 to 1.0 part by weight, particularly preferably 0.03 to 0.7 part by weight, based on 100 parts by weight of the transparent resin. When a base material in which a transparent resin layer such as an overcoat layer formed from other coloring matter (X), a curable resin and so on is laminated on a glass support or a resin support that becomes a base is used as the base material (i), the content of the other coloring matter (X) is preferably 0.1 to 4.0 parts by weight, more preferably 0.2 to 3.0 parts by weight, particularly preferably 0.3 to 2.0 parts by weight, based on 100 parts by weight of the resin that forms the transparent resin layer containing the other coloring matter (X).

When the content of the other coloring matter (X) is in the above range, good near-infrared absorption properties and high visible light transmittance are compatible with each other.

<Transparent Resin>

The transparent resin layer laminated on a resin support or a glass support and the transparent resin substrate (ii) can be formed using a transparent resin.

The transparent resins may be used singly or two or more kinds for the base material (i).

The transparent resin is not specifically restricted as long as it does not impair the effect of the present invention. However, in order to form a base material which ensures thermal stability and moldability into a film and on which a dielectric multilayer film can be formed through high-temperature deposition that is carried out at a deposition temperature of not lower than 100° C., there can be mentioned a resin preferably having a glass transition temperature (Tg) of 110 to 380° C., more preferably 10 to 370° C., still more preferably 120 to 360° C. Further, when the glass transition temperature of the resin is not lower than 140° C., a film (transparent resin layer or the transparent resin substrate (ii)) on which a dielectric multilayer film can be formed by deposition at a higher temperature is obtained, so that such a resin is particularly preferable.

Tg can be measured specifically by a method described in the working examples described later.

As the transparent resin, a resin such that when a resin support having a thickness of 0.1 mm is formed from the resin, the total light transmittance (JIS K7375) of the resin support preferably becomes not less than 75%, more preferably not less than 78%, particularly preferably not less than 80%, can be used. When a resin having the total light transmittance in such a range is used, the resulting base material (i) exhibits good transparency as an optical film.

When a solvent-soluble resin is used as the transparent resin, the weight-average molecular weight (Mw) of the transparent resin, as measured by gel permeation chromatography (GPC), is usually 15,000 to 350,000, preferably 30,000 to 250,000, in terms of polystyrene, and the number-average molecular weight (Mn) thereof is usually 10,000 to 150,000, preferably 20,000 to 100,000, in terms of polystyrene.

Mw and Mn can be measured specifically by a method described in the working examples described later.

Examples of the transparent resins include cyclic (poly) olefin resins, aromatic polyether resins, polyimide resins, fluorene polycarbonate resins, fluorene polyester resins, polycarbonate resins, polyamide (aramid) resins, polyarylate resins, polysulfone resins, polyether sulfone resins, polyparaphenylene resins, polyamidoimide resins, polyethylene naphthalate (PEN) resins, fluorinated aromatic polymer resins, (modified) acrylic resins, epoxy resins, allyl ester curable resins, silsesquioxane ultraviolet curable resins, acrylic ultraviolet curable resins and vinyl ultraviolet curable resins.

<<Cyclic (Poly)Olefin Resin>>

The cyclic (poly)olefin resin is preferably a resin obtained from at least one monomer selected from the group consisting of a monomer represented by the following formula ($X_0$) and a monomer represented by the following formula ($Y_0$), or a resin obtained by hydrogenating the resin thus obtained.

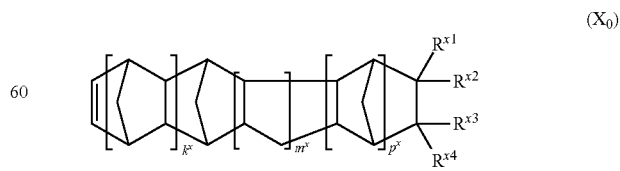

($X_0$)

In the formula ($X_0$), $R^{x1}$ to $R^{x4}$ are each independently an atom or a group selected from the following (i') to (ix'), and $k^x$, $m^x$ and $p^x$ are each independently 0 or a positive integer.

(i') a hydrogen atom (ii') a halogen atom (iii') a trialkylsilyl group (iv') a substituted or unsubstituted hydrocarbon group of 1 to 30 carbon atoms, which has a linking group containing an oxygen atom, a sulfur atom, a nitrogen atom or a silicon atom (v') a substituted or unsubstituted hydrocarbon group of 1 to 30 carbon atoms (vi') a polar group (except (iv'))

(vii') an alkylidene group formed by bonding of $R^{x1}$ and $R^{x2}$ or $R^{x3}$ and $R^{x4}$ to each other ($R^{x1}$ to $R^{x4}$ which do not take part in the bonding are each independently an atom or a group selected from the above (i') to (vi').)

(viii') a monocyclic or polycyclic hydrocarbon ring or heterocyclic ring formed by bonding of $R^{x1}$ and $R^{x2}$ or $R^{x3}$ and $R^{x4}$ to each other ($R^{x1}$ to $R^{x4}$ which do not take part in the bonding are each independently an atom or a group selected from the above (i') to (vi').)

(ix') a monocyclic hydrocarbon ring or heterocyclic ring formed by bonding of $R^{x2}$ and $R^{x3}$ to each other ($R^{x1}$ to $R^{x4}$ which do not take part in the bonding are each independently an atom or a group selected from the above (i') to (vi').)

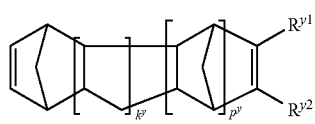

(Y₀)

In the formula (Y₀), $R^{y1}$ and $R^{y2}$ are each independently an atom or a group selected from the aforesaid (i') to (vi') or represent a monocyclic or polycyclic alicyclic hydrocarbon, aromatic hydrocarbon or heterocyclic ring, which is formed by bonding of $R^{y1}$ and $R^{y2}$ to each other, and $k^y$ and $p^y$ are each independently 0 or a positive integer.

<<Aromatic Polyether Resin>>

The aromatic polyether resin preferably has at least one structural unit selected from the group consisting of a structural unit represented by the following formula (1) and a structural unit represented by the following formula (2).

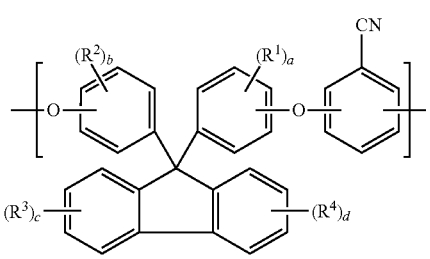

(1)

In the formula (1), $R^1$ to $R^4$ are each independently a monovalent organic group of 1 to 12 carbon atoms, and "a" to "d" are each independently an integer of 0 to 4.

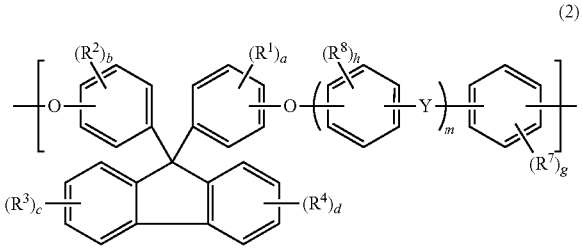

(2)

In the formula (2), $R^1$ to $R^4$ and "a" to "d" have the same meanings as those of $R^1$ to $R^4$ and "a" to "d" in the formula (1), respectively, Y is a single bond, —SO₂— or >C=O, $R^7$ and $R^8$ are each independently a halogen atom, a monovalent organic group of 1 to 12 carbon atoms or a nitro group, "g" and "h" are each independently an integer of 0 to 4, and "m" is 0 or 1, but when "m" is 0, $R^7$ is not a cyano group.

Further, the aromatic polyether resin preferably has at least one structural unit selected from the group consisting of a structural unit represented by the following formula (3) and a structural unit represented by the following formula (4).

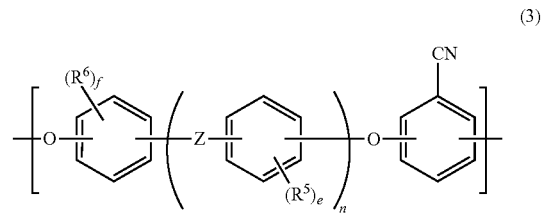

(3)

In the formula (3), $R^5$ to $R^6$ are each independently a monovalent organic group of 1 to 12 carbon atoms, Z is a single bond, —O—, —S—, —SO₂—, >C=O, —CONH—, —COO— or a divalent organic group of 1 to 12 carbon atoms, "e" and "f" are each independently an integer of 0 to 4, and "n" is 0 or 1.

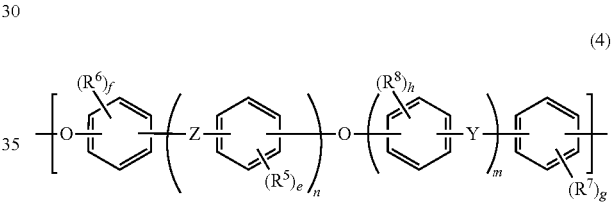

(4)

In the formula (4), $R^7$, $R^8$, Y, "m", "g" and "h" have the same meanings as those of $R^7$, $R^8$, Y, "m", "g" and "h" in the formula (2), respectively, and $R^5$, $R^6$, Z, "n", "e" and "f" have the same meanings as those of $R^5$, $R^6$, Z, "n", "e" and "f" in the formula (3), respectively.

<<Polyimide Resin>>

The polyimide resin is not specifically restricted provided that it is a high-molecular compound containing an imide linkage in a repeating unit, and it can be synthesized by a process described in, for example, JP-A-2006-199945 or JP-A-2008-163107.

<<Fluorene Polycarbonate Resin>>

The fluorene polycarbonate resin is not specifically restricted provided that it is a polycarbonate resin containing a fluorene moiety, and it can be synthesized by a process described in, for example, JP-A-2008-163194.

<<Fluorene Polyester Resin>>

The fluorene polyester resin is not specifically restricted provided that it is a polyester resin containing a fluorene moiety, and it can be synthesized by a process described in, for example, JP-A-2010-285505 or JP-A-2011-197450.

<<Fluorinated Aromatic Polymer Resin>>

The fluorinated aromatic polymer resin is not specifically restricted, but it is preferably a polymer containing an aromatic ring having at least one fluorine atom and a repeating unit containing at least one linkage selected from the group consisting of an ether linkage, a ketone linkage, a sulfone linkage, am amide linkage, an imide linkage and an ester linkage, and it can be synthesized by a process described in, for example, JP-A-2008-181121.

<Acrylic Ultraviolet Curing Resin>>

The acrylic ultraviolet curing resin is not specifically restricted, but there can be mentioned a resin synthesized from a resin composition containing a compound having one or more acrylic groups or methacrylic groups in a molecule and a compound that is decomposed by ultraviolet rays to generate an active radical. When a base material in which a transparent resin layer containing the compound (Z) and a curable resin is laminated on a glass support or a resin support that becomes a base or a base material in which a resin layer such as an overcoat layer formed from a curable resin, etc. is laminated on the transparent resin substrate (ii) containing the compound (Z) is used as the base material (i), the acrylic ultraviolet curing resin is particularly preferably used as the curable resin.

<<Commercial Products>>

As commercial products of the transparent resins, the following commercial products, etc. can be mentioned. Examples of commercial products of the cyclic (poly)olefin resins include Arton available from JSR Corporation, ZEONOR available from Zeon Corporation, APEL available from Mitsui Chemicals, Inc. and TOPAS available from Polyplastics Co., Ltd. Examples of commercial products of the polyether sulfone resins include Sumika Excel PES available from Sumitomo Chemical Co., Ltd. Examples of commercial products of the polyimide resins include Neoprim L available from Mitsubishi Gas Chemical Company Inc. Examples of commercial products of the polycarbonate resins include PURE-ACE available from Teijin Ltd. Examples of commercial products of the fluorene polycarbonate resins include Yupizeta EP-5000 available from Mitsubishi Gas Chemical Company Inc. Examples of commercial products of the fluorene polyester resins include OKP4HT available from Osaka Gas Chemicals Co., Ltd. Examples of commercial products of the acrylic resins include ACRYVIEWA available from Nippon Shokubai Co., Ltd. Examples of commercial products of the silsesquioxane ultraviolet curing resins include Silplus available from Shin-Nittetsu Chemical Co., Ltd.

<Other Components>

The base material (i) may further contain additives, such as antioxidant, near-ultraviolet absorbing agent, fluorescence quencher and metal complex compound, within limits not detrimental to the effect of the present invention. When the base material (i) is produced by the later-described cast molding, production of the base material (i) can be facilitated by adding a leveling agent and an anti-foaming agent. These other components may be used singly or two or more kinds.

Examples of the near-ultraviolet absorbing agents include an azomethine compound, an indole compound, a benzotriazole compound and a triazine compound.

Examples of the antioxidants include 2,6-di-t-butyl-4-methylphenol, 2,2'-dioxy-3,3'-di-t-butyl-5,5'-dimethyldiphenylmethane and tetrakis[methylene-3-(3,5-di-t-butyl-4-hydroxyphenyl)propionate]methane.

These additives may be mixed together with a resin, etc. in the production of base material (i), or they may be added when a resin is synthesized. Although the amount of such an additive is properly selected according to the desired properties, it is usually 0.01 to 5.0 parts by weight, preferably 0.05 to 2.0 parts by weight, based on 100 parts by weight of the resin.

<Production Process for Base Material (i)>

When the base material (i) is a base material including the transparent resin substrate (ii) containing the compound (Z), the transparent resin substrate (ii) can be formed by, for example, melt molding or cast molding, and if necessary, after molding, the molded product is coated with coating agents, such as an antireflection agent, a hard coating agent and/or an antistatic agent, whereby a base material in which an overcoat layer has been laminated on the substrate can be produced.

When the base material (i) is a base material in which a transparent resin layer such as an overcoat layer formed from a curable resin containing the compound (Z), etc. is laminated on a glass support, a resin support that becomes a base or the transparent resin substrate (ii), the base material in which a transparent resin layer is formed on a glass support, a resin support that becomes a base or the transparent resin substrate (ii) can be produced by, for example, subjecting a resin solution containing the compound (Z) to melt molding or cast molding on a glass support, a resin support that becomes a base or the transparent resin substrate (ii), preferably by carrying out coating through a method of spin coating, slit coating, ink jetting or the like, then removing the solvent by drying, and if necessary, further carrying out light irradiation or heating.

<Melt Molding>>

As the melt molding, there can be specifically mentioned a method of melt-molding pellets obtained by melt-kneading a resin, the compound (Z), etc.; a method of melt-molding a resin composition containing a resin and the compound (Z); a method of melt-molding pellets obtained by removing a solvent from a resin composition containing the compound (Z), a resin and a solvent; or the like. Examples of the melt molding methods include injection molding, melt extrusion molding and blow molding.

<<Cast Molding>>

The base material can be also produced by the cast molding, specifically by a method comprising casting a resin composition containing the compound (Z), a resin and a solvent onto an appropriate support and removing the solvent; a method comprising casting a curable composition containing the compound (Z), and a photo-curing resin and/or a thermosetting resin onto an appropriate support, removing the solvent and then curing the composition by an appropriate means such as ultraviolet irradiation or heating; or the like.

When the base material (i) is a base material formed of the transparent resin substrate (ii) containing the compound (Z), the base material (i) can be obtained by performing cast molding and thereafter peeling the coating film from a support. When the base material (i) is a base material in which a transparent resin layer such as an overcoat layer formed from a curable resin containing the compound (Z), etc. is laminated on a support such as a glass support or a resin support that becomes a base or on the transparent resin substrate (ii), the base material (i) can be obtained without peeling the coating film after cast molding.

Examples of the supports include a glass plate, a steel belt, a steel drum and a transparent resin support (e.g., films formed of the aforesaid transparent resins (polyester film, cyclic olefin resin film, etc.)).

Further, the transparent resin layer can be also formed directly on an optical part by a process comprising coating an optical part made of a glass plate, quartz, transparent plastic or the like with the aforesaid resin composition and drying the solvent, a process comprising coating the optical part with the aforesaid curable composition, curing and drying the composition, or the like.

The amount of a residual solvent in the transparent resin layer (transparent resin substrate (ii)) obtained by the above method is preferably as small as possible. Specifically, the amount of the residual solvent is preferably not more than 3% by weight, more preferably not more than 1% by weight, still more preferably not more than 0.5% by weight, based on the weight of the transparent resin layer (transparent resin substrate (ii)). When the amount of the residual solvent is in the above range, a transparent resin layer (transparent resin substrate (ii)) that is rarely deformed or rarely changed in properties and can easily exert a desired function is obtained.

[Dielectric Multilayer Film]

The dielectric multilayer film to constitute the optical filter of the embodiment of the present invention is a film having abilities to cut unnecessary near-infrared rays by means of reflection and to transmit necessary near-infrared rays. In the embodiment of the present invention, the dielectric multilayer film may be provided on one surface of the base material (i), or may be provided on both surfaces thereof. When the dielectric multilayer film is provided on one surface, production cost and ease of production are excellent. When the dielectric multilayer film is provided on both surfaces, an optical filter having high strength and rarely suffering warpage can be obtained.

When the optical filter of the embodiment of the present invention is applied to uses such as a solid-state image sensor, warpage of the optical filter is preferably smaller, and therefore, it is preferable to provide the dielectric multilayer film on both surfaces of the base material (i), and the spectral properties of the dielectric multilayer films provided on both surfaces may be the same or different. When the spectral properties of the dielectric multilayer films provided on both surfaces are the same, transmittances in the light stopbands Za and Zc tend to be able to be efficiently reduced in the near-infrared wavelength region. When spectral properties of the dielectric multilayer films provided on both surfaces are different, it tends to become easy to spread the light stopband Zc to a longer wavelength side.

When the optical filter has dielectric multilayer films different in spectral properties on both surfaces of the base material (i), the mean reflectance in the wavelength region of wavelength Y−10 nm to Y+10 nm, as measured from at least one surface side (surface side having dielectric multilayer film) of the optical filter, preferably as measured from both surfaces (surfaces having dielectric multilayer films), is preferably not more than 20%, more preferably not more than 18%, particularly preferably not more than 15%. When the reflectance of the dielectric multilayer film in the wavelength region of wavelength Y−10 nm to Y+10 nm is in the above range, sensitivity of the resulting optical filter at the desired near-infrared wavelength is enhanced, and excellent near-infrared sensing performance can be attained.

As the dielectric multilayer film, a dielectric multilayer film in which high-refractive index material layers and low-refractive index material layers are alternately laminated can be mentioned. As the material to form the high-refractive index material layers, a material having a refractive index of not less than 1.7 can be used, and a material having a refractive index in the range of 1.7 to 2.5 is usually selected. Such a material is, for example, a material containing titanium oxide, zirconium oxide, tantalum pentoxide, niobium pentoxide, lanthanum oxide, yttrium oxide, zinc oxide, zinc sulfide or indium oxide as a main component and containing titanium oxide, tin oxide and/or cerium oxide in a small amount (e.g., 0 to 10% by weight based on the main component).

As the material to form the low-refractive index material layer, a material having a refractive index of not more than 1.6 can be used, and a material having a refractive index in the range of 1.2 to 1.6 is usually selected. Examples of such materials include silica, alumina, lanthanum fluoride, magnesium fluoride and aluminum sodium hexafluoride.

The method for laminating the high-refractive index material layer and the low-refractive index material layer is not specifically restricted as far as a dielectric multilayer film wherein these material layers are laminated is formed. For example, the dielectric multilayer film can be formed by alternately laminating the high-refractive index material layer and the low-refractive index material layer directly on the substrate (i) through CVD method, sputtering, vacuum deposition, ion-assisted deposition, ion plating or the like.

The physical film thickness of each layer of the high-refractive index material layers and the low-refractive index material layers is desired to be usually 5 to 500 nm though it depends upon a refractive index of each layer, and the total value of the physical film thickness of the dielectric multilayer films in the whole optical filter is preferably 1.0 to 8.0 μm.

The total number of the high-refractive index material layers and the low-refractive index material layers laminated in the dielectric multilayer film is preferably 16 to 70, more preferably 20 to 60, in the whole optical filter. When the thickness of each layer, the thickness of the dielectric multilayer film and the total number of lamination layers in the whole optical filter are in the above ranges, sufficient manufacturing margin can be ensured, and moreover, warpage of the optical filter and cracks of the dielectric multilayer film can be reduced.

In the embodiment of the present invention, by properly selecting the material species to constitute the high-refractive index layers and the low-refractive index layers, the thickness of each layer of the high-refractive index layers and the low-refractive index layers, the order of laminating, and the number of lamination layers, an optical filter having a light stopband and a light passband of desired wavelengths can be obtained in the near-infrared wavelength region while ensuring a sufficient transmittance in the visible region.

Here, in order to optimize the above conditions, it is enough to set parameters by the use of, for example, optical thin film design software (e.g., Essential Macleod, available from Thin Film Center, Inc.) in such a manner that the transmittance in a wavelength region of the near infrared wavelength region, in which light transmission is intended to be inhibited, is decreased and the transmittance in a wavelength region thereof, in which light is intended to be transmitted, is increased. For example, in the case where a light passband is intended to be provided in the vicinity of 800 nm by means of dielectric multilayer films formed on both surfaces, there can be mentioned a parameter setting method wherein by the use of the above software, the target transmittance of one dielectric multilayer film in the wavelength region of 720 to 760 nm is set to 0%, the target transmittance thereof in the wavelength region of 780 to 820 nm is set to 100%, and thereafter, the value of target tolerance of each of these wavelength regions is set to not more than 0.5 or the like, while the target transmittance of the other dielectric multilayer film in the wavelength region of 780 to 820 nm is set to 100%, the target transmittance thereof in the wavelength region of 850 to 1100 nm is set to 0%, and thereafter, the value of target tolerance of each of these wavelength regions is set to not more than 0.5 or the like.

[Other Functional Films]

For the purpose of enhancing surface hardness of the base material (i) or the dielectric multilayer film, enhancing chemical resistance, preventing static electrification, removing flaws, etc., functional films, such as an antireflection film, a hard coating film and an antistatic film, can be properly provided between the base material (i) and the dielectric multilayer film, on a surface of the base material (i) opposite to the surface where the dielectric multilayer film has been provided or on a surface of the dielectric multilayer film opposite to the surface where the base material (i) has been provided.

The optical filter of the embodiment of the present invention may include one layer composed of the above functional film or may include two or more layers each of which is composed of the functional film. When the optical filter of the embodiment of the present invention includes two or more layers each of which is composed of the functional film, it may include two or more layers which are the same as one another or may include two or more layers which are different from one another.

Although the method for laminating the functional film is not specifically restricted, there can be mentioned a method of melt-molding or cast-molding coating agents, such as an antireflection agent, a hard coating agent and/or an antistatic agent, on the base material (i) or the dielectric multilayer film in the same manner as previously described.

The functional film can be produced also by applying a curable composition containing the coating agent, etc. onto the base material (i) or the dielectric multilayer film using a bar coater or the like and then curing the composition through ultraviolet ray irradiation or the like.

As the coating agent, an ultraviolet (UV)/electron beam (EB) curable resin, a thermosetting resin or the like can be mentioned, and specific examples thereof include vinyl compounds, and urethane resins, urethane acrylate resins, acrylate resins, epoxy resins and epoxy acrylate resins. Examples of the curable compositions containing these coating agents include vinyl curable compositions, urethane curable compositions, urethane acrylate curable compositions, acrylate curable compositions, epoxy curable compositions and epoxy acrylate curable compositions.

Further, the curable composition may also contain a polymerization initiator. As the polymerization initiator, any known photopolymerization initiator or heat polymerization initiator can be used, and a photopolymerization initiator and a heat polymerization initiator may be used in combination as well. Such polymerization initiators may be used individually, or two or more thereof may be used.

In the curable composition, the blending ratio of the polymerization initiator(s) is preferably 0.1 to 10% by weight, more preferably 0.5 to 10% by weight, still more preferably 1 to 5% by weight, taking the total amount of the curable composition as 100% by weight. When the blending ratio of the polymerization initiator(s) is in the above-described range, the curable composition has excellent curability and ease of handling and can thus yield a functional film, such as an antireflection film, a hard coat film or an antistatic film, which has a desired hardness.

To the curable composition, an organic solvent may be further added as a solvent, and as the organic solvent, a publicly known solvent can be used. Specific examples of the organic solvents include alcohols, such as methanol, ethanol, isopropanol, butanol and octanol; ketones, such as acetone, methyl ethyl ketone, methyl isobutyl ketone and cyclohexanone; esters, such as ethyl acetate, butyl acetate, ethyl lactate, γ-butyrolactone, propylene glycol monomethyl ether acetate and propylene glycol monoethyl ether acetate; ethers, such as ethylene glycol monomethyl ether and diethylene glycol monobutyl ether; aromatic hydrocarbons, such as benzene, toluene and xylene; and amides, such as dimethylformamide, dimethylacetamide and N-methylpyrrolidone. These solvents may be used singly, or may be used in combination of two or more kinds.

The thickness of the functional film is preferably 0.1 to 20 μm, more preferably 0.5 to 10 μm, particularly preferably 0.7 to 5 μm.

For the purpose of enhancing adhesion between the base material (i) and the functional film and/or the dielectric multilayer film or adhesion between the functional film and the dielectric multilayer film, the surface of the base material (i), the functional film or the dielectric multilayer film may be subjected to surface treatment, such as corona treatment or plasma treatment.

[Uses of Optical Filter]

The optical filter of the embodiment of the present invention has a wide viewing angle and can selectively transmit visible light and a part of near infrared rays. Therefore, the optical filter is useful for correction of visibility of a solid-state image sensor having both of a camera function and a near-infrared sensing function, such as CCD or CMOS image sensor. In particular, the optical filter is useful for digital still camera, camera for smartphone, camera for cellular phone, digital video camera, camera for wearable device, PC camera, surveillance camera, camera for automobile, infrared camera, motion capture, laser range finder, virtual fitting, number plate recognition device, TV, car navigation system, personal digital assistant, video game console, handheld game console, fingerprint authentication system, digital music player, etc.

<Solid-State Image Pickup Device>

The solid-state image pickup device of the embodiment of the present invention is equipped with the optical filter of the embodiment of the present invention. Here, the solid-state image pickup device is an image sensor equipped with a solid-state image sensor having both of a camera function and a near-infrared sensing function, such as CCD or CMOS image sensor, and is specifically used for digital still camera, camera for smartphone, camera for cellular phone, camera for wearable device, digital video camera, etc. For example, the camera module of the embodiment of the present invention is equipped with the optical filter of the embodiment of the present invention.

EXAMPLES

The present invention is more specifically described with reference to the following examples, but it should be construed that the present invention is in no way limited to those examples. The term "part(s)" means "part(s) by weight" unless otherwise noted. Methods for measuring property values and methods for evaluating properties are as follows.

<Molecular Weight>

Taking into consideration the solubility of each resin in a solvent, etc., a molecular weight of the resin was measured by the following method (a) or (b).

(a) Using a gel permeation chromatography (GPC) apparatus (150C type, column: H type column available from Tosoh Corporation, developing solvent: o-dichlorobenzene) manufactured by WATERS Corporation, a weight-average molecular weight (Mw) and a number-average molecular weight (Mn) in terms of standard polystyrene were measured.

(b) Using a GPC apparatus (HLC-8220 type, column: TSKgel α-M, developing solvent: tetrahydrofuran) manufactured by Tosoh Corporation, a weight-average molecular weight (Mw) and a number-average molecular weight (Mn) in terms of standard polystyrene were measured.

With regard to the resin synthesized in the later-described Resin Synthesis Example 3, measurement of a molecular weight by the above method was not carried out, but measurement of an logarithmic viscosity by the following method (c) was carried out.

(c) A part of a polyimide resin solution was introduced into anhydrous methanol to precipitate a polyimide resin, and filtration was carried out to separate the resin from an unreacted monomer. Then, 0.1 g of polyimide obtained by vacuum drying the resulting resin at 80° C. for 12 hours was dissolved in 20 mL of N-methyl-2-pyrrolidone, and an logarithmic viscosity (μ) at 30° C. was determined using a Cannon-Fenske viscometer and the following formula.

$$\mu = \{\ln(t_s/t_0)\}/C$$

$t_0$: flow time of solvent
$t_s$: flow time of dilute polymer solution
C: 0.5 g/dL <Glass Transition Temperature (Tg)>

Using a differential scanning calorimeter (DSC 6200) manufactured by SII Nanotechnology Inc., a glass transition temperature was measured at a heating rate of 20° C./min in a stream of nitrogen.

<Spectral Transmittance>

Using a spectrophotometer (U-4100) manufactured by Hitachi High-Technologies Corporation, (Ta), (Xc), (Tb) and (Xf) of a base material, a transmittance and a reflectance of an optical filter in each wavelength region, (Xa), (Xb), (Xd), (Xe) and (Xa') were measured.

Figure 1A:
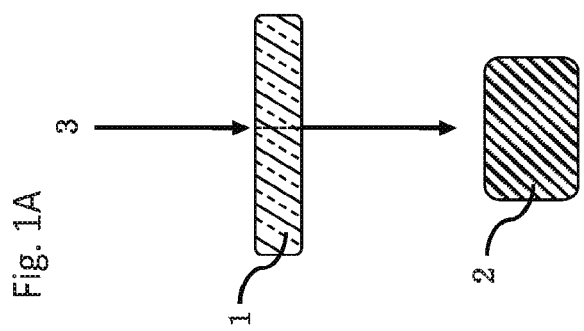
FIG. 1A is a schematic view showing a method for measuring a transmittance in the case where the transmittance is measured in the perpendicular direction to a base material (i) or an optical filter.

Here, with regard to the transmittance measured in the perpendicular direction to the base material and the optical filter, a transmittance of light 3 transmitted perpendicularly to the base material or the filter 1 was measured by a spectrophotometer 2, as shown in FIG. 1A. With regard to the transmittance measured at an angle of 30° to the perpendicular direction to the optical filter, a transmittance of light 3 transmitted at an angle of 30° to the perpendicular direction to the filter 1 was measured by the spectrophotometer 2, as shown in FIG. 1B.

The above transmittances were those measured by the use of the spectrophotometer under the condition that the light is incident perpendicularly to the base material and the optical filter, except the case of measurement of (Xe) and (Xa'). In the case of measurement of (Xe) and (Xa'), the transmittance was a transmittance measured by the use of the spectrophotometer under the condition that the light is incident at an angle of 30° to the perpendicular direction to the optical filter.

Figure 1C:
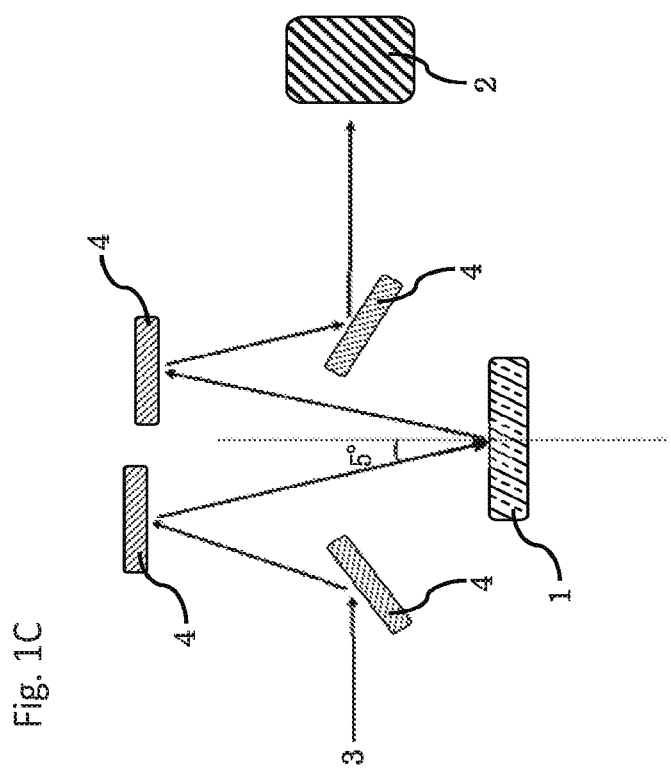
FIG. 1C is a schematic view showing a method for measuring a reflectance of an optical filter.

The reflectance of light 3 of the optical filter was measured by the spectrophotometer 2 at an angle of 5° to the perpendicular direction to the optical filter by installing the filter 1 on such a fixture belonging to the apparatus including reflecting mirrors 4 as shown in FIG. 1C.

Synthesis Examples

Compounds (A), compounds (S) and other coloring matters (X) that were used in the below-described examples can be synthesized by a commonly known method, examples of which include the methods described in Japanese Patent No. 3366697, Japanese Patent No. 2846091, Japanese Patent No. 2864475, Japanese Patent No. 3094037, Japanese Patent No. 3703869, JP-A-S60-228448, JP-A-H1-146846, JP-A-H1-228960, Japanese Patent No. 4081149, JP-A-S63-124054, "Phthalocyanines—Chemistry and Functions—" (Industrial Publishing & Consulting, Inc., 1997), JP-A-2007-169315, JP-A-2009-108267, JP-A-2010-241873, Japanese Patent No. 3699464 and Japanese Patent No. 4740631.

Resin Synthesis Example 1

In a reaction container purged with nitrogen, 100 parts of 8-methyl-8-methoxycarbonyltetracyclo[4.4.0.1$^{2,5}$.1$^{7,10}$]dodeca-3-ene represented by the following formula (a), 18 parts of 1-hexene (molecular weight modifier) and 300 parts of toluene (solvent for ring-opening polymerization reaction) were placed, and this solution was heated to 80° C. Then, to the solution in the reaction container, 0.2 part of a toluene solution of triethylaluminum (concentration: 0.6 mol/liter) and 0.9 part of a toluene solution of methanol-modified tungsten hexachloride (concentration: 0.025 mol/liter) were added as polymerization catalysts, and the resulting solution was heated and stirred at 80° C. for 3 hours to perform ring-opening polymerization reaction, whereby a ring-opened polymer solution was obtained. The polymerization conversion ratio in this polymerization reaction was 97%.

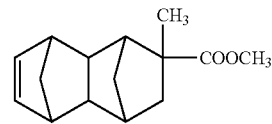

(a)

In an autoclave, 1,000 parts of the ring-opened polymer solution obtained as above were placed, and to this ring-opened polymer solution, 0.12 part of RuHCl(CO) [P(C$_6$H$_5$)$_3$]$_3$ was added, and they were heated and stirred for 3 hours under the conditions of a hydrogen gas pressure of 100 kg/cm$^2$ and a reaction temperature of 165° C., to perform hydrogenation reaction. After the resulting reaction solution (hydrogenated polymer solution) was cooled, the hydrogen gas pressure was released. This reaction solution was poured into a large amount of methanol, and the resulting condensate was separated and recovered. Then, the condensate was dried to obtain a hydrogenated polymer (also referred to as a "resin A" hereinafter). The resulting resin A had a number-average molecular weight (Mn) of 32,000, a weight-average molecular weight (Mw) of 137,000 and a glass transition temperature (Tg) of 165° C.

Resin Synthesis Example 2

In a 3-liter four-neck flask, 35.12 g (0.253 mol) of 2,6-difluorobenzonitrile, 87.60 g (0.250 mol) of 9,9-bis(4-hydroxyphenyl)fluorene, 41.46 g (0.300 mol) of potassium carbonate, 443 g of N,N-dimethylacetamide (also referred to as "DMAc" hereinafter) and 111 g of toluene were placed. Subsequently, to the four-neck flask, a thermometer, a stirrer, a three-way cock with a nitrogen feed pipe, a Dean-Stark tube and a cooling pipe were fixed. Then, the flask was purged with nitrogen. Thereafter, the resulting solution was subjected to reaction at 140° C. for 3 hours, and water produced was removed from the Dean-Stark tube whenever necessary. When production of water came to be not detected, the temperature was slowly raised up to 160° C., and the reaction was carried out at the same temperature for 6 hours. After the reaction solution was cooled down to room temperature (25° C.), a salt produced was removed by a filter paper, then the filtrate was introduced into methanol to perform reprecipitation, and filtration was carried out to isolate a cake (residue). The resulting cake was vacuum dried at 60° C. for one night to obtain a white powder (also referred to as a "resin B" hereinafter) (yield: 95%). The resulting resin B had a number-average molecular weight (Mn) of 75,000, a weight-average molecular weight (Mw) of 188,000 and a glass transition temperature (Tg) of 285° C.

Resin Synthesis Example 3

In a 500-mL five-neck flask equipped with a thermometer, a stirrer, a nitrogen feed pipe, a dropping funnel with a side tube, a Dean-Stark tube and a cooling pipe, 27.66 g (0.08 mol) of 1, 4-bis(4-amino-α,α-dimethylbenzyl)benzene and 7.38 g (0.02 mol) of 4,4'-bis(4-aminophenoxy)biphenyl were placed, and they were dissolved in 68.65 g of γ-butyrolactone and 17.16 g of N, N-dimethylacetamide in a stream of nitrogen. The resulting solution was cooled to 5° C. using an ice water bath, and with maintaining the solution at the same temperature, 22.62 g (0.1 mol) of 1,2,4,5-cyclohexanetetracarboxylic dianhydride and 0.50 g (0.005 mol) of triethylamine as an imidization catalyst were added all together. After the addition was completed, the temperature was raised to 180° C., and with removing the distillate whenever necessary, the reaction solution was refluxed for 6 hours. After the reflux for 6 hours, air cooling was carried out until the internal temperature became 100° C. Thereafter, 143.6 g of DMAc was added to dilute the reaction solution, and with stirring, the resulting solution was cooled to obtain 264.16 g of a polyimide resin solution having a solid concentration of 20% by weight. Apart of the polyimide resin solution was poured into 1 liter of methanol to precipitate polyimide. The polyimide was filtered off, washed with methanol and then dried for 24 hours in a vacuum dryer at 100° C. to obtain a white powder (also referred to as a "resin C" hereinafter).

When an IR spectrum of the resulting resin C was measured, absorption at 1704 cm$^{-1}$ and 1770 cm$^{-1}$ characteristic of an imide group was observed. The resin C had a glass transition temperature (Tg) of 310° C., and the logarithmic viscosity measurement resulted in 0.87.

Resin Synthesis Example 4

In a 50-liter reactor equipped with a stirrer and a distillation device, 9.167 kg (20.90 mol) of 9,9-bis(4-2-hydroxyethoxy)phenyl)fluorene, 4.585 kg (20.084 mol) of bisphenol A, 9.000 kg (42.01 mol) of diphenyl carbonate and 0.02066 kg (2.459×10$^{-4}$ mol) of sodium hydrogencarbonate were placed, and they were stirred and heated to 215° C. over a period of 1 hour at 760 Torr in a nitrogen atmosphere. Thereafter, the degree of vacuum was adjusted to 150 Torr over a period of 15 minutes, and the system was maintained for 20 minutes under the conditions of 215° C. and 150 Torr to perform transesterification reaction. Further, the temperature was raised up to 240° C. at a rate of 37.5° C./hr, and the system was maintained at 240° C. and 150 Torr for 10 minutes. Thereafter, the system was adjusted to 120 Torr over a period of 10 minutes, and was maintained at 240° C. and 120 Torr for 70 minutes. Thereafter, the system was adjusted to 100 Torr over a period of 10 minutes, and was maintained at 240° C. and 100 Torr for 10 minutes. Further, the system was adjusted to not more than 1 Torr over a period of 40 minutes, and stirring was carried out for 10 minutes under the conditions of 240° C. and not more than 1 Torr to perform polymerization reaction. After the reaction was completed, nitrogen was fed to the reactor to pressurize the reactor, and with pelletizing the resulting polycarbonate resin (also referred to as a "resin D" hereinafter), the pellets were taken out. The resulting resin D had a weight-average molecular weight of 41,000 and a glass transition temperature (Tg) of 152° C.

Resin Synthesis Example 5

In a reactor, 0.8 mol of 9,9-bis{4-(2-hydroxyethoxy)-3, 5-dimethylphenyl}fluorene, 2.2 mol of ethylene glycol and 1.0 mol of dimethyl isophthalate were placed, and with stirring, they were slowly heated and melted to perform transesterification reaction. Thereafter, 20×10$^{-4}$ mol of germanium oxide was added, and with slowly carrying out elevation of temperature and reduction of pressure until a temperature of 290° C. and a pressure of not more than 1 Torr were reached, ethylene glycol was removed. Thereafter, the contents were taken out of the reactor to obtain pellets of a polyester resin (also referred to as a "resin E" hereinafter). The resulting resin E had a number-average molecular weight of 40,000 and a glass transition temperature of 145° C.

Resin Synthesis Example 6

In a reactor equipped with a thermometer, a cooling pipe, a gas feed pipe and a stirrer, 16.74 parts of 4,4'-bis(2,3,4,5, 6-pentafluorobenzoyl)diphenyl ether (BPDE), 10.5 parts of 9,9-bis(4-hydroxyphenyl)fluorene (HF), 4.34 parts of potassium carbonate and 90 parts of DMAc were placed. This mixture was heated to 80° C. and subjected to reaction for 8 hours. After the reaction was completed, the reaction solution was added to a 1% acetic acid aqueous solution with vigorously stirring by a blender. The reaction product precipitated was filtered off, washed with distilled water and methanol and then vacuum dried to obtain fluorinated polyether ketone (also referred to as a "resin F" hereinafter). The resulting resin F had a number-average molecular weight of 71,000 and a glass transition temperature (Tg) of 242° C.

Example 1

In Example 1, an optical filter (Y=810 nm) which had a base material formed of a transparent resin substrate and had a near-infrared ray selective passband in the vicinity of wavelengths of 790 to 830 nm was prepared.

In a container, 100 parts of the resin A obtained in Synthesis Example 1, 0.03 part of the compound (a-16) (absorption maximum wavelength in dichloromethane: 698 nm) described in the aforesaid Table 1 and 0.03 part of the compound (b-3) (absorption maximum wavelength in dichloromethane: 733 nm) described in the aforesaid Table 4 as the compounds (A), and methylene chloride were placed to obtain a solution having a resin concentration of 20% by weight. Subsequently, the resulting solution was cast onto a flat glass plate and dried at 20° C. for 8 hours, and then, the resulting coating film was peeled from the glass plate. The coating film thus peeled was dried at 100° C. for 8 hours under reduced pressure to obtain a base material formed of a transparent resin substrate having a thickness of 0.1 mm, a length of 60 mm and a width of 60 mm.

Figure 2:
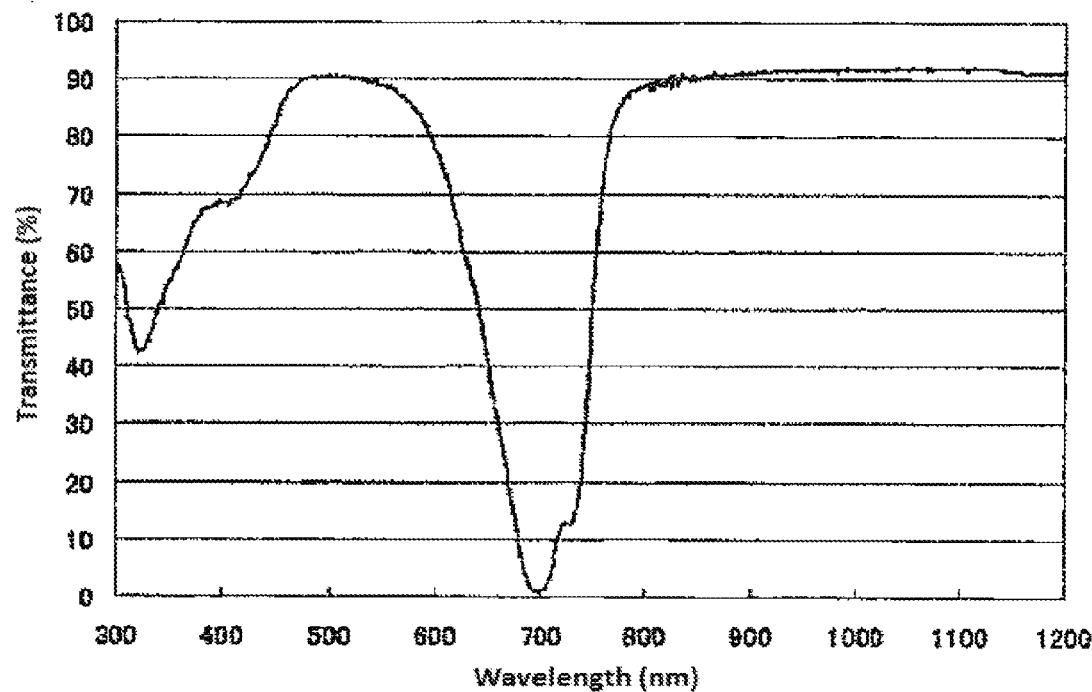
FIG. 2 is a spectral transmission spectrum of a base material obtained in Example 1.

Spectral transmittances of this base material were measured, and (Ta), (Tb), (Xc) and (Xf) were determined. The results are set forth in FIG. 2 and Table 15.

Subsequently, on one surface of the resulting base material, a dielectric multilayer film (I) was formed, and on the other surface of the base material, a dielectric multilayer film (II) was formed, whereby an optical filter having a thickness of about 0.106 mm was obtained.

The dielectric multilayer film (I) was constituted of silica ($SiO_2$) layers and titania ($TiO_2$) layers that had been alternately laminated at a deposition temperature of 100° C. (total: 30 layers). The dielectric multilayer film (II) was constituted of silica ($SiO_2$) layers and titania ($TiO_2$) layers that had been alternately laminated at a deposition temperature of 100° C. (total: 20 layers). In each of the dielectric multilayer films (I) and (II), the silica layers and the titania layers were alternately laminated in the order of a titania layer, a silica layer, a titania layer, - - - a silica layer, a titania layer and a silica layer from the base material side, and the outermost layer of the optical filter was a silica layer.

Designing of the dielectric multilayer films (I) and (II) was carried out in the following manner.

The thickness of each layer and the number of layers were optimized according to the dependence of the base material refractive index on the wavelength and the absorption properties of the used compounds (A) so that the reflection prevention effect in the visible region and the selective transmission/reflection performance in the near-infrared region could be attained, by the use of optical thin film design software (Essential Macleod, available from Thin Film Center, Inc.). When optimization was carried out, input parameters (Target values) into the software in Example 1 were set as shown in the following Table 10.

TABLE 10

| Dielectric multilayer film | Input parameter Into software | | | |
|---|---|---|---|---|
| | Wavelength (nm) | Incident Angle | Required Value | Target Tolerance | Type |
| (I) | 400~700 | 0 | 100 | 1 | Transmittance |
| | 705~765 | 0 | 0 | 0.7 | Transmittance |
| | 770~840 | 0 | 100 | 0.5 | Transmittance |
| (II) | 400~700 | 0 | 100 | 1 | Transmittance |
| | 770~840 | 0 | 100 | 0.5 | Transmittance |
| | 845~1200 | 0 | 0 | 0.5 | Transmittance |

As a result of optimization of film constitution, the dielectric multilayer film (I) became a multilayer deposited film of 30 lamination layers, said film being constituted of silica layers each having a thickness of 22 to 467 nm and titania layers each having a thickness of 6 to 130 nm alternately laminated and the dielectric multilayer film (II) became a multilayer deposited film of 20 lamination layers, said film being constituted of silica layers each having a thickness of 84 to 206 nm and titania layers each having a thickness of 8 to 109 nm alternately laminated. An example of the film constitution obtained by optimization is shown in Table 11.

TABLE 11

| Dielectric multilayer film | Layer | Film material | Physical film thickness (nm) | Optical film thickness (nd) |
|---|---|---|---|---|
| (I) | 1 | $SiO_2$ | 77.3 | 0.203 λ |
| | 2 | $TiO_2$ | 87.4 | 0.381 λ |
| | 3 | $SiO_2$ | 24.5 | 0.064 λ |
| | 4 | $TiO_2$ | 5.8 | 0.025 λ |
| | 5 | $SiO_2$ | 128.3 | 0.337 λ |
| | 6 | $TiO_2$ | 15.3 | 0.067 λ |
| | 7 | $SiO_2$ | 22.3 | 0.058 λ |
| | 8 | $TiO_2$ | 130.1 | 0.568 λ |
| | 9 | $SiO_2$ | 26.4 | 0.069 λ |
| | 10 | $TiO_2$ | 18.0 | 0.079 λ |
| | 11 | $SiO_2$ | 347.3 | 0.913 λ |
| | 12 | $TiO_2$ | 98.1 | 0.428 λ |
| | 13 | $SiO_2$ | 168.1 | 0.442 λ |
| | 14 | $TiO_2$ | 106.5 | 0.465 λ |
| | 15 | $SiO_2$ | 31.8 | 0.084 λ |
| | 16 | $TiO_2$ | 12.4 | 0.054 λ |
| | 17 | $SiO_2$ | 139.6 | 0.367 λ |
| | 18 | $TiO_2$ | 6.9 | 0.030 λ |
| | 19 | $SiO_2$ | 30.3 | 0.080 λ |
| | 20 | $TiO_2$ | 94.7 | 0.413 λ |
| | 21 | $SiO_2$ | 162.4 | 0.427 λ |
| | 22 | $TiO_2$ | 95.4 | 0.416 λ |
| | 23 | $SiO_2$ | 31.6 | 0.083 λ |
| | 24 | $TiO_2$ | 8.2 | 0.036 λ |
| | 25 | $SiO_2$ | 466.7 | 1.226 λ |
| | 26 | $TiO_2$ | 11.9 | 0.052 λ |
| | 27 | $SiO_2$ | 26.6 | 0.070 λ |
| | 28 | $TiO_2$ | 89.1 | 0.389 λ |
| | 29 | $SiO_2$ | 23.9 | 0.063 λ |
| | 30 | $TiO_2$ | 11.4 | 0.050 λ |
| | Base material | | | |
| (II) | 31 | $TiO_2$ | 8.4 | 0.037 λ |
| | 32 | $SiO_2$ | 206.3 | 0.542 λ |
| | 33 | $TiO_2$ | 105.2 | 0.459 λ |
| | 34 | $SiO_2$ | 184.6 | 0.485 λ |
| | 35 | $TiO_2$ | 109.2 | 0.477 λ |
| | 36 | $SiO_2$ | 181.9 | 0.478 λ |
| | 37 | $TiO_2$ | 100.1 | 0.437 λ |
| | 38 | $SiO_2$ | 168.6 | 0.443 λ |
| | 39 | $TiO_2$ | 96.9 | 0.423 λ |
| | 40 | $SiO_2$ | 176.4 | 0.453 λ |
| | 41 | $TiO_2$ | 104.2 | 0.455 λ |
| | 42 | $SiO_2$ | 178.9 | 0.470 λ |
| | 43 | $TiO_2$ | 100.3 | 0.438 λ |
| | 44 | $SiO_2$ | 172.2 | 0.452 λ |
| | 45 | $TiO_2$ | 100.2 | 0.437 λ |
| | 46 | $SiO_2$ | 179.0 | 0.470 λ |
| | 47 | $TiO_2$ | 105.6 | 0.461 λ |
| | 48 | $SiO_2$ | 181.2 | 0.476 λ |
| | 49 | $TiO_2$ | 104.0 | 0.454 λ |
| | 50 | $SiO_2$ | 84.4 | 0.222 λ |

* λ = 550 nm

Figure 3:
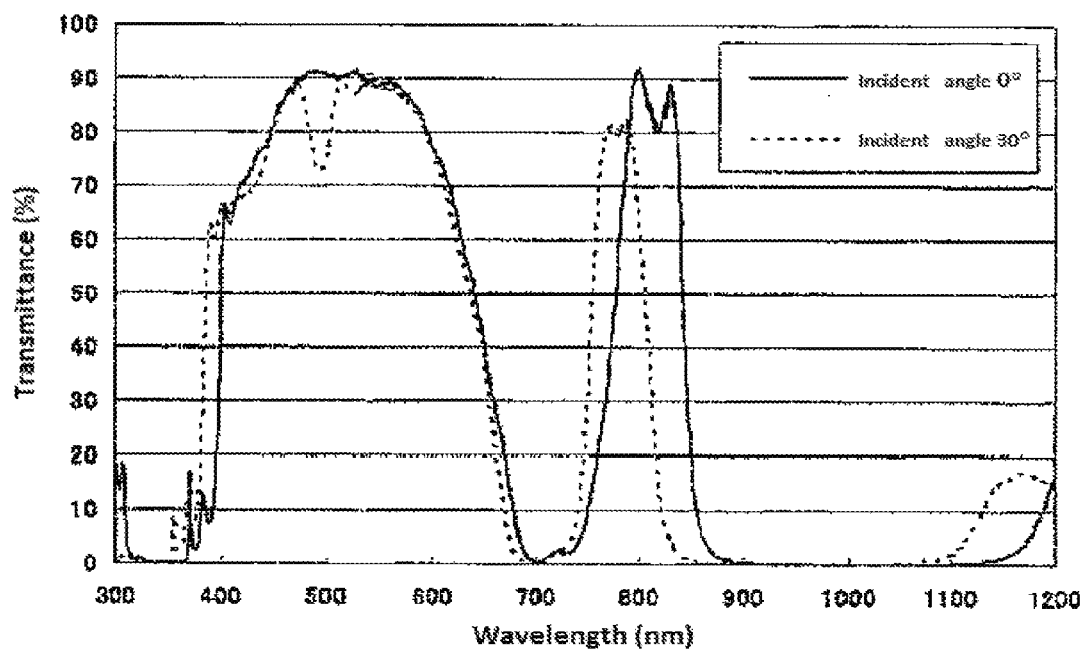
FIG. 3 is a spectral transmission spectrum of an optical filter obtained in Example 1.
Figure 4:
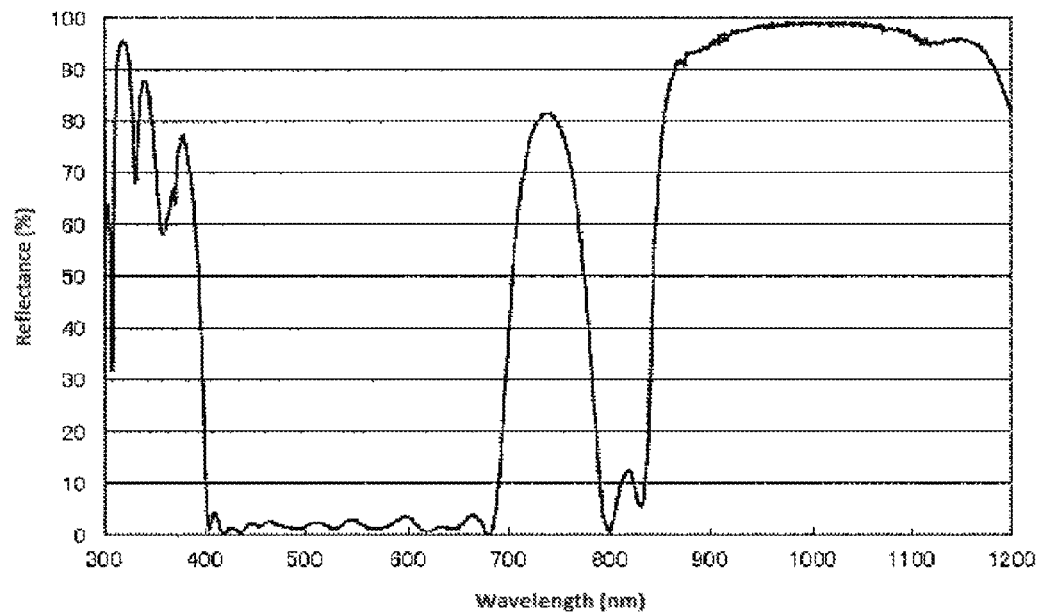
FIG. 4 is a spectral reflection spectrum of an optical filter obtained in Example 1.

Spectral transmittances measured in the perpendicular direction to this optical filter and at an angle of 30° to the perpendicular direction thereto and reflectances measured at an angle of 5° to the perpendicular direction thereto were determined, and optical properties in each wavelength region were evaluated. The results are set forth in FIG. 3, FIG. 4 and Table 15. The mean value of transmittances in the wavelength region of 430 to 580 nm was 88%, Xa was 778 nm, Xb was 842 nm, Y was 810 nm, the mean transmittance in the wavelength region of Y−10 nm to Y+10 nm was 85%, the mean reflectance in the wavelength region of Y−10 nm to Y+10 nm was 8%, the absolute value |Xd−Xe| was 3 nm, and the absolute value |Xa−Xa'| was 23 nm. In Example 1, the mean reflectance in the wavelength region of Y−10 nm to Y+10 nm was measured from the dielectric multilayer film (I) side of the optical filter.

Example 2

In Example 2, an optical filter (Y=811 nm) which had a base material formed of a transparent resin substrate having resin layers on both surfaces and had a near-infrared ray selective passband in the vicinity of wavelengths of 790 to 830 nm was prepared.

A transparent resin substrate containing the compounds (A) was obtained in the same manner under the same conditions as those in Example 1, except that as the compounds (A), 0.04 part of the compound (a-17) (absorption maximum wavelength in dichloromethane: 703 nm) described in the aforesaid Table 1 and 0.04 part of the compound (b-39) (absorption maximum wavelength in dichloromethane: 736 nm) described in the aforesaid Table 6 were used instead of the compounds (a-16) and (b-3).

One surface of the resulting transparent resin substrate was coated with a resin composition (1) of the following formulation by a bar coater, and the composition was heated at 70° C. for 2 minutes in an oven to remove the solvent by volatilization. In this coating, the coating conditions using the bar coater were controlled so that the thickness after drying might become 2 μm. Next, using a conveyer type exposure device, exposure (exposure quantity: 500 mJ/cm$^2$, 200 mW) was carried out to cure the resin composition (1), whereby a resin layer was formed on the transparent resin substrate. Also on the other surface of the transparent resin substrate, a resin layer formed from the resin composition (1) was formed in the same manner as above, whereby a base material having resin layers on both surfaces of the transparent resin substrate containing the compounds (A) was obtained.

Figure 5:
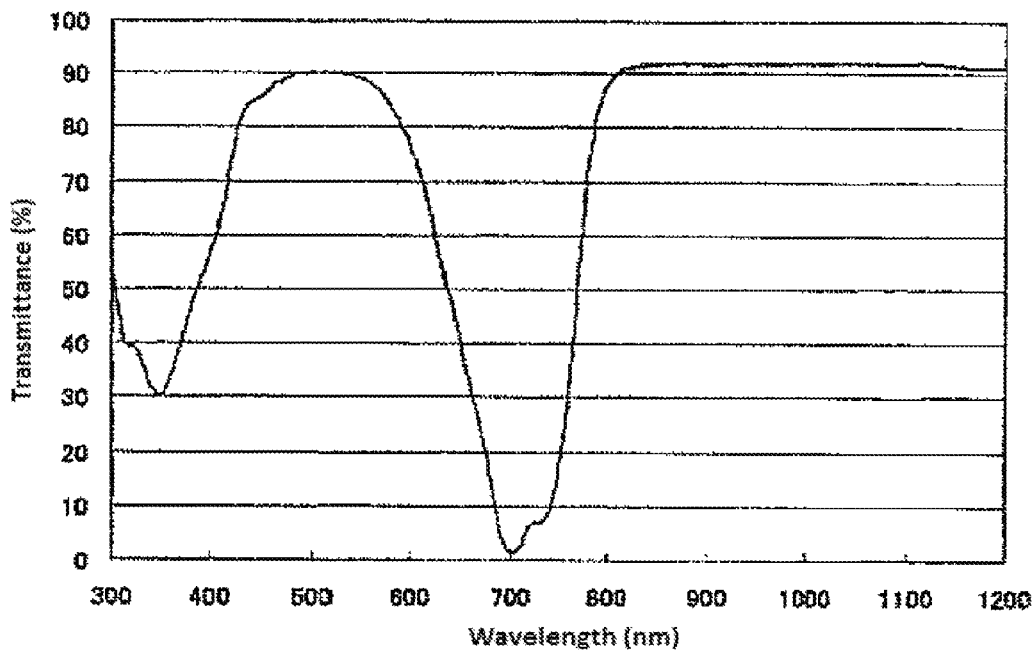
FIG. 5 is a spectral transmission spectrum of a base material obtained in Example 2.

Spectral transmittances of this base material were measured, and (Ta), (Tb), (Xc) and (Xf) were determined. The results are set forth in FIG. 5 and Table 15.

Resin composition (1): tricyclodecane dimethanol acrylate 60 parts by weight, dipentaerythritol hexaacrylate 40 parts by weight, 1-hydroxycyclohexyl phenyl ketone 5 parts by weight, methyl ethyl ketone (solvent), solid concentration (TSC): 30%

Subsequently, in the same manner as in Example 1, a dielectric multilayer film (III) constituted of silica (SiO$_2$) layers and titania (TiO$_2$) layers alternately laminated (total: 30 layers) was formed on one surface of the resulting base material, and further, a dielectric multilayer film (IV) constituted of silica (SiO$_2$) layers and titania (TiO$_2$) layers alternately laminated (total: 20 layers) was formed on the other surface of the base material, whereby an optical filter having a thickness of about 0.110 mm was obtained. Designing of the dielectric multilayer films was carried out by the use of the same design parameters as in Example 1 taking into consideration the dependence of the base material refractive index on the wavelength, etc. similarly to Example 1.

Figure 6:
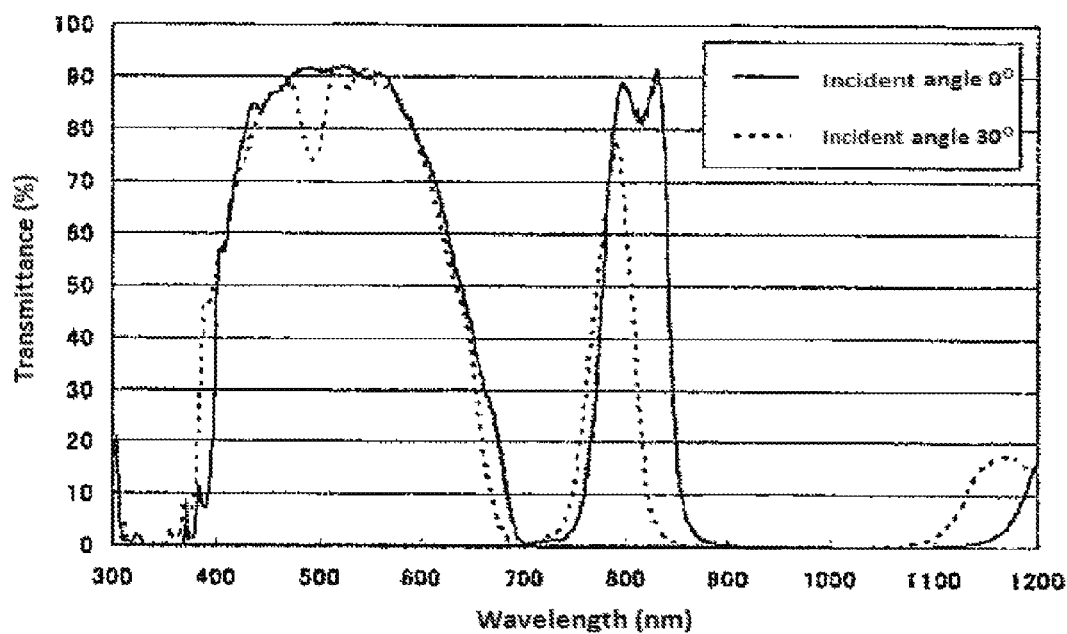
FIG. 6 is a spectral transmission spectrum of an optical filter obtained in Example 2.
Figure 7:
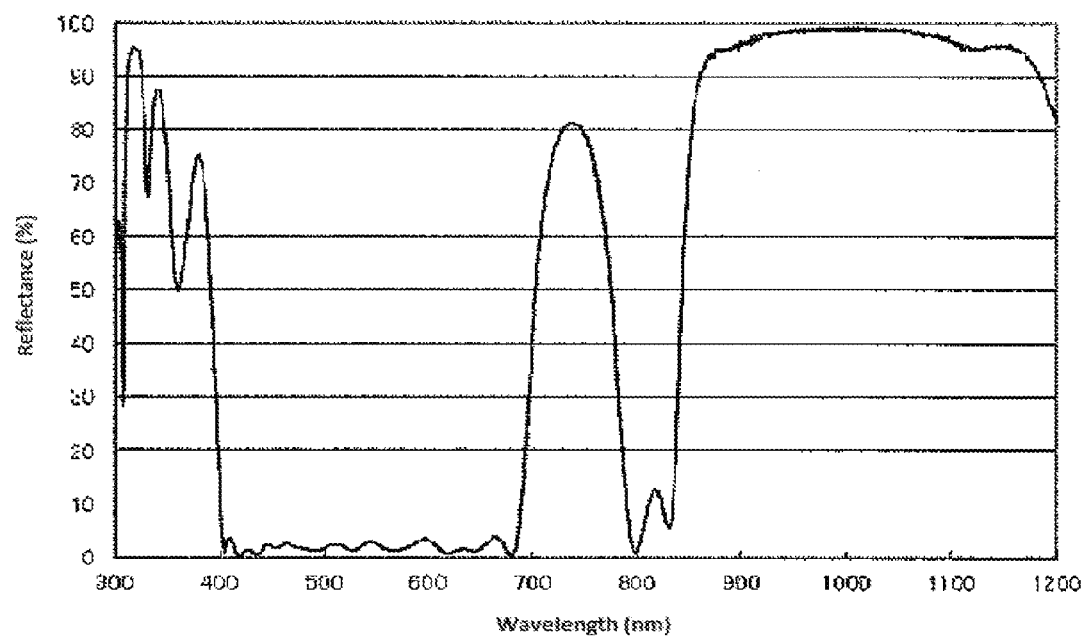
FIG. 7 is a spectral reflection spectrum of an optical filter obtained in Example 2.

Spectral transmittances and reflectances of this optical filter were measured, and optical properties in each wavelength region were evaluated. The results are set forth in FIGS. 6 and 7 and Table 15.

Example 3

In Example 3, an optical filter (Y=864 nm) which had a base material formed of a transparent resin substrate having resin layers on both surfaces and had a near-infrared ray selective passband in the vicinity of wavelengths of 840 to 890 nm was prepared.

After a transparent resin substrate was prepared in the same manner as in Example 1, resin layers formed from the resin composition (1) were formed on both surfaces of the resulting transparent resin substrate in the same manner as in Example 2, whereby a base material having resin layers on both surfaces of the transparent resin substrate containing the compounds (A) was obtained.

Spectral transmittances of this base material were measured, and (Ta), (Tb), (Xc) and (Xf) were determined. The results are set forth in Table 15.

Subsequently, in the same manner as in Example 1, a dielectric multilayer film (V) was formed on one surface of the resulting base material, and further, a dielectric multilayer film (VI) was formed on the other surface of the base material, whereby an optical filter having a thickness of about 0.110 mm was obtained. Designing of the dielectric multilayer films was carried out by the use of design parameters described in Table 12 taking into consideration the dependence of the base material refractive index on the wavelength, etc. similarly to Example 1.

TABLE 12

| | Input parameter into software | | | | |
|---|---|---|---|---|---|
| Dielectric multilayer film | Wavelength (nm) | Incident Angle | Required Value | Target Tolerance | Type |
| (V) | 400~700 | 0 | 100 | 1 | Transmittance |
| | 705~825 | 0 | 0 | 0.5 | Transmittance |
| | 830~900 | 0 | 100 | 0.5 | Transmittance |
| (VI) | 410~700 | 0 | 100 | 1 | Transmittance |
| | 835~900 | 0 | 100 | 0.5 | Transmittance |
| | 905~1200 | 0 | 0 | 0.5 | Transmittance |

In Example 3, as a result of optimization of film constitution, the dielectric multilayer film (V) became a multilayer deposited film of 30 lamination layers, said film being constituted of silica layers each having a thickness of 15 to 222 nm and titania layers each having a thickness of 9 to 179 nm alternately laminated, and the dielectric multilayer film (VI) became a multilayer deposited film of 20 lamination layers, said film being constituted of silica layers each having a thickness of 94 to 211 nm and titania layers each having a thickness of 7 to 115 nm alternately laminated. An example of the film constitution obtained by optimization is shown in Table 13.

TABLE 13

| Dielectric multilayer film | Layer | Film material | Physical film thickness (nm) | Optical film thickness (nd) |
|---|---|---|---|---|
| (V) | 1 | SiO$_2$ | 84.5 | 0.222 λ |
| | 2 | TiO$_2$ | 40.5 | 0.177 λ |
| | 3 | SiO$_2$ | 15.0 | 0.040 λ |
| | 4 | TiO$_2$ | 29.0 | 0.127 λ |
| | 5 | SiO$_2$ | 152.8 | 0.402 λ |
| | 6 | TiO$_2$ | 11.6 | 0.051 λ |
| | 7 | SiO$_2$ | 17.0 | 0.045 λ |
| | 8 | TiO$_2$ | 178.7 | 0.780 λ |
| | 9 | SiO$_2$ | 16.7 | 0.044 λ |
| | 10 | TiO$_2$ | 13.5 | 0.059 λ |
| | 11 | SiO$_2$ | 174.7 | 0.459 λ |
| | 12 | TiO$_2$ | 11.5 | 0.050 λ |
| | 13 | SiO$_2$ | 186.0 | 0.489 λ |
| | 14 | TiO$_2$ | 96.5 | 0.421 λ |
| | 15 | SiO$_2$ | 55.8 | 0.147 λ |
| | 16 | TiO$_2$ | 10.7 | 0.047 λ |
| | 17 | SiO$_2$ | 45.1 | 0.118 λ |

TABLE 13-continued

| Dielectric multilayer film | Layer | Film material | Physical film thickness (nm) | Optical film thickness (nd) |
|---|---|---|---|---|
| | 18 | TiO₂ | 92.3 | 0.403 λ |
| | 19 | SiO₂ | 190.1 | 0.500 λ |
| | 20 | TiO₂ | 14.6 | 0.064 λ |
| | 21 | SiO₂ | 221.8 | 0.583 λ |
| | 22 | TiO₂ | 9.1 | 0.040 λ |
| | 23 | SiO₂ | 152.9 | 0.402 λ |
| | 24 | TiO₂ | 10.9 | 0.048 λ |
| | 25 | SiO₂ | 46.8 | 0.123 λ |
| | 26 | TiO₂ | 25.0 | 0.109 λ |
| | 27 | SiO₂ | 185.6 | 0.488 λ |
| | 28 | TiO₂ | 104.0 | 0.454 λ |
| | 29 | SiO₂ | 34.2 | 0.090 λ |
| | 30 | TiO₂ | 9.5 | 0.041 λ |
| | Base material | | | |
| (VI) | 31 | TiO₂ | 7.3 | 0.032 λ |
| | 32 | SiO₂ | 210.9 | 0.554 λ |
| | 33 | TiO₂ | 106.9 | 0.487 λ |
| | 34 | SiO₂ | 190.5 | 0.500 λ |
| | 35 | TiO₂ | 114.7 | 0.501 λ |
| | 36 | SiO₂ | 190.5 | 0.501 λ |
| | 37 | TiO₂ | 109.8 | 0.479 λ |
| | 38 | SiO₂ | 189.4 | 0.498 λ |
| | 39 | TiO₂ | 107.5 | 0.469 λ |
| | 40 | SiO₂ | 181.1 | 0.476 λ |
| | 41 | TiO₂ | 104.3 | 0.455 λ |
| | 42 | SiO₂ | 183.1 | 0.481 λ |
| | 43 | TiO₂ | 108.1 | 0.472 λ |
| | 44 | SiO₂ | 189.6 | 0.498 λ |
| | 45 | TiO₂ | 111.7 | 0.488 λ |
| | 46 | SiO₂ | 191.1 | 0.502 λ |
| | 47 | TiO₂ | 110.3 | 0.481 λ |
| | 48 | SiO₂ | 188.1 | 0.494 λ |
| | 49 | TiO₂ | 110.9 | 0.484 λ |
| | 50 | SiO₂ | 94.2 | 0.248 λ |

* λ = 550 nm

Figure 8:
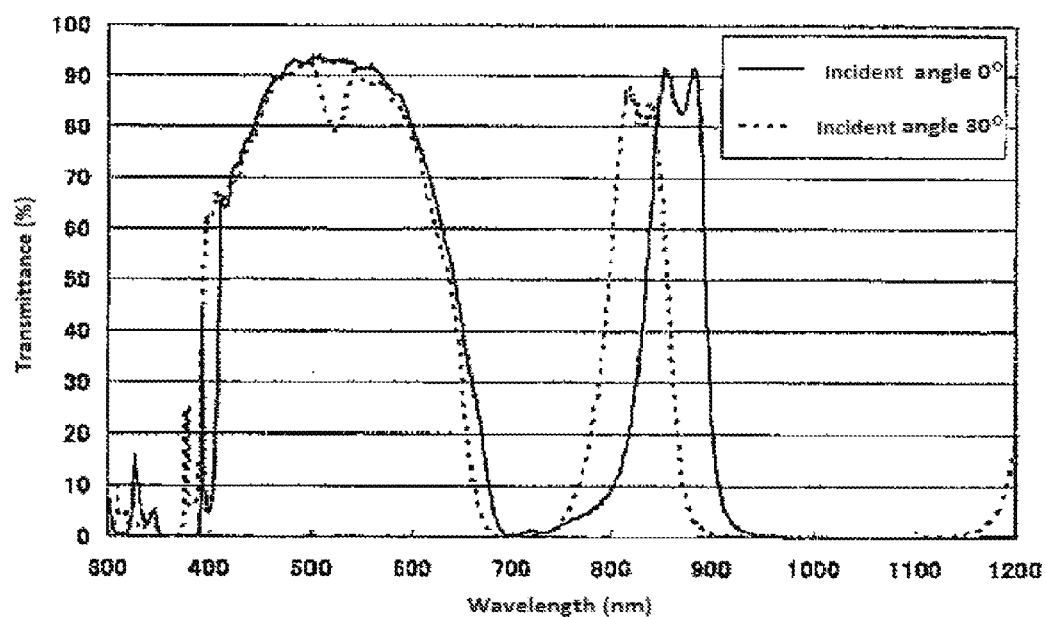
FIG. 8 is a spectral transmission spectrum of an optical filter obtained in Example 3.
Figure 9:
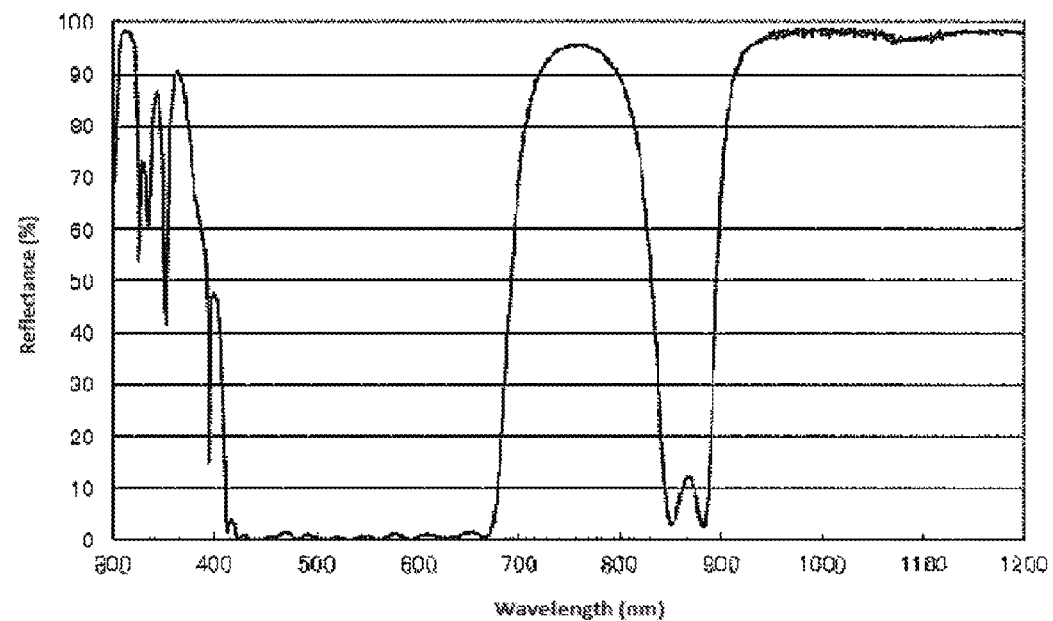
FIG. 9 is a spectral reflection spectrum of an optical filter obtained in Example 3.

Spectral transmittances and reflectances of this optical filter were measured, and optical properties in each wavelength region were evaluated. The results are set forth in FIG. 8, FIG. 9 and Table 15.

Example 4

In Example 4, an optical filter (Y=810 nm) which had a base material formed of a resin support having transparent resin layers containing the compounds (A) on both surfaces and had a near-infrared ray selective passband in the vicinity of wavelengths of 790 to 830 nm was prepared.

In a container, the resin A obtained in Synthesis Example 1 and methylene chloride were placed as shown in Table 15 to obtain a solution having a resin concentration of 20% by weight. A resin support was prepared in the same manner as in Example 1, except for using the resulting solution.

On both surfaces of the resulting transparent resin support, resin layers formed from a resin composition (2) of the following formulation were formed in the same manner as in Example 2, whereby a base material formed of the resin support having transparent resin layers containing the compounds (A) on both surfaces was obtained.

Spectral transmittances of this base material were measured, and (Ta), (Tb), (Xc) and (Xf) were determined. The results are set forth in Table 15.

Resin composition (2): tricyclodecane dimethanol acrylate 100 parts by weight, 1-hydroxycyclohexyl phenyl ketone 4 parts by weight, 0.8 part by weight of the compound (a-16) described in the aforesaid Table 1, 0.7 part by weight of the compound (b-3) described in the aforesaid Table 4, methyl ethyl ketone (solvent), TSC: 25%

Subsequently, in the same manner as in Example 1, a dielectric multilayer film (VII) constituted of silica (SiO₂) layers and titania (TiO₂) layers alternately laminated (total: 30 layers) was formed on one surface of the resulting base material, and further, a dielectric multilayer film (VIII) constituted of silica (SiO₂) layers and titania (TiO₂) layers alternately laminated (total: 20 layers) was formed on the other surface of the base material, whereby an optical filter having a thickness of about 0.110 mm was obtained. Designing of the dielectric multilayer films was carried out by the use of the same design parameters as in Example 1 taking into consideration the dependence of the base material refractive index on the wavelength, etc. similarly to Example 1.

Spectral transmittances and reflectances of this optical filter were measured, and optical properties in each wavelength region were evaluated. The results are set forth in Table 15.

Example 5

In Example 5, an optical filter (Y=811 nm) which had a base material formed of a glass support having a transparent resin layer containing the compounds (A) on one surface and had a near-infrared ray selective passband in the vicinity of wavelengths of 790 to 830 nm was prepared.

A glass support "OA-10G (thickness: 200 μm)" (available from Nippon Electric Glass Co., Ltd.) having been cut into a length of 60 mm and a width of 60 mm was coated with a resin composition (3) of the following formulation by a spin coater, and on a hot plate, the composition was heated at 80° C. for 2 minutes to remove the solvent by volatilization. In this coating, the coating conditions using the spin coater were controlled so that the thickness after drying might become 2 μm. Next, using a conveyer type exposure device, exposure (exposure quantity: 500 mJ/cm², 200 mW) was carried out to cure the resin composition (3), whereby a base material formed of the glass support having a transparent resin layer containing the compounds (A) was obtained.

Spectral transmittances of this base material were measured, and (Ta), (Tb), (Xc) and (Xf) were determined. The results are set forth in Table 15.

Resin composition (3): tricyclodecane dimethanol acrylate 20 parts by weight, dipentaerythritol hexaacrylate 80 parts by weight, 1-hydroxycyclohexyl phenyl ketone 4 parts by weight, 1.4 parts by weight of the compound (a-16) described in the aforesaid Table 1, 1.4 parts by weight of the compound (b-3) described in the aforesaid Table 4, methyl ethyl ketone (solvent), TSC: 35%

Subsequently, in the same manner as in Example 1, a dielectric multilayer film (IX) constituted of silica (SiO₂) layers and titania (TiO₂) layers alternately laminated (total: 30 layers) was formed on one surface of the resulting base material, and further, a dielectric multilayer film (X) constituted of silica (SiO₂) layers and titania (TiO₂) layers alternately laminated (total: 20 layers) was formed on the other surface of the base material, whereby an optical filter having a thickness of about 0.210 mm was obtained. Designing of the dielectric multilayer films was carried out by the use of the same design parameters as in Example 1 taking into consideration the dependence of the base material refractive index on the wavelength similarly to Example 1.

Spectral transmittances and reflectances of this optical filter were measured, and optical properties in each wavelength region were evaluated. The results are set forth in Table 15.

Comparative Example 1

A base material was prepared in the same manner as in Example 1, except that the compounds (A) were not used. Subsequently, in the same manner as in Example 1, a dielectric multilayer film (XI) constituted of silica (SiO$_2$) layers and titania (TiO$_2$) layers alternately laminated (total: 32 layers) was formed on one surface of the resulting base material, and further, a dielectric multilayer film (XII) constituted of silica (SiO$_2$) layers and titania (TiO$_2$) layers alternately laminated (total: 20 layers) was formed on the other surface of the base material, whereby an optical filter having a thickness of about 0.106 mm was obtained. Designing of the dielectric multilayer films was carried out by the use of design parameters described in Table 14 taking into consideration the dependence of the base material refractive index on the wavelength.

Figure 10:
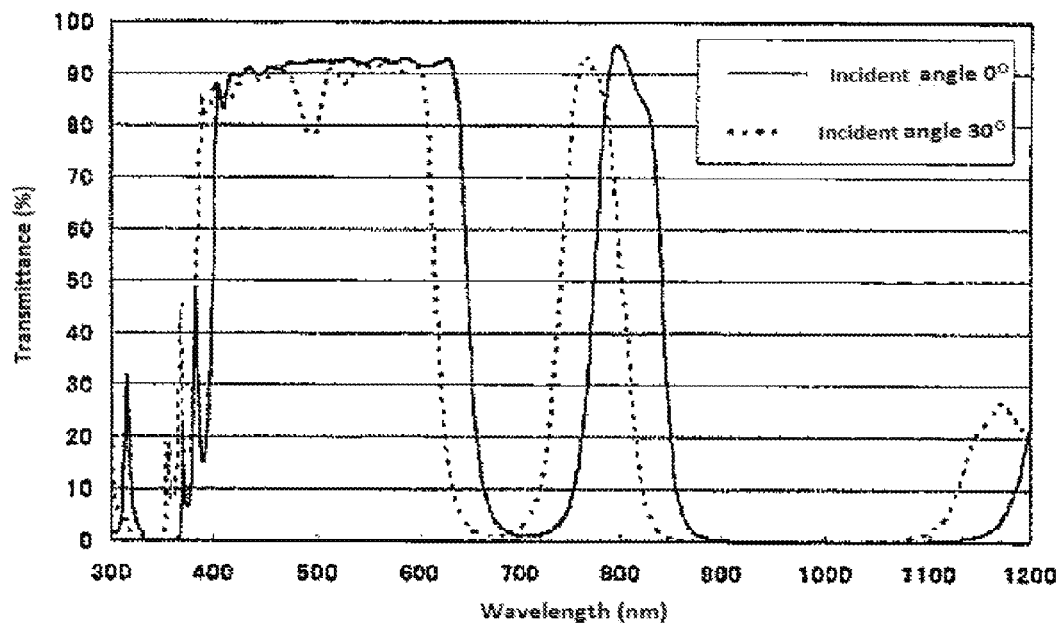
FIG. 10 is a spectral transmission spectrum of an optical filter obtained in Comparative Example 1.
Figure 11:
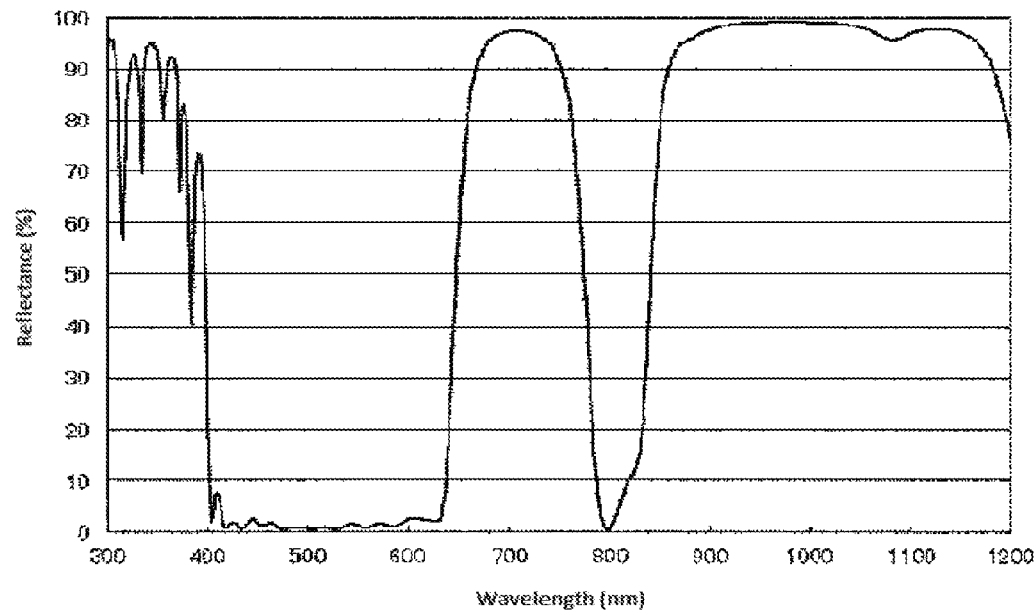
FIG. 11 is a spectral reflection spectrum of an optical filter obtained in Comparative Example 1.

Spectral transmittances and reflectances of this optical filter were measured, and optical properties in each wavelength region were evaluated. The results are set forth in FIG. 10, FIG. 11 and Table 15.

TABLE 14

| Dielectric multilayer film | Wavelength (nm) | Incident Angle | Required Value | Target Tolerance | Type |
|---|---|---|---|---|---|
| (XI) | 400~635 | 0 | 100 | 1 | Transmittance |
| | 640~765 | 0 | 0 | 0.7 | Transmittance |
| | 770~840 | 0 | 100 | 0.5 | Transmittance |
| (XII) | 400~700 | 0 | 100 | 1 | Transmittance |
| | 770~840 | 0 | 100 | 0.5 | Transmittance |
| | 845~1200 | 0 | 0 | 0.5 | Transmittance |

Input parameter into software

Comparative Example 2

As a base material, a near-infrared absorbing glass support "BS-6 (thickness: 210 μm)" (available from Matsunami Glass Ind., Ltd.) was used. Spectral transmittances of this base material were measured, and (Ta), (Tb) and (Xc) were determined. The results are set forth in Table 15.

A dielectric multilayer film (XIII) constituted of silica (SiO$_2$) layers and titania (TiO$_2$) layers alternately laminated (total: 30 layers) was formed on one surface of a base material and a dielectric multilayer film (XIV) constituted of silica (SiO$_2$) layers and titania (TiO$_2$) layers alternately laminated (total: 20 layers) was formed on the other surface of the base material in the same manner as in Example 1, except that the above base material was used, whereby an optical filter having a thickness of about 0.216 mm was obtained. Designing of the dielectric multilayer films was carried out by the use of the same design parameters as in Example 1 taking into consideration the dependence of the base material refractive index on the wavelength.

Figure 12:
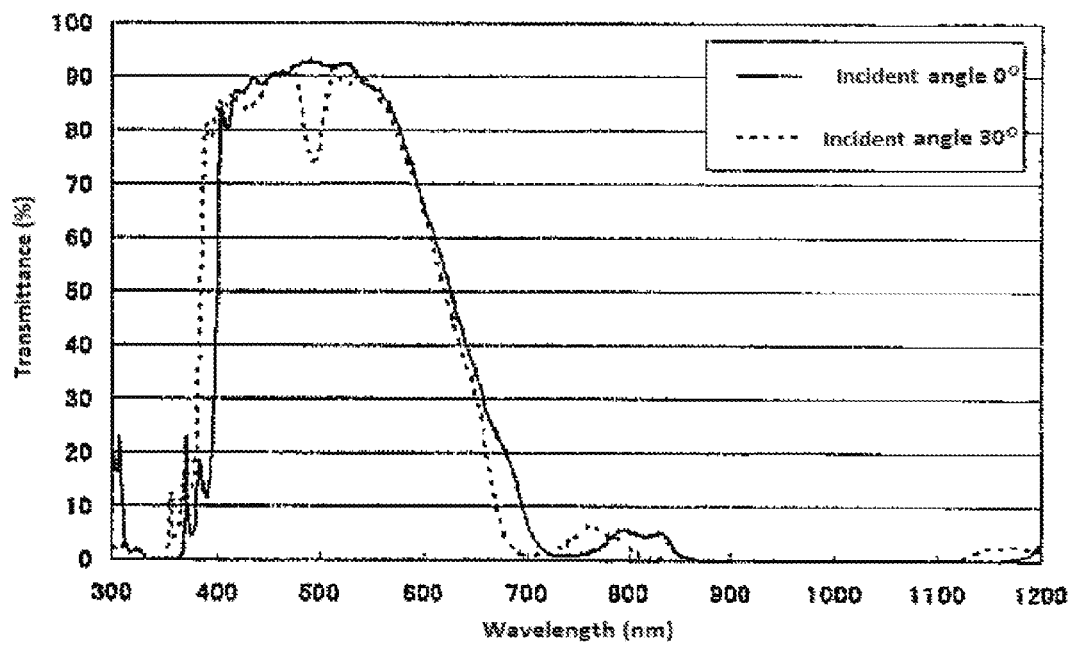
FIG. 12 is a spectral transmission spectrum of an optical filter obtained in Comparative Example 2.
Figure 13:
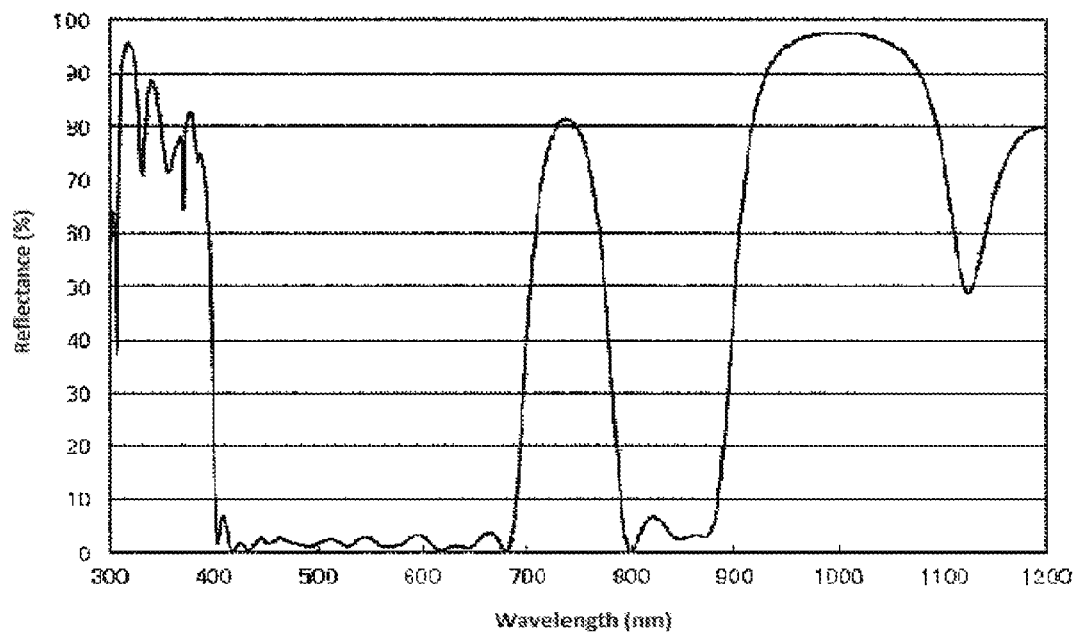
FIG. 13 is a spectral reflection spectrum of an optical filter obtained in Comparative Example 2.

Spectral transmittances of this optical filter were measured, and optical properties in each wavelength region were evaluated. The results are set forth in FIG. 12, FIG. 13 and Table 15.

Comparative Example 3

A base material was prepared in the same manner as in Example 2, except that 0.05 part of a cyanine compound (absorption maximum wavelength in dichloromethane: 996 nm) represented by the following formula (x-1) was used instead of the compounds (A). Spectral transmittances of this base material were measured, and (Ta), (Tb), (Xc) and (Xf) were determined. The results are set forth in Table 15.

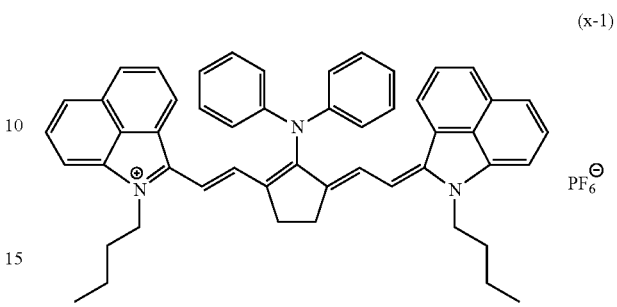

(x-1)

Subsequently, in the same manner as in Example 1, a dielectric multilayer film (XV) constituted of silica (SiO$_2$) layers and titania (TiO$_2$) layers alternately laminated (total: 30 layers) was formed on one surface of the resulting base material, and further, a dielectric multilayer film (XVI) constituted of silica (SiO$_2$) layers and titania (TiO$_2$) layers alternately laminated (total: 20 layers) was formed on the other surface of the base material, whereby an optical filter having a thickness of about 0.106 mm was obtained. Designing of the dielectric multilayer films was carried out by the use of the same design parameters as in Example 1 taking into consideration the dependence of the base material refractive index on the wavelength, etc.

Spectral transmittances and reflectances of this optical filter were measured, and optical properties in each wavelength region were evaluated. The results are set forth in Table 15.

Comparative Example 4

A base material was prepared in the same manner as in Example 1, except that 0.05 part of a compound (absorption maximum wavelength in dichloromethane: 550 nm) represented by the following formula (x-2) was used instead of the compounds (A). Spectral transmittances of this base material were measured, and (Ta), (Tb) and (Xc) were determined. The results are set forth in Table 15.

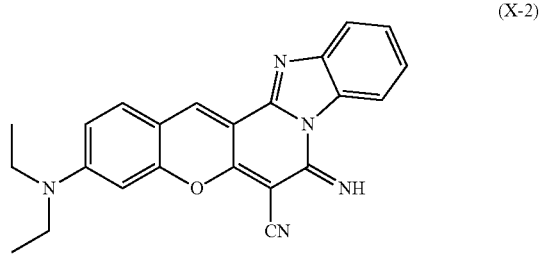 [SMILES: CCN(CC)c1ccc2cc3c(oc2c1)c(C#N)c(=N)n1c2ccccc2nc31]

(X-2)

Subsequently, in the same manner as in Example 1, a dielectric multilayer film (XVII) constituted of silica (SiO$_2$) layers and titania (TiO$_2$) layers alternately laminated (total: 30 layers) was formed on one surface of the resulting base material, and further, a dielectric multilayer film (XVIII) constituted of silica (SiO$_2$) layers and titania (TiO$_2$) layers alternately laminated (total: 20 layers) was formed on the other surface of the base material, whereby an optical filter having a thickness of about 0.106 mm was obtained. Designing of the dielectric multilayer films was carried out by the use of the same design parameters as in Example 1 taking into consideration the dependence of the base material refractive index on the wavelength, etc.

Spectral transmittances and reflectances of this optical filter were measured, and optical properties in each wavelength region were evaluated. The results are set forth in Table 15.

Comparative Example 5

A dielectric multilayer film (XIX) constituted of silica ($SiO_2$) layers and titania ($TiO_2$) layers alternately laminated (total: 30 layers) was formed on one surface of a base material and a dielectric multilayer film (XX) constituted of silica ($SiO_2$) layers and titania ($TiO_2$) layers alternately laminated (total: 20 layers) was formed on the other surface of the base material in the same manner as in Example 1, except that a glass support "OA-10G (thickness: 200 μm)" (available from Nippon Electric Glass Co., Ltd.) was used, whereby an optical filter having a thickness of about 0.206 mm was obtained. Designing of the dielectric multilayer films was carried out by the use of the same design parameters as in Example 1 taking into consideration the dependence of the base material refractive index on the wavelength.

Spectral transmittances and reflectances of this optical filter were measured, and optical properties in each wavelength region were evaluated. The results are set forth in Table 15.

Examples 6 to 17

Base materials and optical filters were prepared in the same manner as in Example 2, except that the resin, the compounds (A), the solvent, and the drying conditions for the transparent resin substrate were changed as shown in Table 15. Optical properties of the resulting base materials and optical filters are set forth in Table 15.

Example 18

In Example 18, an optical filter (Y=858 nm) which had a base material formed of a transparent resin substrate having resin layers on both surfaces and had a near-infrared ray selective passband in the vicinity of wavelengths of 830 to 880 nm was prepared.

A base material having resin layers on both surfaces of a transparent resin substrate containing the compound (S) was obtained in the same manner under the same conditions as those in Example 3, except that 0.03 part of the compound (s-5) (absorption maximum wavelength in dichloromethane: 770 nm) described in the aforesaid Table 9 was used instead of the compounds (a-16) and (b-3).

Spectral transmittances of this base material were measured, and (Ta), (Tb), (Xc) and (Xf) were determined. The results are set forth in Table 15.

Subsequently, in the same manner as in Example 3, a dielectric multilayer film (XXI) was formed on one surface of the resulting base material, and further, a dielectric multilayer film (XXII) was formed on the other surface of the base material, whereby an optical filter having a thickness of about 0.106 mm was obtained. Designing of the dielectric multilayer films was carried out by the use of the same design parameters as in Example 3 taking into consideration the dependence of the base material refractive index on the wavelength.

Spectral transmittances and reflectances of this optical filter were measured, and optical properties in each wavelength region were evaluated. The results are set forth in Table 15.

Example 19

In Example 19, an optical filter (Y=859 nm) which had a base material formed of a transparent resin substrate having resin layers on both surfaces and had a near-infrared ray selective passband in the vicinity of wavelengths of 830 to 880 nm was prepared.

A transparent resin substrate containing the compound (S) and the compounds (A) was obtained in the same manner under the same conditions as those in Example 18, except that 0.02 part of the compound (a-17) and 0.05 part of the compound (b-39) were used as the compounds (A) in addition to 0.03 part of the compound (s-5).

Subsequently, in the same manner as in Example 3, a dielectric multilayer film (XXIII) was formed on one surface of the resulting base material, and further, a dielectric multilayer film (XXIV) was formed on the other surface of the base material, whereby an optical filter having a thickness of about 0.110 mm was obtained. Designing of the dielectric multilayer films was carried out by the use of the same design parameters as in Example 3 taking into consideration the dependence of the base material refractive index on the wavelength.

Spectral transmittances and reflectances of this optical filter were measured, and optical properties in each wavelength region were evaluated. The results are set forth in Table 15.

Example 20

In Example 20, an optical filter (Y=859 nm) which had a base material formed of a transparent resin substrate having resin layers on both surfaces and had a near-infrared ray selective passband in the vicinity of wavelengths of 830 to 880 nm was prepared.

A transparent resin substrate containing the compound (S) and the compounds (A) was obtained in the same manner under the same conditions as those in Example 3, except that instead of the compounds (a-16) and (b-3), 0.03 part of the compound (s-8) (absorption maximum wavelength in dichloromethane: 776 nm) of the aforesaid Table 9 as the compound (S) and 0.03 part of the compound (a-16) and 0.03 part of the compound (b-3) as the compounds (A) were used.

Subsequently, in the same manner as in Example 3, a dielectric multilayer film (XXV) was formed on one surface of the resulting base material, and further, a dielectric multilayer film (XXVI) was formed on the other surface of the base material, whereby an optical filter having a thickness of about 0.110 mm was obtained. Designing of the dielectric multilayer films was carried out by the use of the same design parameters as in Example 3 taking into consideration the dependence of the base material refractive index on the wavelength.

Spectral transmittances and reflectances of this optical filter were measured, and optical properties in each wavelength region were evaluated. The results are set forth in Table 15.

Example 21

In Example 21, an optical filter (Y=860 nm) which had a base material formed of a transparent resin substrate having resin layers on both surfaces and had a near-infrared ray selective passband in the vicinity of wavelengths of 830 to 880 nm was prepared.

A transparent resin substrate containing the compound (S) and the compounds (A) was obtained in the same manner under the same conditions as those in Example 3, except that instead of the compounds (a-16) and (b-3), 0.03 part of the compound (s-8) of the aforesaid Table 9 as the compound (S) and 0.03 part of the compound (a-22) and 0.04 part of the compound (b-16) as the compounds (A) were used.

Subsequently, in the same manner as in Example 3, a dielectric multilayer film (XXVII) was formed on one surface of the resulting base material, and further, a dielectric multilayer film (XXVIII) was formed on the other surface of the base material, whereby an optical filter having a thickness of about 0.110 mm was obtained. Designing of the dielectric multilayer films was carried out by the use of the same design parameters as in Example 3 taking into consideration the dependence of the base material refractive index on the wavelength.

Spectral transmittances and reflectances of this optical filter were measured, and optical properties in each wavelength region were evaluated. The results are set forth in Table 15.

Constitution of the base materials, various compounds, etc. applied to the examples and the comparative examples are as follows.

<Form of Base Material>
Form (1): a transparent resin substrate containing a compound (Z)
Form (2): a transparent resin substrate containing a compound (Z) and having resin layers on both surfaces
Form (3): a resin support having, on both surfaces, transparent resin layers containing a compound (Z)
Form (4): a glass support having, on one surface, a transparent resin layer containing a compound (Z)
Form (5): a resin support containing no compound (Z) (comparative example)
Form (6): a near-infrared absorbing glass support (comparative example)
Form (7): a resin support containing other coloring matter (X) and having resin layers on both surfaces (comparative example)
Form (8): a resin support containing other coloring matter (X) (comparative example)
Form (9): a glass support (comparative example)
<Transparent Resin>
Resin A: cyclic olefin resin (Resin Synthesis Example 1)
Resin B: aromatic polyether resin (Resin Synthesis Example 2)
Resin C: polyimide resin (Resin Synthesis Example 3)
Resin D: fluorene polycarbonate resin (Resin Synthesis Example 4)
Resin E: fluorene polyester resin (Resin Synthesis Example 5)
Resin F: fluorinated polyether ketone (Resin Synthesis Example 6)
Resin G: cyclic olefin resin "Zeonor 1420R" (available from Zeon Corporation)
Resin H: cyclic olefin resin "APEL #6015" (available from Mitsui Chemicals, Inc.)
Resin I: polycarbonate resin "PURE-ACE" (available from TETJIN LIMITED)
Resin J: polyether sulfone resin "Sumilite FS-1300" (available from Sumitomo Bakelite Co., Ltd.)
Resin K: heat-resistant acrylic resin "ACRYVIEWA" (available from Nippon Shokubai Co., Ltd.)
<Glass Support>
Glass support (1): transparent glass support "OA-10G (thickness: 200 μm)" (available from Nippon Electric Glass Co., Ltd.) having been cut into size of length of 60 mm and width of 60 mm
Glass support (2): near-infrared absorbing glass support "BS-6 (thickness: 210 μm)" (available from Matsunami Glass Ind., Ltd.) having been cut into size of length of 60 mm and width of 60 mm
<<Compound (A)>>
Compound (a-16): compound (a-16) described in the aforesaid Table 1 (absorption maximum wavelength in dichloromethane: 698 nm)
Compound (a-17): compound (a-17) described in the aforesaid Table 1 (absorption maximum wavelength in dichloromethane: 703 nm)
Compound (a-22): compound (a-22) described in the aforesaid Table 2 (absorption maximum wavelength in dichloromethane: 670 nm)
Compound (b-3): compound (b-3) described in the aforesaid Table 4 (absorption maximum wavelength in dichloromethane: 733 nm)
Compound (b-16): compound (b-16) described in the aforesaid Table 4 (absorption maximum wavelength in dichloromethane: 688 nm)
Compound (b-39): compound (b-39) described in the aforesaid Table 6 (absorption maximum wavelength in dichloromethane: 736 nm)
<<Compound (S)>>
Compound (s-5): compound (s-5) described in the aforesaid Table 9 (absorption maximum wavelength in dichloromethane: 770 nm)
Compound (s-8): compound (s-8) described in the aforesaid Table 9 (absorption maximum wavelength in dichloromethane: 776 nm)
<<Other Coloring Matter (X)>>
Other coloring matter (x-1): cyanine compound represented by the aforesaid formula (x-1) (absorption maximum wavelength in dichloromethane: 996 nm)
Other coloring matter (x-2): compound represented by the aforesaid formula (x-2) (absorption maximum wavelength in dichloromethane: 550 nm)
<Solvent>
Solvent (1): methylene chloride
Solvent (2): N,N-dimethylacetamide
Solvent (3): ethyl acetate/toluene (ratio by weight: 5/5)
Solvent (4): cyclohexane/xylene (ratio by weight: 7/3)
Solvent (5): cyclohexane/methylene chloride (ratio by weight: 99/1)
Solvent (6): N-methyl-2-pyrrolidone
<Drying Conditions for Transparent Resin Substrate and Resin Support>
The drying conditions for the transparent resin substrates and the resin supports of the examples and the comparative examples in Table 15 are as follows. The coating film was peeled from the glass plate before drying under reduced pressure.
Conditions (1): 20° C./8 hr→under reduced pressure 100° C./8 hr
Conditions (2): 60° C./8 hr→80° C./8 hr→under reduced pressure 140° C./8 hr
Conditions (3): 60° C./8 hr→80° C./8 hr→under reduced pressure 100° C./24 hr
Conditions (4): 40° C./4 hr→60° C./4 hr→under reduced pressure 100° C./8 hr <Resin Layer-Forming Composition>
Resin compositions for forming resin layers in the examples of Table 15 are as follows.

Resin composition (1): tricyclodecane dimethanol acrylate 60 parts by weight, dipentaerythritol hexaacrylate 40 parts by weight, 1-hydroxycyclohexyl phenyl ketone 5 parts by weight, methyl ethyl ketone (solvent), TSC: 30%

Resin composition (2): tricyclodecane dimethanol acrylate 100 parts by weight, 1-hydroxycyclohexyl phenyl ketone 4 parts by weight, 0.8 part by weight of compound (a-16) described in the aforesaid Table 1, 0.7 part by weight of compound (b-3) described in the aforesaid Table 4, methyl ethyl ketone (solvent), TSC: 25%

Resin composition (3): tricyclodecane dimethanol acrylate 20 parts by weight, dipentaerythritol hexaacrylate 80 parts by weight, 1-hydroxycyclohexyl phenyl ketone 4 parts by weight, 1.4 parts by weight of compound (a-16) described in the aforesaid Table 1, 1.4 parts by weight of compound (b-3) described in the aforesaid Table 4, methyl ethyl ketone (solvent), TSC: 35%

TABLE 15

| | | | | Ex. 1 | Ex. 2 | Ex. 3 | Ex. 4 | Ex. 5 | Ex. 6 | Ex. 7 |
|---|---|---|---|---|---|---|---|---|---|---|
| Base material constitution | | Form of base material | | (1) | (2) | (2) | (3) | (4) | (2) | (2) |
| | Formulation of transparent resin substrate or resin support | Transparent resin (weight part(s)) | Resin A | 100 | 100 | 100 | 100 | | 100 | 100 |
| | | | Resin B | | | | | | | |
| | | | Resin C | | | | | | | |
| | | | Resin D | | | | | | | |
| | | | Resin E | | | | | | | |
| | | | Resin F | | | | | | | |
| | | | Resin G | | | | | | | |
| | | | Resin H | | | | | | | |
| | | | Resin I | | | | | | | |
| | | | Resin J | | | | | | | |
| | | | Resin K | | | | | | | |
| | | Compound (A) (weight part(s)) | a-16 | 0.03 | | 0.03 | | | | |
| | | | a-17 | | 0.04 | | | | | 0.03 |
| | | | a-22 | | | | | | 0.03 | |
| | | | b-3 | 0.03 | | 0.03 | | | | 0.02 |
| | | | b-16 | | | | | | 0.04 | |
| | | | b-39 | | 0.08 | | | | | 0.05 |
| | | Compound (S) (weight part(s)) | s-5 | | | | | | | |
| | | | s-8 | | | | | | | |
| | | Other coloring matter (X) (weight part(s)) | x-1 | | | | | | | |
| | | | x-2 | | | | | | | |
| | | Solvent | | (1) | (1) | (1) | (1) | (1) | (1) | (1) |
| | Drying conditions | | | (1) | (1) | (1) | (1) | (1) | (1) | (1) |
| | Glass support | | | — | — | — | — | (1) | — | — |
| | (Transparent) resin layer-forming composition | | | — | (1) | (1) | (2) | (3) | (1) | — |
| Base material optical properties | Ta (%) | | | 1 | 1 | 1 | 1 | 2 | 1 | 1 |
| | Tb (%) | | | 45 | 17 | 45 | 44 | 44 | 86 | 25 |
| | Xc (nm) | | | 641 | 637 | 641 | 642 | 643 | 632 | 636 |
| | Xf (nm) | | | 752 | 769 | 752 | 753 | 753 | 711 | 765 |
| Dielectric multilayer film (both-side constitution) | Number of layers on one side | | | 30 | 30 | 30 | 30 | 30 | 30 | 30 |
| | Number of layers on one side | | | 20 | 20 | 20 | 20 | 20 | 20 | 20 |
| Optical properties of optical filter | Mean value of transmittances in wavelength region of 430 to 580 nm (%) | | | 88 | 89 | 89 | 88 | 87 | 87 | 89 |
| | Minimum transmittance in Za (%) | | | <1 | <1 | <1 | <1 | <1 | <1 | <1 |
| | Maximum transmittance in Zb (%) | | | 91 | 89 | 91 | 90 | 89 | 90 | 89 |
| | Minimum transmittance in Zc (%) | | | <1 | <1 | <1 | <1 | <1 | <1 | <1 |
| | Xa (nm) | | | 778 | 780 | 833 | 777 | 778 | 780 | 779 |
| | Xb (nm) | | | 842 | 842 | 894 | 843 | 844 | 842 | 842 |
| | Y (nm) | | | 810 | 811 | 864 | 810 | 811 | 811 | 811 |
| | Mean transmittance in Y − 10 nm to Y + 10 nm (%) | | | 85 | 84 | 86 | 85 | 84 | 85 | 85 |
| | Mean reflectance in Y − 10 nm to Y + 10 nm (%) | | | 8 | 8 | 9 | 8 | 8 | 8 | 9 |
| | \| Xd-Xe \| (nm) | | | 3 | 3 | 4 | 4 | 4 | 4 | 3 |
| | \| Xa-Xa' \| (nm) | | | 23 | 7 | 37 | 24 | 23 | 34 | 11 |

| | | | | Ex. 8 | Ex. 9 | Ex. 10 | Ex. 11 | Ex. 12 | Ex. 13 | Ex. 14 |
|---|---|---|---|---|---|---|---|---|---|---|
| Base material constitution | | Form of base material | | (2) | 2) | (2) | (2) | (2) | (2) | (2) |
| | Formulation of transparent resin substrate or resin support | Transparent resin (weight part(s)) | Resin A | | | | | | | |
| | | | Resin B | 100 | | | | | | |
| | | | Resin C | | 100 | | | | | |
| | | | Resin D | | | 100 | | | | |
| | | | Resin E | | | | 100 | | | |
| | | | Resin F | | | | | 100 | | |
| | | | Resin G | | | | | | 100 | |
| | | | Resin H | | | | | | | 100 |
| | | | Resin I | | | | | | | |
| | | | Resin J | | | | | | | |
| | | | Resin K | | | | | | | |

TABLE 15-continued

| | | | | | | | | | |
|---|---|---|---|---|---|---|---|---|---|
| | | Compound (A) (weight part(s)) | a-16 | 0.03 | 0.03 | 0.03 | 0.03 | 0.03 | 0.03 | 0.03 |
| | | | a-17 | | | | | | | |
| | | | a-22 | | | | | | | |
| | | | b-3 | 0.03 | 0.03 | 0.03 | 0.03 | 0.03 | 0.03 | 0.03 |
| | | | b-16 | | | | | | | |
| | | | b-39 | | | | | | | |
| | | Compound (S) (weight part(s)) | s-5 | | | | | | | |
| | | | s-8 | | | | | | | |
| | | Other coloring matter (X) (weight part(s)) | x-1 | | | | | | | |
| | | | x-2 | | | | | | | |
| | | Solvent | | (2) | (2) | (1) | (1) | (3) | (4) | (5) |
| | Drying conditions | | | (2) | (2) | (1) | (1) | (2) | (3) | (4) |
| | Glass support | | | — | — | — | — | — | — | — |
| | (Transparent) resin layer-forming composition | | | (1) | (1) | (1) | (1) | (1) | (1) | (1) |
| Base material optical properties | Ta (%) | | | 1 | 2 | 1 | 1 | 1 | 1 | 1 |
| | Tb (%) | | | 39 | 37 | 41 | 39 | 40 | 46 | 45 |
| | Xc (nm) | | | 645 | 646 | 644 | 645 | 644 | 641 | 642 |
| | Xf (nm) | | | 756 | 757 | 755 | 755 | 756 | 751 | 752 |
| Dielectric multilayer film (both-side constitution) | Number of layers on one side | | | 30 | 30 | 30 | 30 | 30 | 30 | 30 |
| | Number of layers on one side | | | 20 | 20 | 20 | 20 | 20 | 20 | 20 |
| Optical properties of optical filter | Mean value of transmittances in wavelength region of 430 to 580 nm (%) | | | 86 | 86 | 87 | 87 | 87 | 88 | 87 |
| | Minimum transmittance in Za (%) | | | <1 | <1 | <1 | <1 | <1 | <1 | <1 |
| | Maximum transmittance in Zb (%) | | | 86 | 86 | 87 | 87 | 86 | 89 | 88 |
| | Minimum transmittance in Zc (%) | | | <1 | <1 | <1 | <1 | <1 | <1 | <1 |
| | Xa (nm) | | | 778 | 780 | 778 | 779 | 780 | 777 | 778 |
| | Xb (nm) | | | 842 | 844 | 844 | 845 | 844 | 841 | 840 |
| | Y (nm) | | | 810 | 812 | 811 | 812 | 812 | 809 | 809 |
| | Mean transmittance in Y − 10 nm to Y + 10 nm (%) | | | 81 | 80 | 82 | 81 | 80 | 83 | 82 |
| | Mean reflectance in Y − 10 nm to Y + 10 nm (%) | | | 9 | 9 | 8 | 8 | 8 | 8 | 8 |
| | \|Xd-Xe\| (nm) | | | 5 | 4 | 5 | 4 | 4 | 3 | 4 |
| | \|Xa-Xa'\| (nm) | | | 18 | 17 | 20 | 19 | 19 | 24 | 23 |

| | | | | Ex. 15 | Ex. 16 | Ex. 17 | Ex. 18 | Ex. 19 | Ex. 20 | Ex. 21 |
|---|---|---|---|---|---|---|---|---|---|---|
| | | Form of base material | | (2) | (2) | (2) | (2) | (2) | (2) | (2) |
| Base material constitution | Formulation of transparent resin substrate or resin support | Transparent resin (weight part(s)) | Resin A | | | | 100 | 100 | 100 | 100 |
| | | | Resin B | | | | | | | |
| | | | Resin C | | | | | | | |
| | | | Resin D | | | | | | | |
| | | | Resin E | | | | | | | |
| | | | Resin F | | | | | | | |
| | | | Resin G | | | | | | | |
| | | | Resin H | | | | | | | |
| | | | Resin I | 100 | | | | | | |
| | | | Resin J | | 100 | | | | | |
| | | | Resin K | | | 100 | | | | |
| | | Compound (A) (weight part(s)) | a-16 | 0.03 | 0.03 | 0.03 | | | 0.03 | |
| | | | a-17 | | | | | 0.02 | | |
| | | | a-22 | | | | | | | 0.03 |
| | | | b-3 | 0.03 | 0.03 | 0.03 | | | 0.03 | |
| | | | b-16 | | | | | | | 0.04 |
| | | | b-39 | | | | | 0.05 | | |
| | | Compound (S) (weight part(s)) | s-5 | | | | 0.03 | 0.03 | | |
| | | | s-8 | | | | | | 0.03 | 0.03 |
| | | Other coloring matter (X) (weight part(s)) | x-1 | | | | | | | |
| | | | x-2 | | | | | | | |
| | | Solvent | | (1) | (6) | (1) | (1) | (1) | (1) | (1) |
| | Drying conditions | | | (1) | (2) | (1) | (1) | (1) | (1) | (1) |
| | Glass support | | | — | — | — | — | — | — | — |
| | (Transparent) resin layer-forming composition | | | (1) | (1) | (1) | (1) | (1) | (1) | (1) |
| Base material optical properties | Ta (%) | | | 1 | 2 | 1 | 31 | 1 | 1 | 1 |
| | Tb (%) | | | 39 | 33 | 47 | 2 | 1 | 1 | 2 |
| | Xc (nm) | | | 645 | 650 | 641 | 688 | 648 | 640 | 631 |
| | Xf (nm) | | | 756 | 759 | 751 | 804 | 804 | 809 | 808 |
| Dielectric multilayer film (both-side constitution) | Number of layers on one side | | | 30 | 30 | 30 | 30 | 30 | 30 | 30 |
| | Number of layers on one side | | | 20 | 20 | 20 | 20 | 20 | 20 | 20 |
| Optical properties of optical filter | Mean value of transmittances in wavelength region of 430 to 580 nm (%) | | | 87 | 86 | 88 | 90 | 89 | 88 | 86 |
| | Minimum transmittance in Za (%) | | | <1 | <1 | <1 | <1 | <1 | <1 | <1 |
| | Maximum transmittance in Zb (%) | | | 86 | 86 | 89 | 92 | 91 | 90 | 90 |
| | Minimum transmittance in Zc (%) | | | <1 | <1 | <1 | <1 | <1 | <1 | <1 |

TABLE 15-continued

|  |  |  |  |  |  |  |  |  |
|---|---|---|---|---|---|---|---|---|
| | | Xa (nm) | | 778 | 780 | 778 | 822 | 822 | 823 | 824 |
| | | Xb (nm) | | 842 | 846 | 843 | 894 | 895 | 894 | 896 |
| | | Y (nm) | | 810 | 813 | 811 | 858 | 859 | 859 | 860 |
| | | Mean transmittance in Y − 10 nm to Y + 10 nm (%) | | 81 | 82 | 85 | 88 | 87 | 87 | 85 |
| | | Mean reflectance in Y − 10 nm to Y + 10 nm (%) | | 9 | 9 | 8 | 6 | 7 | 6 | 7 |
| | | \| Xd-Xe \| (nm) | | 5 | 5 | 4 | 22 | 3 | 3 | 4 |
| | | \| Xa-Xa' \| (nm) | | 18 | 15 | 25 | 18 | 18 | 14 | 15 |

| | | | | Comp. Ex. 1 | Comp. Ex. 2 | Comp. Ex. 3 | Comp. Ex. 4 | Comp. Ex. 5 |
|---|---|---|---|---|---|---|---|---|
| Base material constitution | Formulation of transparent resin substrate or resin support | Form of base material | | (5) | (6) | (7) | (8) | (9) |
| | | Transparent resin (weight part(s)) | Resin A | 100 | | 100 | 100 | |
| | | | Resin B | | | | | |
| | | | Resin C | | | | | |
| | | | Resin D | | | | | |
| | | | Resin E | | | | | |
| | | | Resin F | | | | | |
| | | | Resin G | | | | | |
| | | | Resin H | | | | | |
| | | | Resin I | | | | | |
| | | | Resin J | | | | | |
| | | | Resin K | | | | | |
| | | Compound (A) (weight part(s)) | a-16 | | | | | |
| | | | a-17 | | | | | |
| | | | a-22 | | | | | |
| | | | b-3 | | | | | |
| | | | b-16 | | | | | |
| | | | b-39 | | | | | |
| | | Compound (S) (weight part(s)) | s-5 | | | | | |
| | | | s-8 | | | | | |
| | | Other coloring matter (X) (weight part(s)) | x-1 | | | 0.05 | | |
| | | | x-2 | | | | 0.05 | |
| | | Solvent | | (1) | — | (1) | (1) | — |
| | Drying conditions | | | (1) | — | (1) | (1) | — |
| | Glass support | | | — | (2) | — | — | (1) |
| | (Transparent) resin layer-forming composition | | | — | — | (1) | — | — |
| Base material optical properties | Ta (%) | | | 91 | 4 | 3 | 2 | 91 |
| | Tb (%) | | | 91 | 4 | 3 | 91 | 91 |
| | Xc (nm) | | | — | 625 | 843 | 606 | — |
| | Xf (nm) | | | — | — | 1032 | — | — |
| Dielectric multilayer film (both-side constitution) | Number of layers on one side | | | 32 | 30 | 30 | 30 | 30 |
| | Number of layers on one side | | | 20 | 20 | 20 | 20 | 20 |
| Optical properties of optical filter | Mean value of transmittances in wavelength region of 430 to 580 nm (%) | | | 91 | 90 | 79 | 31 | 91 |
| | Minimum transmittance in Za (%) | | | 1 | — | <1 | <1 | 1 |
| | Maximum transmittance in Zb (%) | | | 95 | — | 63 | 95 | 93 |
| | Minimum transmittance in Zc (%) | | | <1 | — | <1 | <1 | <1 |
| | Xa (nm) | | | 776 | — | 780 | 776 | 777 |
| | Xb (nm) | | | 839 | — | 841 | 839 | 840 |
| | Y (nm) | | | 808 | — | 811 | 808 | 809 |
| | Mean transmittance in Y − 10 nm to Y + 10 nm (%) | | | 90 | — | 56 | 90 | 89 |
| | Mean reflectance in Y − 10 nm to Y + 10 nm (%) | | | 7 | — | 8 | 7 | 7 |
| | \| Xd-Xe \| (nm) | | | 28 | 3 | 27 | 27 | 28 |
| | \| Xa-Xa' \| (nm) | | | 35 | — | 34 | 35 | 36 |

The optical filter of the embodiments of the present invention can be preferably used for digital still camera, camera for smartphone, camera for cellular phone, digital video camera, camera for wearable device, PC camera, surveillance camera, camera for automobile, infrared camera, motion capture, laser range finder, virtual fitting, number plate recognition device, TV, car navigation system, personal digital assistant, personal computer, video game console, handheld game console, fingerprint authentication system, digital music player, etc.

Obviously, numerous modifications and variations of the present invention are possible in light of the above teachings. It is therefore to be understood that within the scope of the appended claims, the invention may be practiced otherwise than as specifically described herein.

The invention claimed is:

1. An optical filter comprising:
   a base material (i) which comprises a transparent resin layer comprising a compound (Z) having an absorption maximum in the wavelength region of from 600 to 850 nm; and
   a dielectric multilayer film provided on at least one surface of the base material (i),
   wherein said optical filter selectively transmits visible rays and a part of near-infrared rays, and said optical filter satisfies the requirements (a) and (b):
   (a) in the wavelength region of from 430 to 580 nm, a mean value of transmittances measured in the perpendicular direction to the optical filter is not less than 75%;

(b) the optical filter has a light stopband Za, a light passband Zb and a light stopband Zc, each of the light stopband Za, the light passband Zb and the light stopband Zc exists in the wavelength region of not less than 650 nm, the center wavelength of the light stopband Za is shorter than the center wavelength of the light passband Zb, the center wavelength of the light passband Zb is shorter than the center wavelength of the light stopband Zc, the minimum transmittance measured in the perpendicular direction to the optical filter in each of the light stopband Za and the light stopband Zc is not more than 15%, and the maximum transmittance measured in the perpendicular direction to the optical filter in the light passband Zb is not less than 55%.

2. The optical filter as claimed in claim 1, further satisfying the requirement (c):
(c) a difference Xb−Xa is from 5 to 150 nm, and a value of Y represented by Y=(Xa+Xb)/2 is from 750 to 950 nm, wherein Xa represents the shortest wavelength and Xb represents the longest wavelength among wavelengths at which the transmittance is 50% in the light passband Zb, measured in the perpendicular direction to the optical filter.

3. The optical filter as claimed in claim 1, wherein an absolute value |Xa−Xa'| is less than 25 nm, wherein Xa represents the shortest wavelength among wavelengths at which the transmittance is 50% in a transmittance curve in the light passband Zb, measured in the perpendicular direction to the optical filter, and Xa' represents a shortest wavelength among wavelengths at which a transmittance is 50% in the transmittance curve in the light passband Zb, measured at an angle of 30° to the perpendicular direction to the optical filter.

4. The optical filter as claimed in claim 2, wherein the mean transmittance measured in the perpendicular direction to the optical filter in the wavelength region of from Y−10 nm to Y+10 nm is not less than 60%.

5. The optical filter as claimed in claim 1, wherein the shortest wavelength (Xc) among wavelengths at which the transmittance measured in the perpendicular direction to the base material (i) becomes not more than 50% from more than 50% in the wavelength region of not less than 600 nm is from 610 to 670 nm.

6. The optical filter as claimed in claim 1, wherein the shortest wavelength (Xf) among wavelengths at which the transmittance measured in the perpendicular direction to the base material (i) becomes not less than 50% from less than 50% in the wavelength region of not less than 750 nm is from 770 to 900 nm.

7. The optical filter as claimed in claim 2, wherein dielectric multilayer films different in spectral properties are formed on both surfaces of the base material (i), and the mean reflectance measured from at least one surface of the optical filter in the wavelength region of from Y−10 nm to Y+10 nm is not more than 20%.

8. The optical filter as claimed in claim 1, wherein the compound (Z) is at least one compound selected from the group consisting of a squarylium compound, a phthalocyanine compound, a naphthalocyanine compound, a croconium compound, a hexaphyrin compound and a cyanine compound.

9. The optical filter as claimed in claim 1, wherein the compound (Z) is at least one compound selected from the group consisting of a compound (A) having an absorption maximum in a wavelength region of from 600 to 750 nm and a compound (S) having an absorption maximum in a wavelength region of from 750 to 850 nm.

10. The optical filter as claimed in claim 9, wherein the compound (A) is represented by formula (I) or (II):

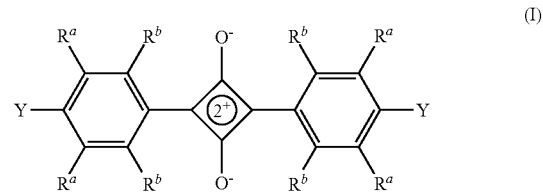

wherein $R^a$, $R^b$ and Y satisfy the condition (i) or (ii):
condition (i):
each $R^a$ is independently a hydrogen atom, a halogen atom, a sulfo group, a hydroxyl group, a cyano group, a nitro group, a carboxyl group, a phosphoric acid group, -$L^1$ or a —$NR^eR^f$ group, and $R^e$ and $R^f$ are each independently a hydrogen atom, -$L^a$, -$L^b$, -$L^c$, -$L^d$ or -$L^e$,
each $R^b$ is independently a hydrogen atom, a halogen atom, a sulfo group, a hydroxyl group, a cyano group, a nitro group, a carboxyl group, a phosphoric acid group, -$L^1$ or a —$NR^gR^h$ group, $R^g$ and $R^h$ are each independently a hydrogen atom, -$L^a$, -$L^b$, -$L^c$, -$L^d$, -$L^e$ or a —$C(O)R^i$ group, and $R^i$ represents -$L^a$, -$L^b$, -$L^c$, -$L^d$ or -$L^e$,
each Y is independently a —$NR^jR^k$ group, $R^j$ and $R^k$ are each independently a hydrogen atom, -$L^a$, -$L^b$, -$L^c$, -$L^d$ or -$L^e$,
$L^1$ is $L^a$, $L^b$, $L^c$, $L^d$, $L^e$, $L^f$, $L^g$ or $L^h$, and
$L^a$ to $L^h$ represent the following groups:
($L^a$) an aliphatic hydrocarbon group of 1 to 12 carbon atoms, which may have a substituent L,
($L^b$) a halogen-substituted alkyl group of 1 to 12 carbon atoms, which may have a substituent L,
($L^c$) an alicyclic hydrocarbon group of 3 to 14 carbon atoms, which may have a substituent L,
($L^d$) an aromatic hydrocarbon group of 6 to 14 carbon atoms, which may have a substituent L,
($L^e$) a heterocyclic group of 3 to 14 carbon atoms, which may have a substituent L,
($L^f$) an alkoxy group of 1 to 9 carbon atoms, which may have a substituent L,
($L^g$) an acyl group of 1 to 9 carbon atoms, which may have a substituent L,
($L^h$) an alkoxycarbonyl group of 1 to 9 carbon atoms, which may have a substituent L,
with the proviso that the substituent L is at least one kind selected from the group consisting of an aliphatic hydrocarbon group of 1 to 12 carbon atoms, a halogen-substituted alkyl group of 1 to 12 carbon atoms, an alicyclic hydrocarbon group of 3 to 14 carbon atoms, an aromatic hydrocarbon group of 6 to 14 carbon atoms, a heterocyclic group of 3 to 14 carbon atoms, a halogen atom, a sulfo group, a hydroxyl group, a cyano group, a nitro group, a carboxyl group, a phosphoric acid group and an amino group;
condition (ii):
at least one of two $R^a$ on one benzene ring and Y on the same benzene ring are bonded to each other to form a heterocyclic ring of 5 or 6 constituent atoms comprising at least one nitrogen atom, the heterocyclic ring may have a substituent, and $R^b$ and $R^a$ which does not take part in the formation of the heterocyclic ring are each independently as defined in the condition (i);

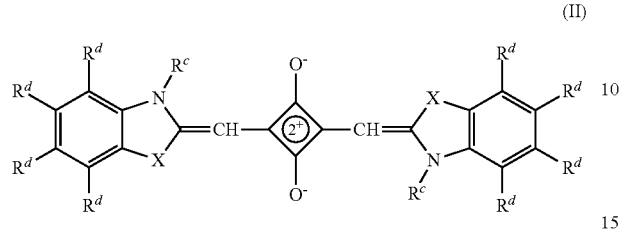

(II)

wherein each X is independently O, S, Se, N—$R^c$ or $C(R^dR^d)$, each $R^c$ is independently a hydrogen atom, $L^a$, $L^b$, $L^c$, $L^d$ or $L^e$, each $R^d$ is independently a hydrogen atom, a halogen atom, a sulfo group, a hydroxyl group, a cyano group, a nitro group, a carboxyl group, a phosphoric acid group, -$L^1$ or a —$NR^eR^f$ group, and neighboring $R^d$ and $R^d$ may be bonded to each other to form a ring which may have a substituent, and $L^a$ to $L^e$, $L^1$, $R^e$ and $R^f$ are each as defined in the formula (I).

11. The optical filter as claimed in claim 9, wherein the compound (S) is represented by formula (S1):

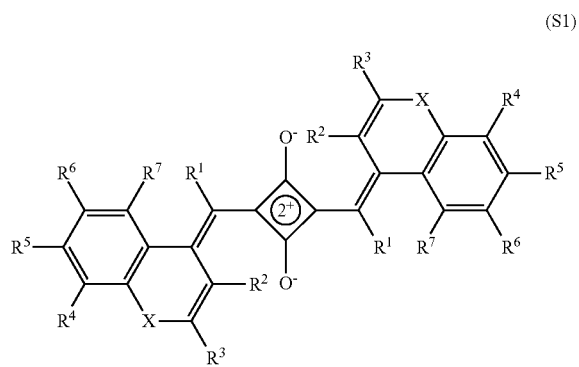

(S1)

wherein each X is independently an oxygen atom, a sulfur atom, a selenium atom or —NH—, $R^1$ to $R^7$ are each independently a hydrogen atom, a halogen atom, a sulfo group, a hydroxyl group, a cyano group, a nitro group, a carboxyl group, a phosphoric acid group, -$L^1$ or a —$NR^gR^h$ group, $R^g$ and $R^h$ are each independently a hydrogen atom, -$L^a$, -$L^b$, -$L^c$, -$L^d$, -$L^e$ or a —$C(O)R^i$ group, $R^i$ represents -$L^a$, -$L^b$, -$L^c$, -$L^d$ or -$L^e$, $L^1$ is $L^a$, $L^b$, $L^c$, $L^d$, $L^e$, $L^f$, $L^g$ or $L^h$, and $L^a$ to $L^h$ represent the following groups:

($L^a$) an aliphatic hydrocarbon group of 1 to 12 carbon atoms, which may have a substituent L, ($L^b$) a halogen-substituted alkyl group of 1 to 12 carbon atoms, which may have a substituent L, ($L^c$) an alicyclic hydrocarbon group of 3 to 14 carbon atoms, which may have a substituent L, ($L^d$) an aromatic hydrocarbon group of 6 to 14 carbon atoms, which may have a substituent L, ($L^e$) a heterocyclic group of 3 to 14 carbon atoms, which may have a substituent L, ($L^f$) an alkoxy group of 1 to 9 carbon atoms, which may have a substituent L, ($L^g$) an acyl group of 1 to 9 carbon atoms, which may have a substituent L, ($L^h$) an alkoxycarbonyl group of 1 to 9 carbon atoms, which may have a substituent L, with the proviso that the substituent L is at least one kind selected from the group consisting of an aliphatic hydrocarbon group of 1 to 12 carbon atoms, a halogen-substituted alkyl group of 1 to 12 carbon atoms, an alicyclic hydrocarbon group of 3 to 14 carbon atoms, an aromatic hydrocarbon group of 6 to 14 carbon atoms, a heterocyclic group of 3 to 14 carbon atoms, a halogen atom, a sulfo group, a hydroxyl group, a cyano group, a nitro group, a carboxyl group, a phosphoric acid group and an amino group.

12. The optical filter as claimed in claim 1, wherein said transparent resin is at least one resin selected from the group consisting of a cyclic (poly)olefin resin, an aromatic polyether resin, a polyimide resin, a fluorene polycarbonate resin, a fluorene polyester resin, a polycarbonate resin, a polyamide resin, a polyarylate resin, a polysulfone resin, a polyether sulfone resin, a polyparaphenylene resin, a polyamideimide resin, a polyethylene naphthalate resin, a fluorinated aromatic polymer resin, a (modified) acrylic resin, an epoxy resin, an allyl ester curable resin, a silsesquioxane ultraviolet curable resin, an acrylic ultraviolet curable resin and a vinyl ultraviolet curable resin.

13. The optical filter as claimed in claim 1, wherein the base material (i) comprises a transparent resin substrate (ii) comprising the compound (Z).

14. The optical filter as claimed in claim 1, which is for a solid-state image pickup device.

15. A solid-state image pickup device comprising the optical filter as claimed in claim 1.

16. A camera module comprising the optical filter as claimed in claim 1.

* * * * *